United States Patent [19]

Saxton et al.

[11] Patent Number: 4,882,692

[45] Date of Patent: Nov. 21, 1989

[54] METHODS AND SYSTEMS FOR GENERATING PARAMETRIC DESIGNS

[75] Inventors: Jay R. Saxton; Andrew J. Sodt; Dan J. Suslo, all of Bellingham, Wash.

[73] Assignee: TransformerCAD, Inc., Bellingham, Wash.

[21] Appl. No.: 925,278

[22] Filed: Oct. 30, 1986

[51] Int. Cl.$^4$ ............................................. G06F 3/14
[52] U.S. Cl. ................................ 364/518; 340/725; 340/726; 340/729; 364/521
[58] Field of Search ............... 364/512, 518, 521, 522; 340/723; 382/44–47

[56] References Cited

U.S. PATENT DOCUMENTS

| | | | |
|---|---|---|---|
| 4,475,104 | 10/1984 | Shen | 340/723 X |
| 4,549,275 | 10/1985 | Sukonick | 364/521 |
| 4,551,810 | 11/1985 | Levine | 364/512 |
| 4,686,580 | 8/1987 | Kato et al. | 382/47 X |

*Primary Examiner*—Gary V. Harkcom
*Assistant Examiner*—H. R. Herndon
*Attorney, Agent, or Firm*—Hughes & Multer

[57] ABSTRACT

A method for generating a parametric design on a computer without the use of a programming language. A drawing processor is used to create a master drawing from which other drawings of different dimensions can then be synthesized by modification of the master drawing. Instead of each dimension in the master drawing being given a fixed value, it is given a label. These labels are replaced at run time by dimensions the user provides or dimensions which are calculated as described in a design plan. When the program is run, the system uses simple language to prompt the user for each design value. It incorporates the response with data previously entered into the design plan. If a response is unclear, a request is made for clarification. As a draftsman would do, the invention merges the design values with data from both the design plan and the master drawing to create a finished drawing. in executing a parametric design, the user selects the controlling design plan to be used as a basis of the design. Acting on information contained therein, other design plans may be loaded and executed automatically. As a result, images of associated master drawings are modified and/or combined to represent the design. The final design is represented by electronically stored data which can be utilized to create a visual display such as a drawing and/or directly to manufacture a part, structure, etc. As an option, the user's direct role in the process can be supplanted by a computer program.

75 Claims, 55 Drawing Sheets

| ENTITY | NUMBER OF POINTS | | LOCATION OF REFERENCE POINT(S) WITHIN THE ENTITY |
|---|---|---|---|
| LINEAR HORIZONTAL OR VERTICAL DIMENSION | 4 | | EXTENSION LINE ORIGINS (2) AND ENDPOINTS OF EXTENSION LINE (1) AND DEPTH-OF-FIELD LINE (1) |
| LINEAR ROTATED OR ALIGNED DIMENSION | 2 | | ENDPOINTS OF THE TWO EXTENSION LINES |
| LINE | 2 | | THE ENDPOINTS OF THE LINE |
| ARC | 2 | | THE ENDPOINTS OF THE ARC |
| TRACE | 4 | | THE ENDS OF ITS CENTERLINE |
| SOLID | 4 | | EACH OF ITS VERTICES |
| RIGHT-ALIGNED TEXT | 1 | RIGHT— | RIGHT END OF TEXT |
| LEFT-ALIGNED TEXT | 1 | —LEFT | LEFT END OF TEXT |
| CENTER-ALIGNED TEXT | 1 | CENTER | CENTER OF TEXT |
| ALIGNED TEXT | 2 | ALIGNED | BOTH ENDS OF TEXT |
| SHAPE | 1 | (BASE POINT) | INSERTION POINT |
| CIRCLE | 1 | | CENTER OF THE CIRCLE |
| POINT | 1 | | THE POINT ITSELF |
| POLYLINE | 2 PER SEGMNT | | ADJACENT NODES ALONG POLYLINE |

| ENTITY | NUMBER OF POINTS | | LOCATION OF REFERENCE POINT(S) WITHIN THE ENTITY |
|---|---|---|---|
| LINEAR HORIZONTAL OR VERTICAL DIMENSION | 4 | 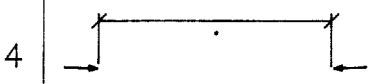 | EXTENSION LINE ORIGINS (2) AND ENDPOINTS OF EXTENSION LINE (1) AND DEPTH-OF-FIELD LINE (1) |
| LINEAR ROTATED OR ALIGNED DIMENSION | 2 | 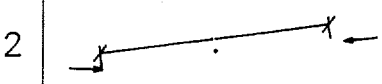 | ENDPOINTS OF THE TWO EXTENSION LINES |
| LINE | 2 |  | THE ENDPOINTS OF THE LINE |
| ARC | 2 |  | THE ENDPOINTS OF THE ARC |
| TRACE | 4 | 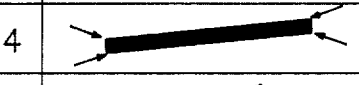 | THE ENDS OF ITS CENTERLINE |
| SOLID | 4 | 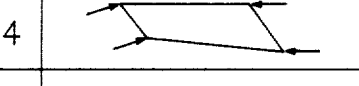 | EACH OF ITS VERTICES |
| RIGHT-ALIGNED TEXT | 1 | RIGHT | RIGHT END OF TEXT |
| LEFT-ALIGNED TEXT | 1 | 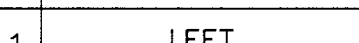LEFT | LEFT END OF TEXT |
| CENTER-ALIGNED TEXT | 1 | CENTER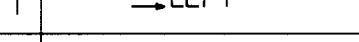 | CENTER OF TEXT |
| ALIGNED TEXT | 2 | 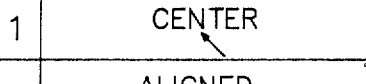ALIGNED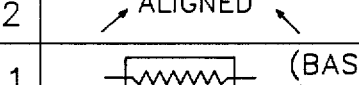 | BOTH ENDS OF TEXT |
| SHAPE | 1 | 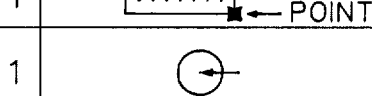 (BASE POINT) | INSERTION POINT |
| CIRCLE | 1 |  | CENTER OF THE CIRCLE |
| POINT | 1 | . ← | THE POINT ITSELF |
| POLYLINE | 2 PER SEGMNT | 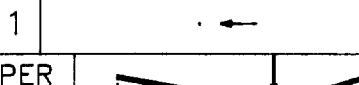 | ADJACENT NODES ALONG POLYLINE |

Fig. 1

| LABEL | VARIABLE | MEASUREMENT | TEXT |
|---|---|---|---|
| | | | WINDOW DESIGN SESSION |
| | | | ANSWER THE FOLLOWING QUESTIONS TO |
| | | | DESIGN A WINDOW |
| $1 | WIDTH | 4.0000 | 4'-0" |
| $2 | HEIGHT | 5.0000 | 5'-0" |
| | | | YOU HAVE THE OPTION TO PROVIDE |
| | | | THE WINDOW WITH ELABORATE UPPER |
| | | | AND LOWER CASEMENTS |
| $3 | UPPER | 1.0000 | 1'-0" |
| $4 | LOWER | 1.0000 | 1'-0" |

| DESIGN MASTER | | X-INSERT | Y-INSERT | SCALE | ROTATE |
|---|---|---|---|---|---|
| WINDOW.DEZ WINDOW | | 0.0000 | 0.0000 | 1.0000 | 0.0000 |
| ^ AUTO-ON | | | | | |

ROW 3===>GETNUM("WHAT WIDTH IS THE WINDOW?",4)

Fig. 9

```
LABEL   VARIABLE   MEASUREMENT   TEXT

ANSWER THE FOLLOWING QUESTIONS TO
DESIGN A DOOR
$1      WIDTH      3.000000        3'-0"
$2      HEIGHT     7.500000        7'-6"

SPEC    MASTER    INSERT X,Y   SCALE   ROTATE
DOORS   DOOR      0.00  0.00   1.00    0.00
>PROMPT [WHAT IS THE DOOR'S HEIGHT?]
```

Fig. 18

```
              WALL DESIGN
   ANSWER THE FOLLOWING QUESTIONS TO DESIGN
   THE  FRONT AND SIDE VIEWS OF A WALL:
$1         FRONT     10.000000        10'-0"
$2         SIDE.     10.000000        10'-0"
$3         BETWEEN   10.000000        10'-0"
$4         HEIGHT    10.000000        10'-0"

SPEC   MASTER    INSERT X,Y    SCALE   ROTATE
WALLS  WALL      0.00  0.00    1.00    0.00
>PROMPT [WHAT IS THE HEIGHT OF THE WALL?]
$2         SIDE.     10.000000        10'-0"
```

Fig. 19

```
              ROOF DESIGN
   ANSWER THE FOLLOWING QUESTIONS TO
   DESIGN A ROOF:
      $1      WIDTH       10.000000      10'-0"
      $4      BETWEEN      4.000000       4'-0"
      $3      LENGTH       2.000000       2'-0"
      $2      HEIGHT       6.000000       6'-0"

SPEC    MASTER   INSERT X,Y   SCALE    ROTATE
   ROOFS   ROOF     0.00  0.00   1.00     0.00
   $4              BETWEEN     4.000000        4'-0"
```

Fig. 20

```
           "DOORS" DESIGN PLAN

ANSWER THE FOLLOWING QUESTIONS TO
   DESIGN A DOOR:

WHAT IS THE DOOR'S WIDTH?
      WHAT IS THE DOORS HEIGHT?
```

Fig. 21

"WALL" DESIGN PLAN

THE FRONT AND SIDE VIEW OF A WALL:

WHAT IS THE LENGTH OF THE FRONT OF THE WALL?
WHAT IS THE LENGTH OF THE SIDE OF THE WALL?
WHAT IS THE DISTANCE BETWEEN WALLS?
WHAT IS THE HEIGHT OF THE WALL?

Fig. 22

"ROOF" DESIGN PLAN

ANSWER THE FOLLOWING QUESTIONS TO DESIGN A ROOF:

WHAT IS THE WIDTH OF THE ROOF?
WHAT IS THE ROOF'S LENGTH?

Fig. 23

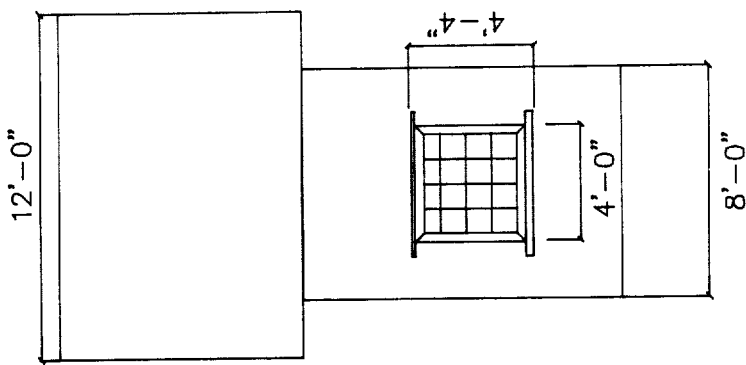
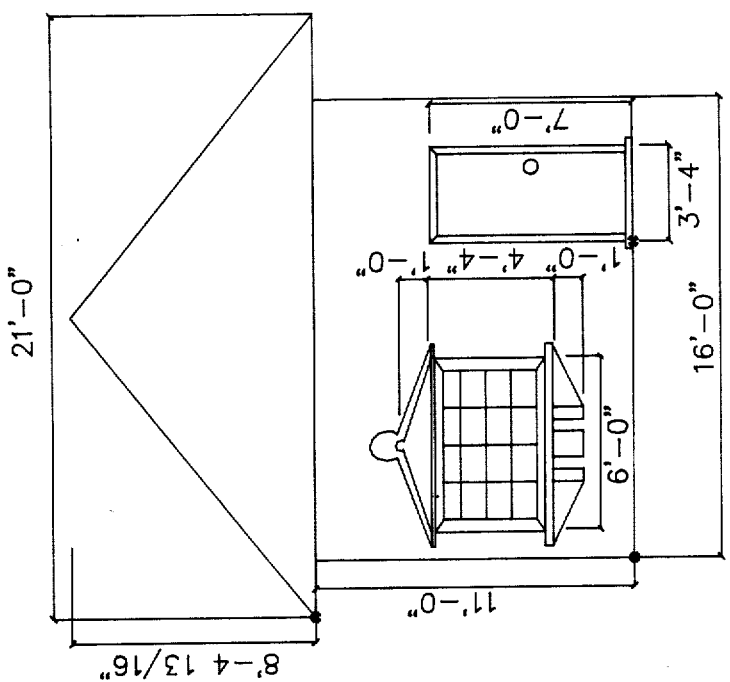
FIG. 24

WELCOME TO THE HOUSE DESIGN MODULE

ANSWER THE FOLLOWING QUESTIONS TO DESIGN A HOUSE.

HOW WIDE SHOULD THE HOUSE BE?
HOW LONG SHOULD THE HOUSE BE?
WHAT IS THE WIDTH OF THE DOOR?
WHAT IS THE HEIGHT OF THE DOOR?
NEXT, DESIGN THE WINDOWS FOR THE FRONT OF THE HOUSE.

WINDOW DESIGN SESSION.

ANSWER THE FOLLOWING QUESTIONS TO DESIGN A WINDOW.

WHAT IS THE WIDTH OF THE WINDOW?
WHAT IS THE HEIGHT OF THE WINDOW?
YOU HAVE THE OPTION TO PROVIDE THE
WINDOW WITH ELABORATE UPPER AND LOWER CASEMENTS.
NEXT, DESIGN THE WINDOWS FOR THE FRONT OF THE HOUSE.
SHOULD THE WINDOW HAVE ELABORATE UPPER CASEMENT?
SHOULD THE WINDOW HAVE ELABORATE LOWER CASEMENT?
HOW MUCH SPACE WOULD YOU LIKE ON THE ENDS OF THE ROW?
HOW MANY OBJECTS WOULD YOU LIKE IN THE ROW?
NEXT, DESIGN THE WINDOWS FOR THE SIDES OF THE HOUSE.

WINDOW DESIGN SESSION.

ANSWER THE FOLLOWING QUESTIONS TO DESIGN A WINDOW.

WHAT IS THE WIDTH OF THE WINDOW?
WHAT IS THE HEIGHT OF THE WINDOW?
YOU HAVE THE OPTION TO PROVIDE THE
WINDOW WITH ELABORATE UPPER AND LOWER CASEMENTS.
SHOULD THE WINDOW HAVE ELABORATE UPPER CASEMENT?
SHOULD THE WINDOW HAVE ELABORATE LOWER CASEMENT?
HOW MUCH SPACE WOULD YOU LIKE ON THE ENDS OF THE ROW?
HOW MANY OBJECTS WOULD YOU LIKE IN THE ROW?

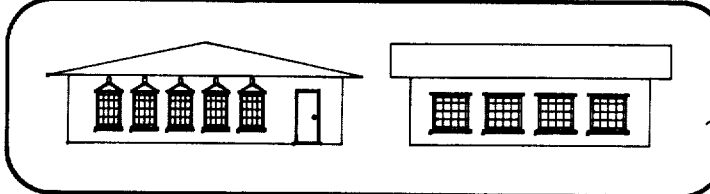

Fig. 25

```
WELCOME TO THE HOUSE DESIGN SESSION.
ANSWER THE FOLLOWING QUESTIONS TO DESIGN A HOUSE.
LABEL     VARIABLE-NAME      VALUE       TEXT
          EAVE_LENGTH         2.00
          ROOF_HEIGHT         5.00
          HOUSE_WIDTH        20.00
          HOUSE_HEIGHT       15.00
          HOUSE_LENGTH       20.00

WALL_HEIGHT        10.00
          ROOF_LENGTH        24.00       24'0"
          ROOF_WIDTH         24.00       24'0"

SPACE               4.00
          EX_ROOF_SPACE       1.00       1'0"
          EX_ROOF_HEIGHT      1.00       1'0"
          EX_ROOF_LENGTH      1.00

EX_ROOF_YINS        1.00
SPEC-FILE   MASTER    X-INSERT    Y-INSERT    SCALE
HOME.DEZ    NEW        0.00        0.00        1.0
^     AUTO-ON
ROW 3  ==>PROMPTSTR("HOW LONG ARE THE ROOF EAVES?")
```

Fig. 28

| LABEL | VARIABLE-NAME | VALUE | | TEXT |
|---|---|---|---|---|
| | OBJNAME | 1.00 | | WINDOW.DEZ |
| | CALCOBJ | | | WINDOW.DEZ |
| | TOTLENGTH | 20.00 | | |
| | ENDSPACE | 0.00 | | |
| | OBJWIDTH | 4.00 | | |
| | MAXOBJ | 5.00 | | |
| | NUM_OBJ | 2.00 | | |
| | SPACE_BETWEEN | 12.00 | | |
| | START_XINS | 30.00 | | |
| | START_YINS | 2.00 | | |
| | XINS_1 | 2.00 | | |
| | XINS_2 | 18.00 | | |
| | XINS_3 | 34.00 | | |
| | XINS_4 | 50.00 | | |
| | XINS_5 | 66.00 | | |
| | EX_XINS_1 | 1.00 | | |
| | EX_YINS_2 | 1.00 | | |
| | MAKE_1 | | | WINDOW.DEZ |
| SPEC-FILE | MASTER | X-INSERT | Y-INSERT | SCALE |
| ROW.DEZ | NEW.DWG | 0.00 | 0.00 | 0.00 |
| V    AUTO-ON | | | | |
| ROW 2==>GETNUM("WHAT IS THE LENGTH OF THE ROW?") | | | | |

Fig. 29

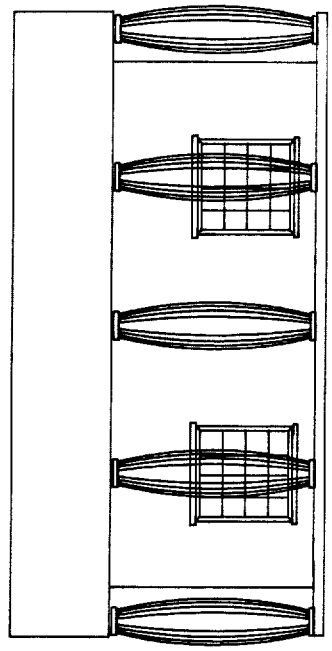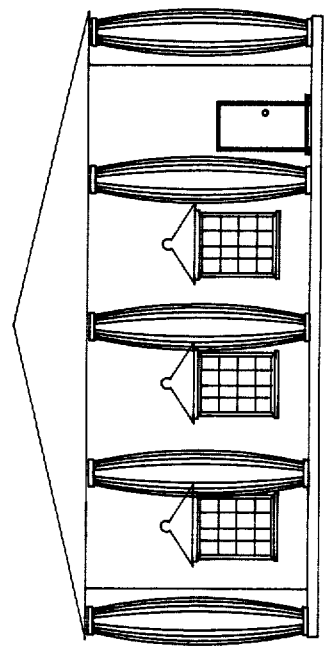
Fig. 49

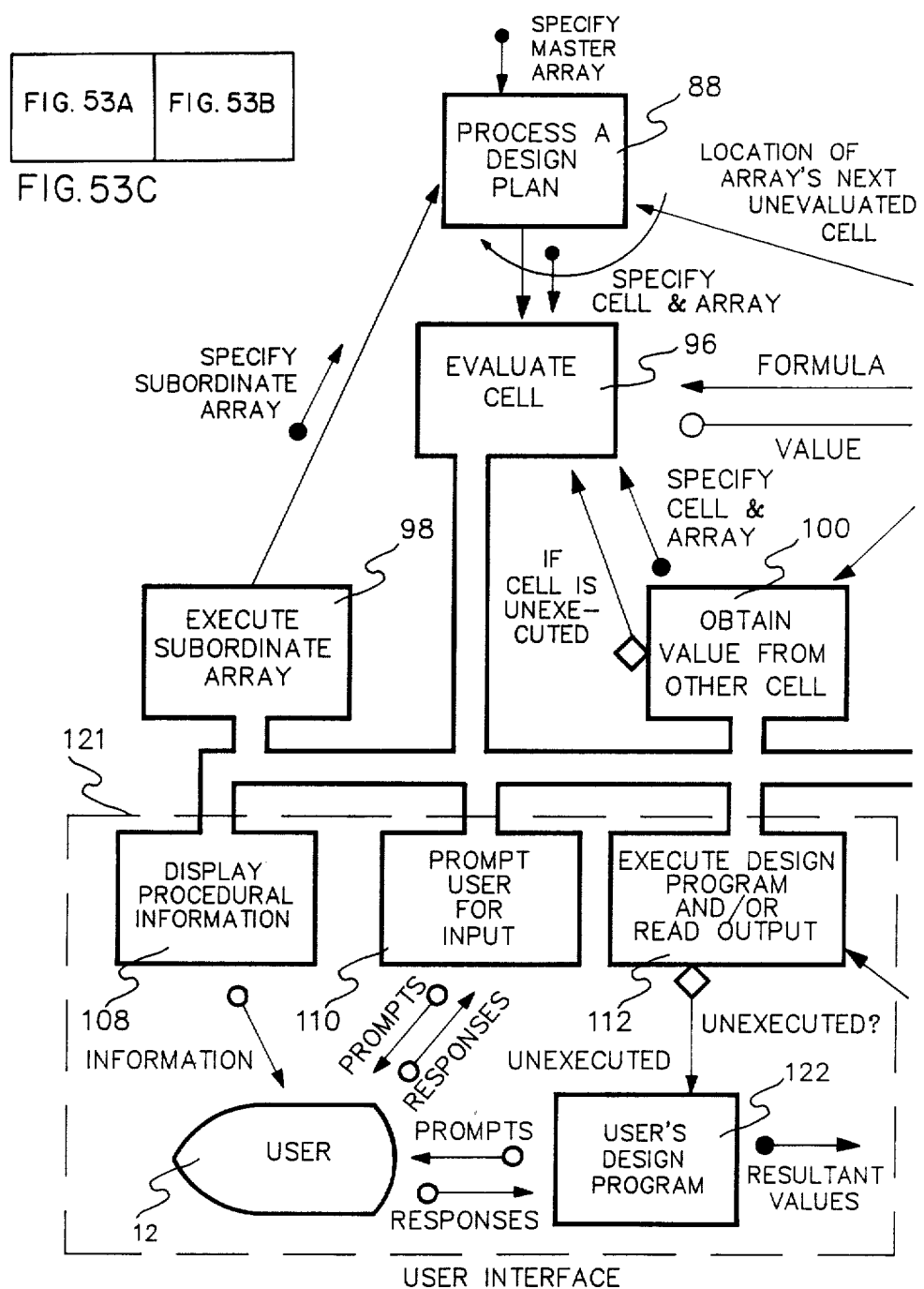
Fig. 53A   TO/FROM Fig. 53B

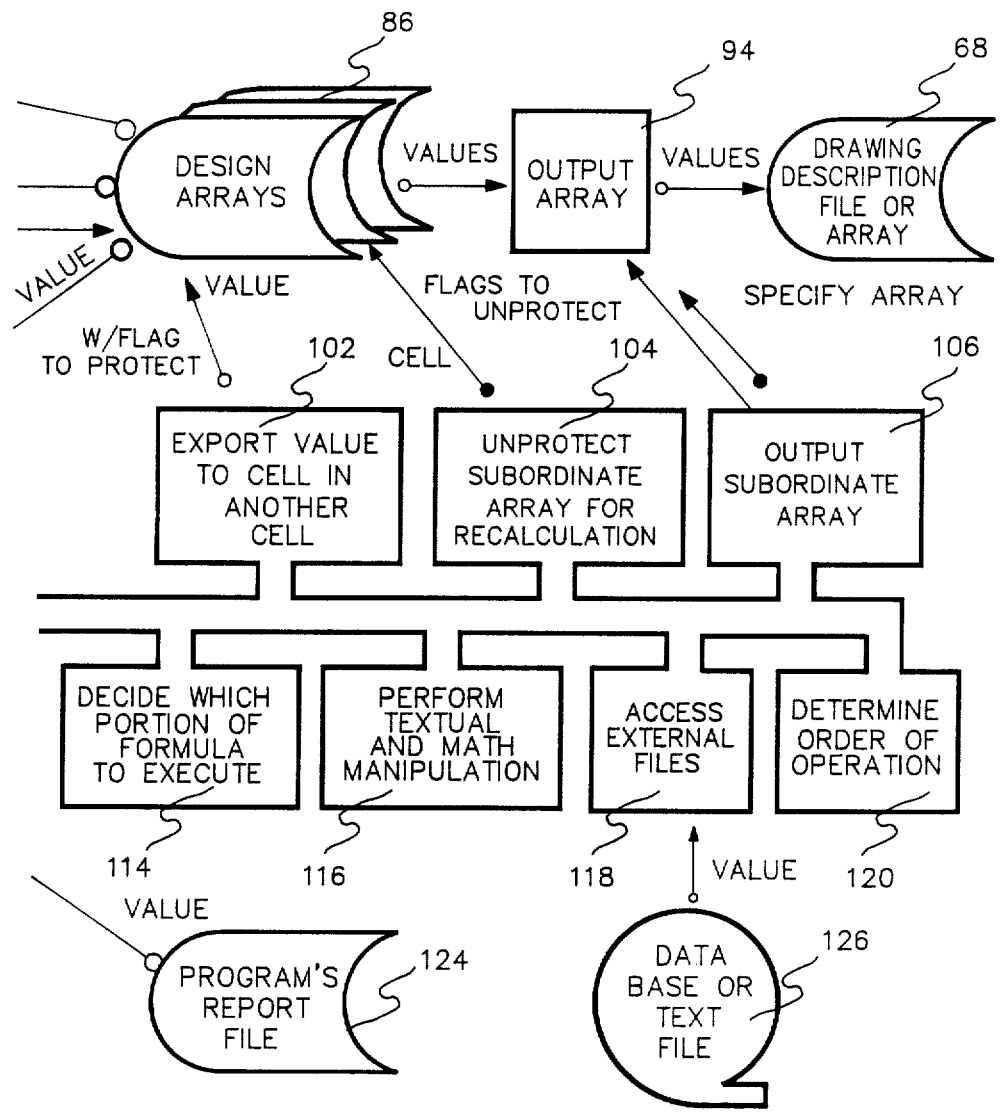
Fig. 53B TO/FROM Fig. 53A

METHODS AND SYSTEMS FOR GENERATING PARAMETRIC DESIGNS

TECHNICAL FIELD OF THE INVENTION

The present invention relates to the computer-aided design of manufactured parts by a process which we refer to as modular parametric design.

"Modular parametric design" refers to a system or process which enables a computer to create, to interpret and to relate modules which are capable of both designing and directing the production of a manufactured part by creating an electronically stored image of the part which may be to scale and dimensioned.

BACKGROUND OF THE INVENTION

Computer-aided design (CAD) is a fairly recent advancement in the drafting and design process. While CAD shortened the production time for drafting, it still necessitated complex and laborious procedures to perform parametric design. The techniques were awkward to learn, difficult to use and lacking in power. The only comprehensive approach made use of programming language to write a special purpose program which could both design and draw. Establishing such a design was time consuming and awkward. Other approaches lacked power and could not truly perform parametric design. As a result, an informed operator was required to guide their process during a design's execution. Executing such a design was awkward and prone to error.

Furthermore, CAD did not have the capability of combining data representing different parts or modules of an overall design. This is a significant drawback as all assemblies, and even many parts, can most expeditiously be designed by treating them as integrated aggregations of modular features, parts, and/or sub-assemblies.

Representative of the heretofore proposed CAD systems is the one disclosed in U.S. Pat. No. 4,549,275 issued Oct. 22, 1985, to Sukonic for GRAPHICS DATA HANDLING SYSTEMS FOR CAD WORKSTATION A competing system which utilizes computer aid in design creation is disclosed in U.S. Pat. No. 4,451,895 issued June 9, 1983, to sleikowski for INTER-ACTIVE COMPUTER AIDED DESIGN. This system is of even less interest than CAD systems such as those disclosed in the above-identified Sukonic patent, in part because it is not capable of generating parametric designs.

Another computer-aided design technique that has heretofore been employed involves the parametric enhancement of drawing editing, a technique which makes use of drawing processors. Certain drawing processwors such as the AUTOCAD ® and the Hewlett-Packard, Euchlid, and Medusa processors, have extremely powerful editing capabilities which include elements of parametric design. However, these all share the limitation that the user is dealing with one detail, or at most, one drawing, at a time.

There are two approaches to the above mentioned-parametric enhancement of drawing editing.

The first is the built-in language approach. To create a unique image, the user must write program code which describes the geometry of the drawing in terms of its coordinates such as the two end points of a line. The built-in language approach has the additional disadvantages that the user can create only one drawing as a result of running a design.

This is undesirable because most designs are depicted in a series of related drawings. For example describing a particular part might entail depicting it in several views: It might be depicted individually (in order to provide details describing the part itself); then again in an assembly drawing (in order to show its physical relationship to surrounding parts); and finally, in a concept drawing (in order to show its function).

The second approach makes use of drawing rectification. Rectification is an editing capability. To rectify a drawing is to make it correct according to its dimensions; i.e. the drawing is modified and brought into conformity with its dimensions. Using this enhancement to drawing editing as a basis for parametric design, the user employs equations in the dimensions of the drawing in place of fixed values. The equations, which may involve trigonometric formulas, relate the geometry of different parts of the drawing to one another.

The user can automatically edit the drawing by entering the drawing processor and providing values corresponding to the independent variables in these equations. The user can even use a computer program from outside the drawing processor to calculate these values.

The drawing rectification approach contains the following problems:

1. The design process is not controlled by the computer. This means the user must be educated as to his or her role in producing a particular design. Since the user has to control the process, the chance of a procedural error being introduced is greatly increased.

2. The user, rather than the program, must design which drawing to rectify in order to depict the design. Choosing the appropriate parameterized picture, the single most important decision in the process, is left up to the user. An informed user is required as he or she must be aware of the current inventory of parameterized drawings. The process of choosing the appropriate design is awkward and relatively slow.

3. This approach limits the depiction of the design to a single drawing. Most designs cannot be depicted with a single drawing.

4. Since the user is editing an image on the drawing processor, there is a great probability that he will inadvertently change an aspect of the original drawing, introducing an error into the image being edited.

SUMMARY OF THE INVENTION

We have now invented, and disclosed herein, a novel process for generating parametric designs which does not have those limitations of computer-aided design techniques discussed above.

In our novel design process, one or more design modules are created and stored. Each module is composed of two types of information: a design plan and one or more master drawings. Once the modules have been set up and the design process invoked, the modules control the design process, synthesizing the final design by modification (or rectification) of a computer selected master drawing or by merging all or selected portions of two or more master drawings. The operator's role is limited to responding to prompts, which are decided upon by the modules. The operator does not have to deal with an on-screen image in creating a part, only with prompts requesting dimensions. These prompts are written in simple English.

The design plan is edited in much the same manner as a spreadsheet. However, it is important to differentiate between the two because no spreadsheet program is adequate for establishing a design algorithm in our process (those which come close enough to be mentioned as prior art are SYMPHONY® and FRAMEWORK®), Some of the drawbacks of spreadsheets which make them unsuitable for our purposes are:

1. A spreadsheet such as SYMPHONY® lacks decision-making capabilities fundamental to designing. For example, SYMPHONY® does not provide a function that chooses which of several designs to execute, depending upon the outcome of a single test. To work around the limitation would be impractical in many cases.

2. Even where it is capable of calculating design values, the spreadsheet proves prohibitively awkward for doing so. Extensive use of macros would be required. For example something as fundamental to the design process as prompting the user for information requires a difficult-to-program macro.

3. The parametric design process requires that certain relationships be pre-established between its elements. Whereas spreadsheet "templates" allow for this, there are severe limitations: viz., (a) relationships are not dynamically reconfigurable (the user cannot reconfigure units conversion from feet-inches-sixteenths to decimal units while engaged in editing); (b) relationships are awkward to use, sometimes requiring a group of cells as in the case with unit conversion; (c) default relationships cannot be easily overridden. This is a severe drawback for parametric design where certain numeric values must be automatically converted into their textual equivalent and where the user may wish to switch back and forth between different units of measurement (for example feet-inches-sixteenths, decimal feet, etc). As a result, in many cases the user would be better off to provide individual formulas, establishing relationships one-at-a-time as required rather than configuring default relationships.

4. The spreadsheet format would be extremely confusing to use in establishing a parametric design. A large number of cells would be required for bookkeeping: i.e., for either holding macro code or for holding temporary variables. Thus, most of the large number of cells that would necessarily have to be employed would be superfluous to the actual design process.

5. When a parametric design program is run, even an experienced operator requires full screens of procedural information to instruct him as well as prompts of adequate length. With a spreadsheet, he sees a matrix of cell values (irrelevant during execution) and a single-line prompt placed somewhere on the screen. For an operator who is endeavoring to run an off-the-shelf parametric design on a factory floor, for example, the spreadsheet is therefore inappropriate, as well as prohibitively confusing.

6. Because the operator is still inside the editor during the execution of a spreadsheet, he can change formulas, either accidentally or to "improve" the design. Such inadvertent design alterations and tampering are unacceptable for industries that require parametric designs because the probable cost of one bad design is measured in thousands of dollars.

7. The spreadsheet lacks the capability of establishing design modules which can either stand alone or interact with one another as is the case in the novel parametric design systems disclosed herein (In the latter case all are resident in memory at the same time, passing information and control between themselves). This means that any design encoded in a spreadsheet has all of the herein discussed disadvantages inherent in a non-modular design.

In contrast, the parametric design modules employed in our novel process disclosed herein are characterized by the following capabilities:

1. A module can perform engineering calculations and gather information according its encoded algorithm;

2. A module can create an electronically stored image (or set of images) which depict what it designs, or add information to a composite image which is contributed to by many modules; a non-modular parametric design has thesis capabilities;

3. The parametric design, rather than the user, controls the design process. The user is relegated to the role which is determined by the design. His involvement, if any, once the design is initiated is limited to responses to prompts for design information. This role is clearly defined for him by screens of information. The user does not have to deal with an image in the process;

4. A module can operate alone or in conjunction with other modules. It can be a stand-alone designer; it can be supervised by other modules; or it can itself supervise other modules, subordinate to itself.

A module is blind as to whether it is being supervised. With absolutely no modification to the module, it can be made to serve other modules. When standing alone, a module might prompt the user for design information or calculate information. When subordinate to another module, it might accept exactly the same information directly from the supervising module. It can also be required to pass back any of the values it calculates to its supervisor module. Whether a module produces an image of what it designs or is simply used to perform analysis is decided by its supervisor module.

The novel approach to computer-aided design disclosed herein can also be used to generate non-modular parametric designs. The term "non-modular parametric design" refers to a technique which has these capabilities:

1. it can perform engineering calculations and gather information according to its encoded algorithm;

2. It can create an electronically stored image or set of images which depict what it designs, or it can automatically add information to a composite image which is contributed to by other designs;

3. The parametric design, rather than the user, controls the design process. The user is relegated to the role which is determined by the design. His involvement, if any, once the design is initiated is limited to responses to prompts for design information. This role is clearly defined for him by screens of information. The user does not have to deal with an image in the process.

Our novel technique can also be employed to generate non-modular parametric designs. Although the present invention does not provide the only technique for establishing a non-modular parametric design, its process for doing so is unique. No other process is based on the use of a master drawing and a design plan as disclosed herein.

This is important because our approach provides a way of establishing and executing a non-modular parametric design which is superior to all other approaches. With our system a stand-alone module can be set up in about the time otherwise required to instruct a draftsman. Thereafter, drawings that might otherwise require a draftsman hours, or days can be completed in minutes. Furthermore, our straightforward approach for both editing and executing a design is less likely to result in the introduction of an error. This makes our approach vastly superior both in terms of speed and in terms of establishing and executing a design. In addition, it doesn't require the user to learn a programming language.

Independent modules provided by our system afford the additional advantage that they can later be integrated into a multicomponent design with absolutely no modification, and no allowance made at the time they were originally established for their eventual mode of use.

Currently, there is no process, other than that of the current invention, for creating a modular parametric design. The only non-modular alternative is to write a computer program in a language such as COGO ® or FORTRAN. If for no other reason than its non-modularity, this approach makes the creation of large-scale parametric designs much less economically feasible.

Specifically, a COGO ® or FORTRAN design program must be written in unitary as opposed to modular form because of the limitations inherent in writing a computer program. Explicit provisions must be made for passing information to other programs, for inputting information from other programs, and for deciding which steps of the program execute.

For example, a FORTRAN program that designs an entire building must be written to take into consideration the relationship each portion of the building has to the building as a whole. Code which designs a single portion of the structure would require extensive modification before it could stand alone as a design unit. As stand-alone code it would have to obtain all governing parameters from the user. However, as part of a program that designed the whole structure, the portion of code that designed exactly the same part would be required to interact with other code that designed the surrounding parts of the structure. This would be required so as to make the physical dimensions and other parameters match. Not only would it have to pass and receive information, but it would have to do so in a manner that coordinated the foregoing analysis.

This greatly decreases the short-time benefit as code is written. A long-term, complex programming effort would have to be planned. Since, in general, the relationship between a program's complexity and the time required to produce that program is more geometric than it is linear, this has severe economic implications.

The novel design modules disclosed herein have the formatted appearance of a customized design program when it is executed (in contrast to the module's spread-sheet-like appearance when edited), printing full screens of information and prompts to the user; and these modules have the power to perform modular parametric designs.

In addition to the earlier-mentioned benefits, the modular parametric design approach disclosed and claimed herein provides a unique method for establishing a design algorithm. The method is considerably easier to learn and much faster to use than any of the above-mentioned prior art approaches to parametric design. A non-programmer using it can create a design in a fraction of the time otherwise required by an experienced team of programmers.

To summarize, our novel approach to the creation of parametric designs makes use of information of two types: (1) that contained in master drawings as a vehicle for producing images representing the design; and (2) that contained in a design plan as a vehicle for: (a) establishing the design; (b) modifying and/or combining master drawing images to represent the design and; (c) controlling and exchanging information with other design modules.

OBJECTS OF THE INVENTION

From the foregoing, it will be apparent to the reader that one important and primary object of the present invention resides in the provision of novel, improved processes of utilizing computers as an aid in the generation of parametric designs, particularly in circumstances where repetitive drawing tasks are involved.

Other related and also important but more specific objects of our invention reside in the provision of processes as identified in the preceding object:

which allow parametric designs to be generated much more rapidly and economically and with fewer resources than they can be by employing currently available CAD techniques;

which are user friendly in that they do not involve the use of a computer programming language or the modification of an on-screen (or displayed) image;

which are less subject to error than heretofore available computer related design technologies in that the design process is controlled and executed by the computer, minimizing the possibility of procedural errors being made by the user;

which, in conjunction with the preceding object, are also user friendly in that the user need not possess either programming or technical designing knowledge;

which has the capability, once a master design plan having a design algorithm encoded therein has been selected, of automatically loading and executing other design plans to thereby produce information relevant to the generation of the wanted design;

which are capable of generating accurate, customized drawings, which may be to scale and dimensioned, in a matter of minutes;

which are capable of integrating user supplied data and data from one or more electronically stored design modules in creating a parametric design;

which, in conjunction with the preceding object, have the capability of performing any mathematical calculations that may be necessary to convert the user supplied data to data which is compatible with that available from the electronically stored design modules;

in which the data generated for the parametric design is in a format in which it can be used either to produce a drawing or to directly produce a manufactured part;

which are less prone to the introduction of procedural errors than heretofore available computer related design techniques in that the design process is computer, rather than user, controlled;

which are superior in that the user is not required to select the drawing that is to be modified to produce the final design;

which can be used to create drawings that are either stylized (not to scale) or drawn to scale;

Still another important and primary object of the present invention is the provision of novel systems in which parametric designs can be generated by techniques as characterized in the preceding objects.

Other related and still important, but more specific objects of the invention reside in the provision of systems as aforesaid:

which are capable of creating, interpreting, and relating design modules;

which are capable of both designing and directing the production of a manufactured part or stored image;

which are capable of: automatically choosing the appropriate image and modifying it to represent the design, choosing a scale factor and applying it to the drawing so it fits on a page, and of combining several images into a single drawing.

And yet another important and primary object of the present invention is the provision of novel design plans and design control modules for such systems.

Related and important but again more specific objects of our invention reside in the provision of such design plans:

which can be edited for a design algorithm to be called up during the parametric design process;

which can be set up in a manner akin to that used to provide instructions to a draftsman;

which provides on-screen information and prompts at run time.

Other important objects, features, and advantages of our invention will be apparent to the reader from the foregoing and the appended claims and as the ensuing detailed description and discussion proceeds in conjunction with the accompanying drawings.

BRIEF DESCRIPTION OF THE DRAWINGS

In the drawing:

FIG. 1 is a chart representing drawing entities and their reference points;

FIG. 9 shows the appearance of a WINDOW design plan as presented by the design editor, the drawing being annotated to show the various regions of the design plan.

FIG. 18 depicts the on-screen appearance of a DOOR design plan;

FIG. 19 depicts the on-screen appearance of a WALL design plan;

FIG. 20 depicts the on-screen appearance of a ROOF design plan;

FIG. 21 shows the questions generated by the DOOR design plan when it is used as a stand-alone designer;

FIG. 22 shows the questions generated by the WALL design plan when it is used as a stand-alone designer;

FIG. 23 shows the questions generated by the ROOF design plan when it is used as a stand-alone designer;

FIG. 24 is a final drawing created by a user's HOUSE design program in conjunction with the design modules WINDOW, DOOR, WALL, and ROOF;

FIG. 25 depicts the two screens evident to the user when he is running the HOUSE design module in conjunction with its associated design modules, ROW, WINDOW, DOOR, WALL, and ROOF;

FIG. 28 depicts the on-screen appearance of the HOUSE design plan;

FIG. 29 depicts the on-screen appearance of a ROWS design plan which is generic in its capability to supervise other design modules, a capability which can be employed to advantage in generating rows of drawing elements such as windows, columns, kitchen cabinets, etc.;

FIG. 49 is a design of a temple and is included as an illustration of the endless designs that can be generated by using a single HOUSE design module to control the parametric design process;

DETAILED DESCRIPTION OF THE INVENTION

The hardware and software employed to practice the present invention may include any one of several types of commercially available main-frame computers, minicomputers or microcomputers with various operating systems.

Figure 61:
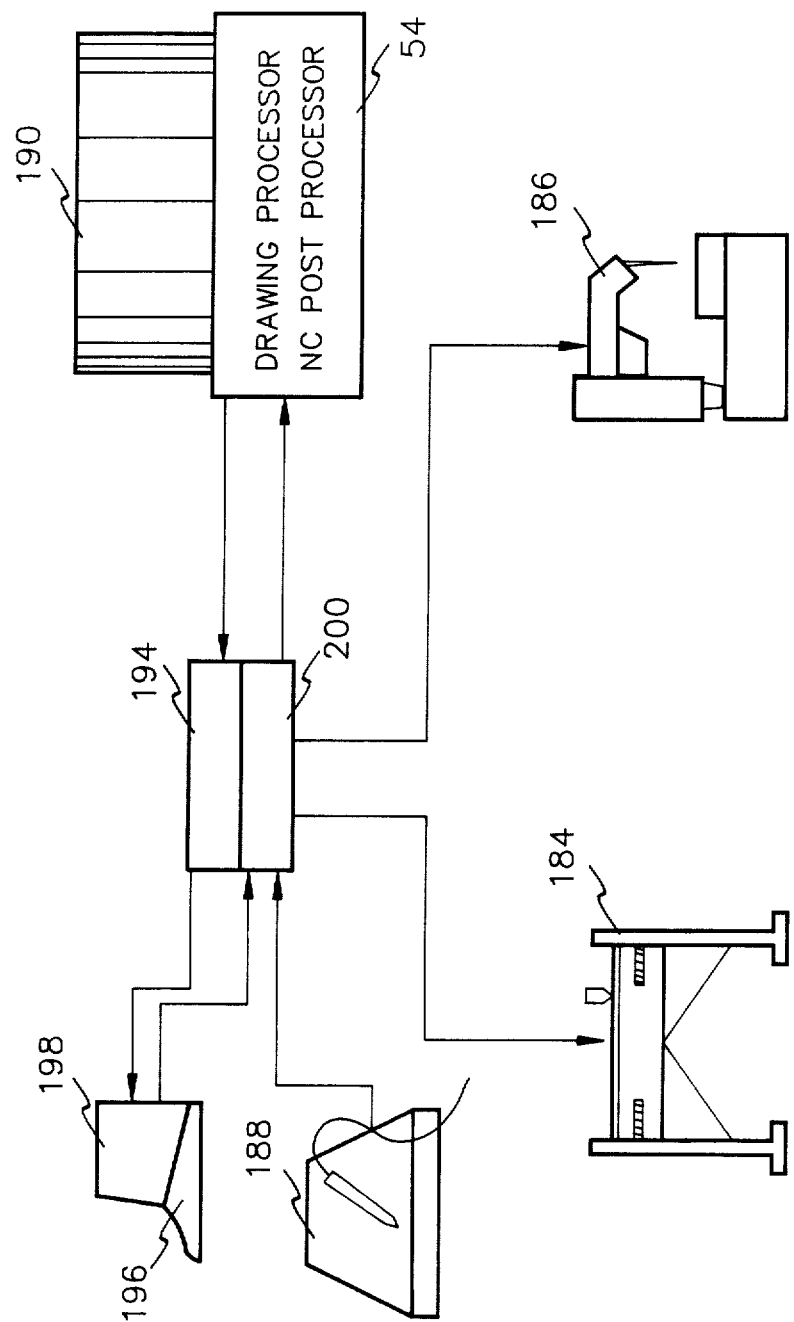
FIG. 61 is a block diagram of a system for carrying out our novel method of generating parametric designs.

In one implementation (see FIG. 61), we use a PC-AT 30 with the usual keyboard 32 and PC-DOS, an AUTOCAD ® drawing processor shown in a block 34 and stored as usual on a hard disc 36, a digitizing tablet 38, a graphics plotter 40, a video monitor 42, a conversion program for translating drawing images into numerical control code such as AUTOCAD's NC Programmer TM (see block 34) and also stored on hard disc 36, a numerical milling machine 44 capable of accepting NC code, and 640K of RAM with two megabytes of extended memory (the memory components are collectively identified by reference character 46). Other suitable types of input-output devices can instead be used.

The generation of parametric designs by the novel parametric design process described hereinbelow also involves the use of a proprietary computer program entitled SYNTHESIS TM.

Setting up a Parametric Design

Figure 50:
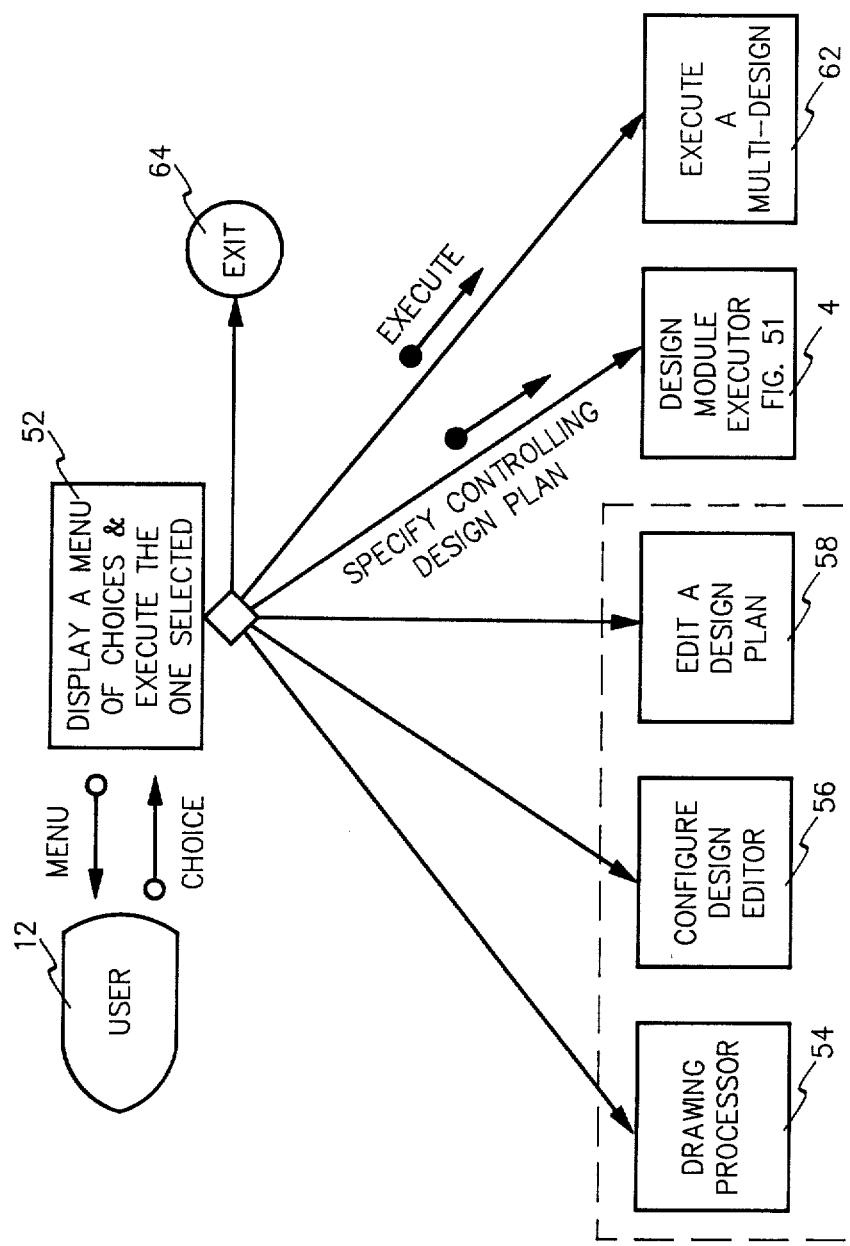
FIG. 50 is a block diagram showing the configuration of capabilities provided in setting up and executing a parametric design.

FIG. 50 comprises a pictorial overview of the menu selections of the invention, showing the options for both setting up and executing a parametric design. The menu display 52 provides the user 12 with a set of choices with which to set up a parametric design 54, 56, or 58;

execute a parametric design 60; or execute a multi-design 62.

In setting up a parametric design, the drawing processor 54 is used to create a master drawing from which other drawings can be created under the control of a design plan module. The master drawing is a template drawing in which those dimensions that vary according to the design are given a label instead of a fixed value. Text that varies according to the design is also given a label. The preferred method is to use the AUTOCAD ® program as a drawing processor, in conjunction with a plotter, codigitizing tablet, and NC Programmer TM to generate numerical code capable of driving a numerically controlled milling machine and a tablet menu overlay; however, other drawing processors and equipment configurations can be used instead.

The drawing processor 54 allows the user to view the drawing on a video monitor, to edit the drawing, to plot a drawing onto paper, and to store the drawing electronically. Configuring the design editor 56 allows the user to establish a default formula for automatic conversion between the text and measurement cells that describes each design variable (a default formula is one which automatically effects a specified conversions or other calculation unless it is overridden). This formula is automatically placed in a variable's empty text cell upon editing its corresponding measurement cell (and vice-versa), as will be explained later.

The parametric design plan is a description of the formulas and procedures to be used in carrying out a parametric design. It is edited with the parametric design editor 58. When edited, a design plan is displayed as an array of cells. The parametric design executor 60 (more fully explained below with reference to FIG. 51) executes the algorithm embodied in the design plan. In so doing it might present the user with a series of explanations and prompts. Based on his responses a design is completed.

Examples of Three Modes of Parametric Design

There are several modes of user interaction which can be employed when executing design plans. Now will be described three possible specific examples of the modular parametric design process, which will illustrate:

1. Rectification, which underlies our approach to parametric design;

2. Executing a single parametric design module: a WINDOW;

3. The use of a computer program in directing a group of modules to execute a HOUSE design; and 4. A hierarchy of modules interacting to execute a HOUSE design.

The examples chosen are not intended as illustrations in the limiting sense, but as examples of the capabilities of the invention.

Rectification is not unique to SYNTHESIS TM. However, SYNTHESIS TM provides additional rectification capabilities not possessed by other products. Only these capabilities are discussed in detail herein. They include:

1. SYNTHESIS TM distinguishes between two types of entities, "fixed" and "proportioned," and rectifies them differently; and 2. SYNTHESIS TM provides a unique means of eliminating unwanted parts of a drawing.

Other essential SYNTHESIS TM capabilities include rectifying according to non-linear dimensions such as radial or angular dimensions.

To understand what is meant by "fixed" and "proportioned" entities, it is essential to define the terms, "entity" and entity "control points". Drawing entities are the primitive elements from which a drawings are built: lines, arcs, etc. They are summarized in FIG. 1. Each type of entity has reference points. For example, the endpoints of a line are its two reference points, as is the center point of a circle. To relocate an entity, its reference points are first relocated; and reference points are also indicated in FIG. 1.

When rectifying a drawing, there are two ways in which entities can move: either proportionally or fixed with respect to the controlling dimension. Proportioned entities move such that the distance between their reference points expands or decreases in proportion to the change in the controlling dimensions. In contrast, with fixed entities the reference points remain a constant distance from the nearest extension line.

It is important to understand the working difference between these two types of entities. The "BEAM" example (FIGS. 2 and 3) illustrates the difference between proportioned and fixed entities and shows how SYNTHESIS TM supports both in a drawing. The example shows two beams, each with a row of holes in it. In the upper beam, the holes are proportioned entities; and in the lower they are fixed entitites. As the lengths of the beams change, the proportioned holes maintain their proportional relationship to each other as well as to the other extension lines, while the fixed holes maintain the same distance from adjacent dimension extension lines.

As the user draws, each time he places an entity in the drawing, he has the choice of making it fixed or proportioned. As a result, the actual parts of the drawing do not have to be exactly dimensioned, as can be seen with the beam. Yet, the user still controls the outcome upon rectification, through use of fixed and proportioned entities.

SYNTHESIS TM has a second unique rectification capability, which enables it to automatically eliminate unwanted parts of a drawing. By editing the dimension text to a value of zero, the user can eliminate the affected portion of the drawing. This can be seen in FIGS. 4 and 5. In the pre-rectified picture, FIG. 4, one of the dimension has been edited to "0.0". In the view subsequent to rectification, FIG. 5, the affected part has vanished.

The user controls elimination of drawing parts according to the entity elimination rules, which are also unique to SYNTHESIS TM. These are:

(1) Each reference point is controlled horizontally by the closest extension line of a horizontal dimension or the extension line of the selection set in which it belongs. It is similarly affected vertically by the extension line of the corresponding vertical dimension.

(2) A dimension's extension line can be thought of as extending past its apparent end. Its actual extent is user-definable. This can be seen in FIGS. 4 and 5. All parts of the triangle are affected by the second (from-the-left) extension line.

Figure 2:
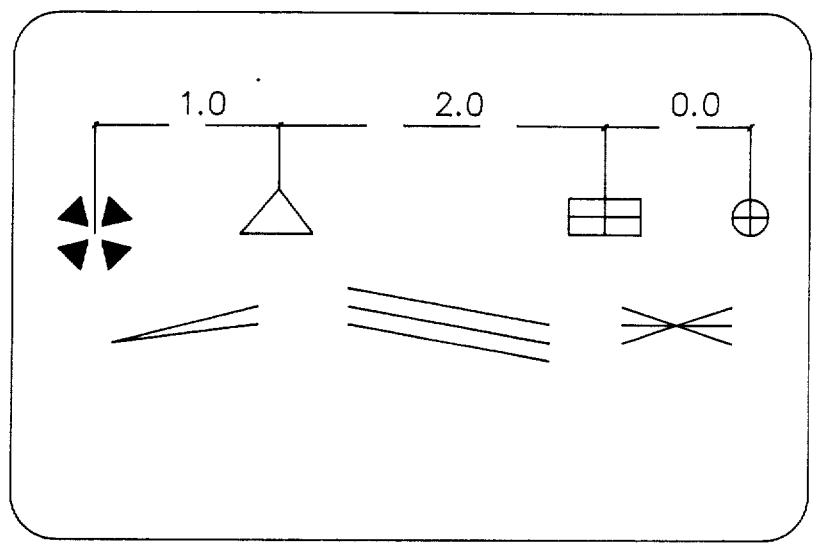
FIGS. 2 and 3 display entity rectification as controlled by fixed and proportioned entities.
Figure 3:
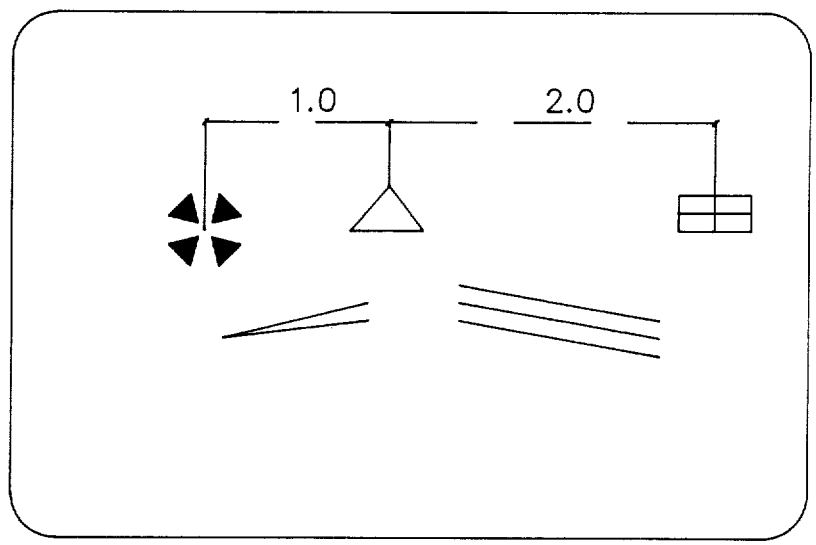

(3) A string of related horizontal dimensions has a user-definable "beginning point." Similarly, there is a user-definable beginning point for strings of vertical dimensions. In FIG. 2 the X-shaped symbol is used to mark the dimension string's beginning.

(4) Those entities with one reference point can be eliminated by assigning their controlling dimension (either horizontal or vertical) a value of zero when the entity is on the end of the dimension farthest from the "beginning point" (along the dimension string).

Figure 4:
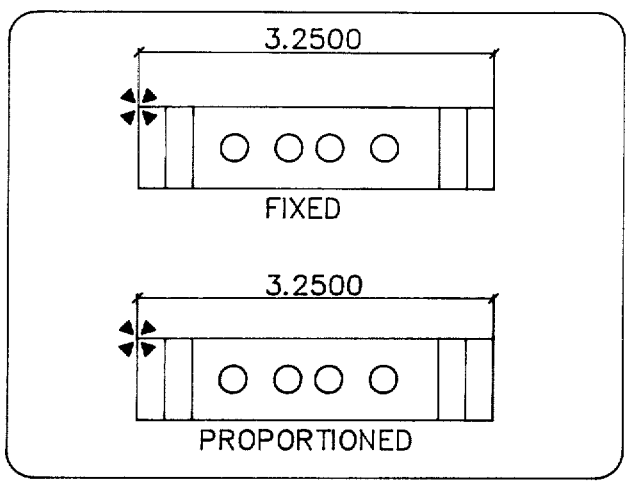
FIGS. 4 and 5 are views similar to FIGS. 2 and 3 but illustrating the importance of reference point location in rectifying drawings.
Figure 5:
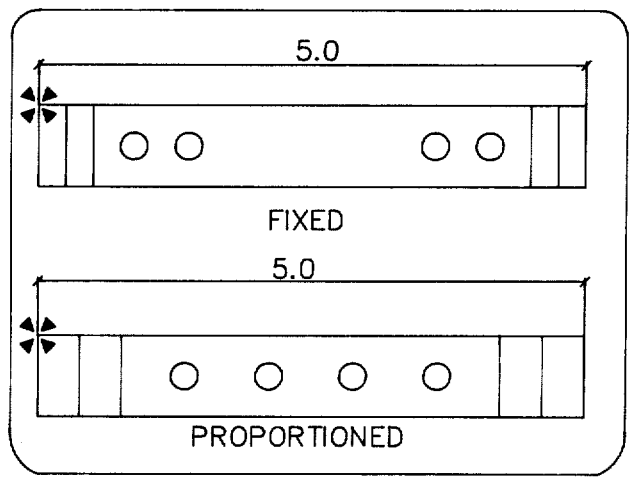

(5) Those entities with more than one control point are eliminated if their controlling dimension has a value of zero for either of the following reasons: all of an entity's reference points are on the end of the dimension farthest from the "beginning point" (as is the case with the entities forming the triangle in FIG. 4); or an entity's reference points are controlled by the extension lines on the opposite ends of the same dimension (as is the case with each of the three intersecting lines in FIG. 4).

Execution of a Single Parametric Design Module: A Window

Figure 6:
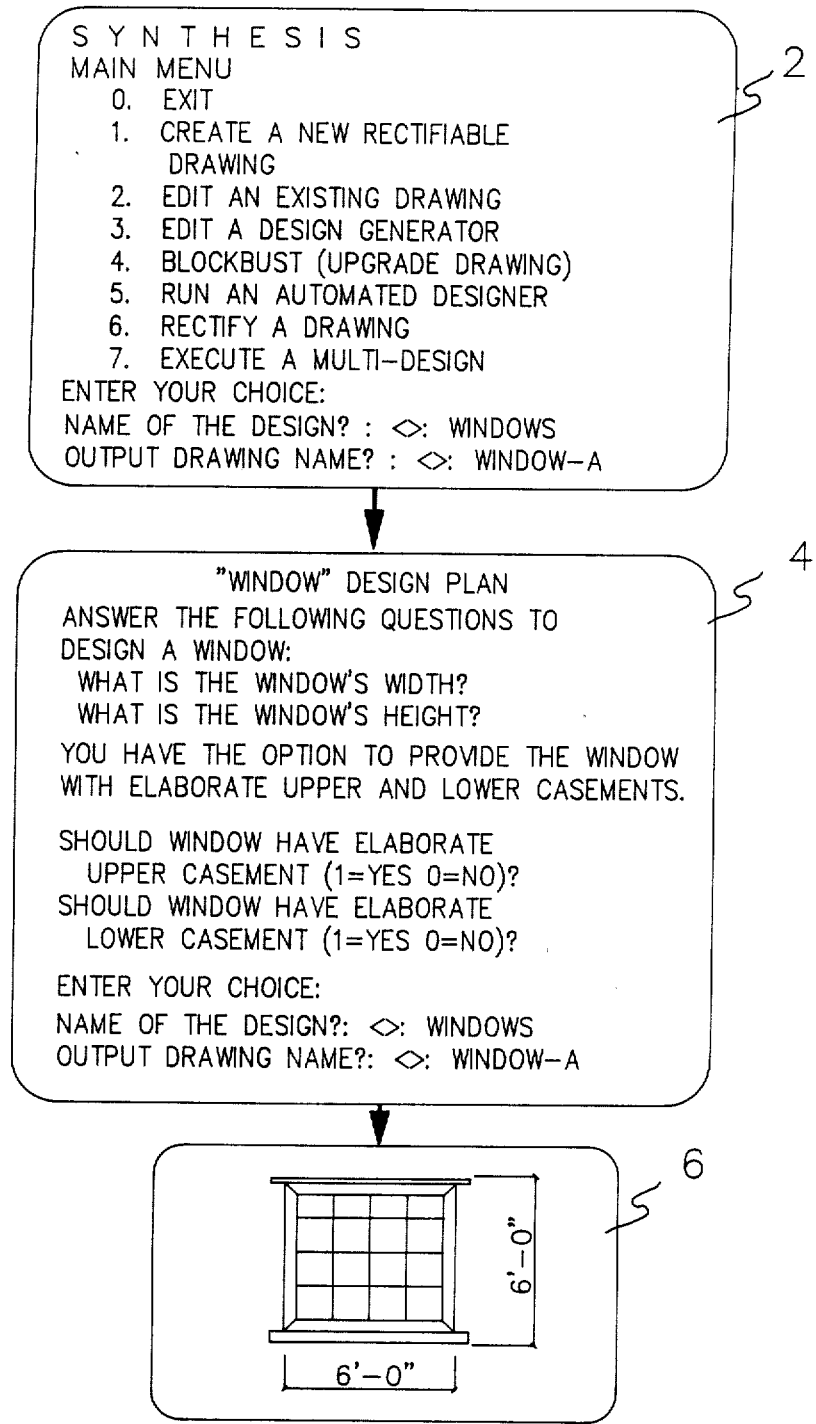
FIG. 6 depicts the process of creating a window drawing.

The user sees before him the main menu of the invention, FIG. 6, which gives him the following options: to enter the drawing processor, to edit a design plan or existing drawing, to execute a parametric design, to rectify an existing drawing, or to execute a multi-design. When the user elects to execute a design, he is then presented with a question asking for the name of the design he wishes to execute and the name of the finished drawing 2.

In this example, the user chooses to execute the WINDOW parametric design. He is presented with the WINDOW design screen 4 which informs him that he has chosen to design a WINDOW and displays prompts which ask for dimensions and specific information relating to the WINDOW design. When the user finishes responding to the questions, he next sees the finished drawing on the screen 6. The finished drawing is drawn to scale according to the design parameters prompted for.

Figure 11:
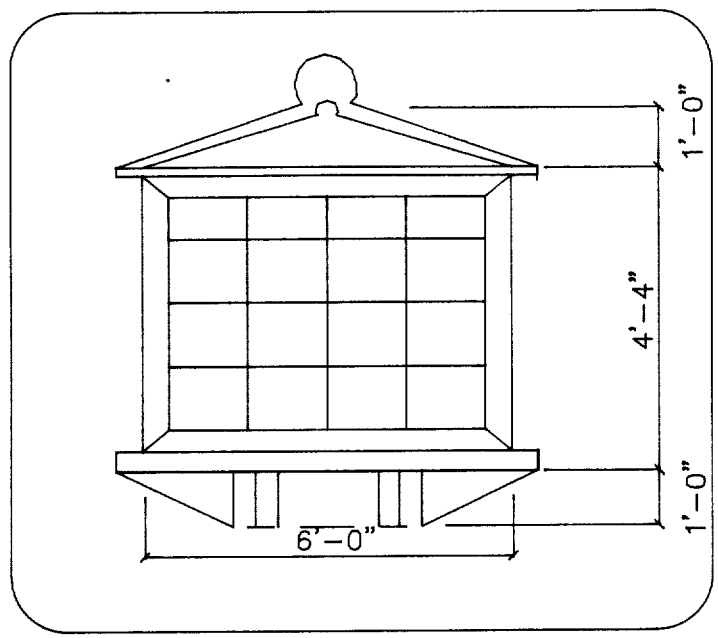
FIG. 11 is a detail of a final WINDOW drawing.
Figure 12:
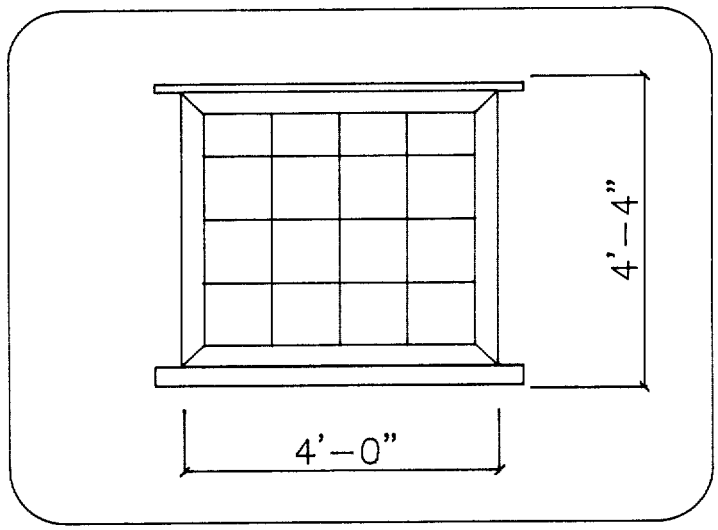
FIG. 12 is another detail of a final WINDOW drawing.

As has already been described, SYNTHESIS TM is unique in that it enables a single master drawing to produce many different images. This is illustrated in FIGS. 11 and 12. These figures depict windows which are very different but are all produced from the same WINDOW master drawing. They are proportioned differently, and, from some, unwanted parts are eliminated.

Figure 7:
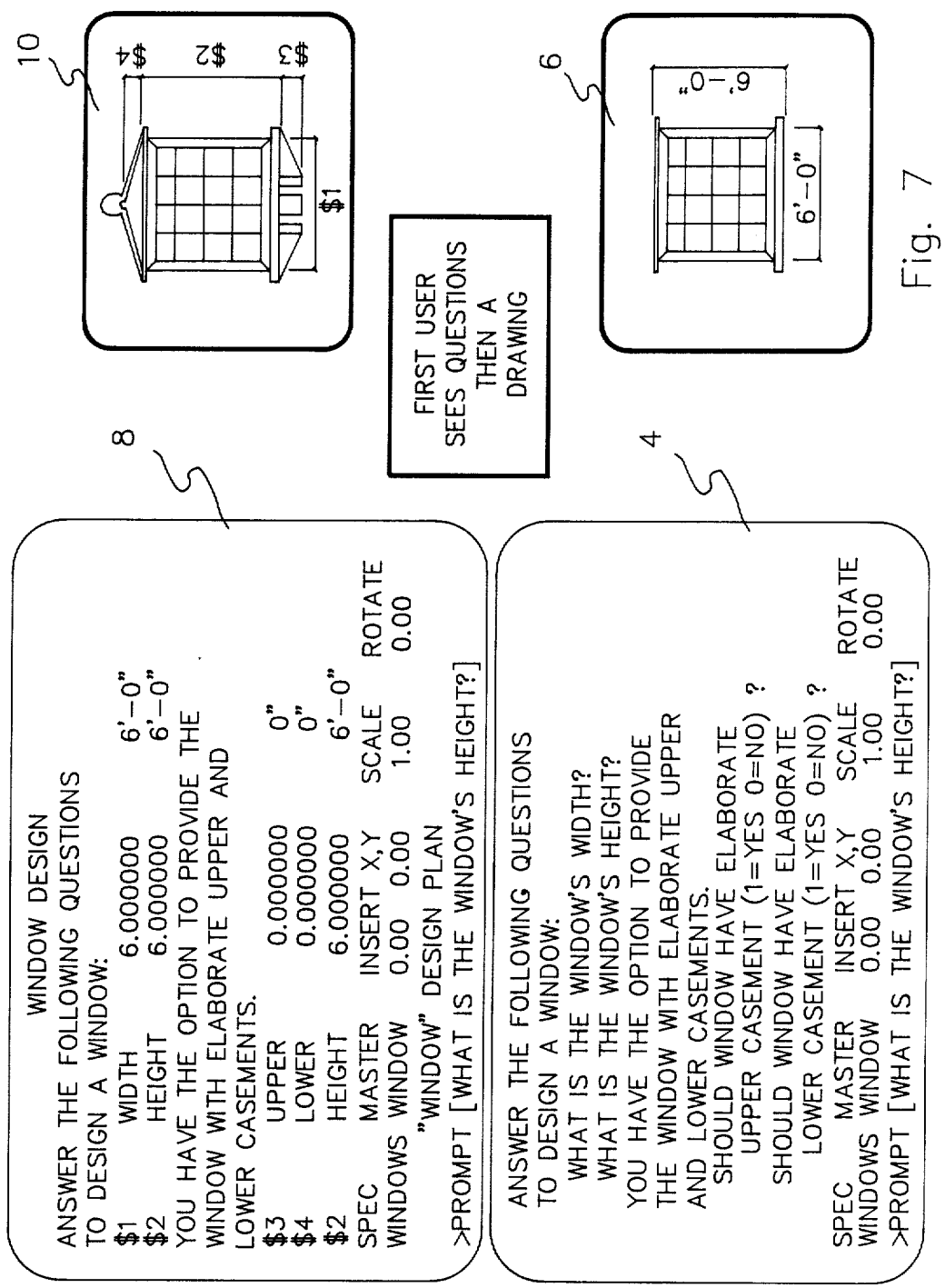
FIG. 7 displays the components of a window module; a design plan and a master drawing and the two screens visible to the user—prompts and final drawing.

FIG. 7 shows the behind-the-scenes components required to produce the effect just described. The design plan file, WINDOW 8, which the user does not see (explained more fully in FIG. 25) holds the formulas and procedures for the WINDOW design. During execution of the design plan these are inaccessible to the user who cannot inadvertently change them. Nor does he see the WINDOW master drawing 10, which contains the basic elements of the WINDOW design. He is presented with the design questions 4, and, when those are answered, sees the completed drawing of the WINDOW 6.

Figure 8:
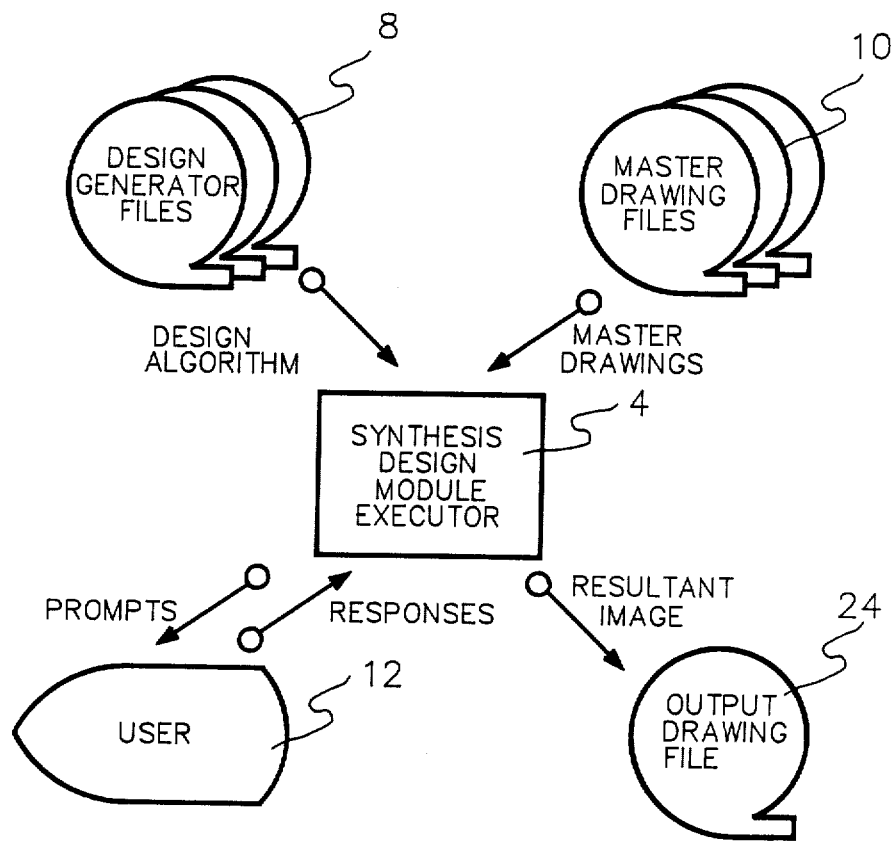
FIG. 8 describes data flow in the situation where a module is used as a stand-alone designer.

FIG. 8 illustrates, in a schematic drawing, the general description of what is happening while the user executes the WINDOW design. Through prompts and responses, the master drawing of the WINDOW design 10 is combined with the data from the design plan files 8 in the design module executor 4 to create a completed drawing file 24.

Figure 10:
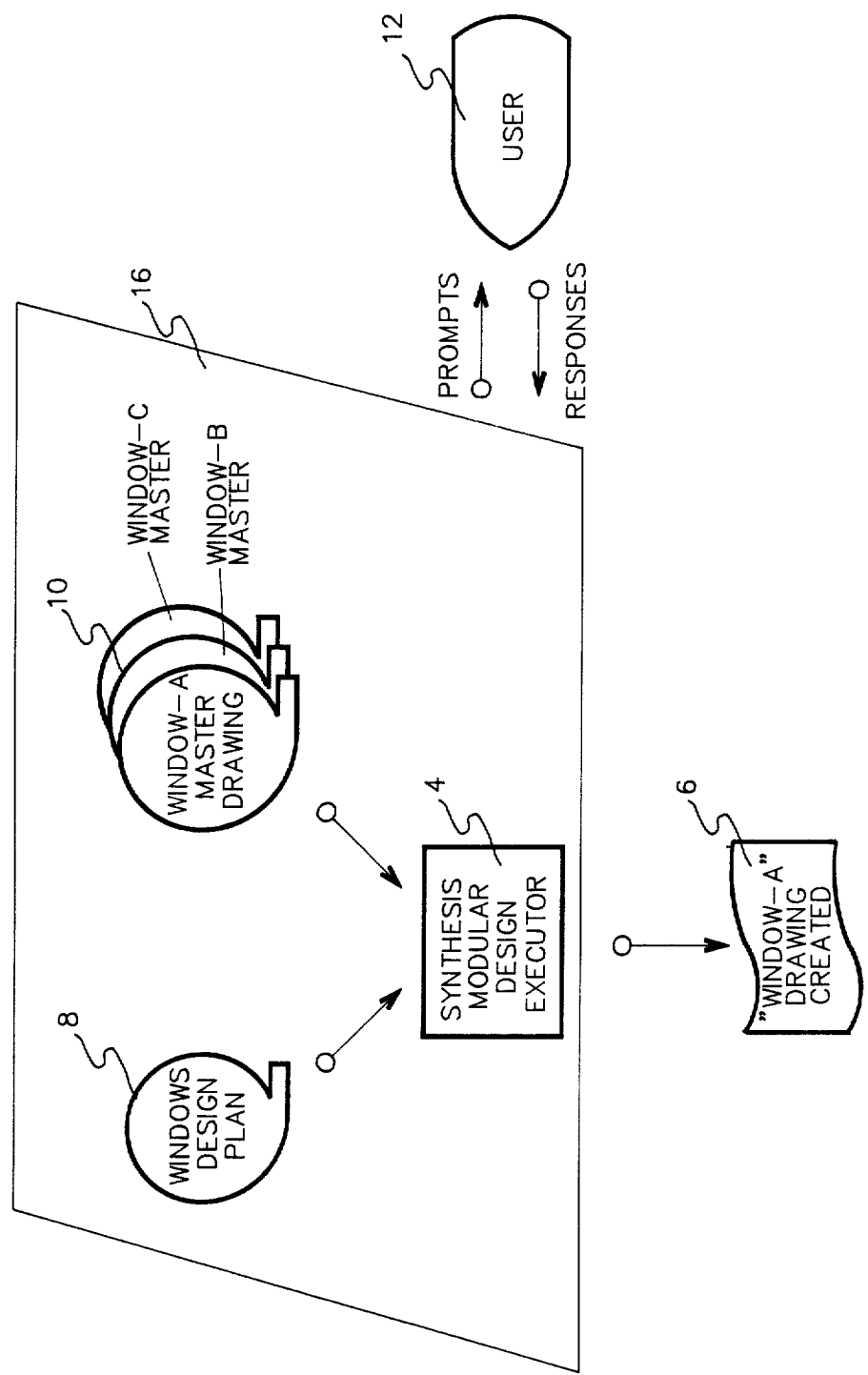
FIG. 10 depicts the three components of the WINDOW design module; the WINDOW design plan, the WINDOW master drawing, and the execution capabilities of a modular design executor employed in our novel design process and entitled SYNTHESIS TM, and also shows the data flow in situations where the WINDOW design module is used as a stand-alone designer.

FIG. 10 represents the three components of the WINDOW design module. They include the WINDOW design plan, the WINDOW master drawing and the SYNTHESIS TM design executor. Together they form a unit that has the capability of either creating a drawing or of performing analysis for other modules. It can design and draw on its own (as in this example), or it can join other modules to create a composite design (as will be seen in the next two examples).

The rest of this section describes the steps employed to set up the WINDOW design module, particularly;
 1. How to create a master drawing;
 2. The role of the master drawing in creating output drawings; and
 3. How to establish a design plan.

The master drawing is the pattern from which eventual images (final designs) are created. It is modified by the parameters generated by the design plan. A master drawing contains labels in place of fixed dimensions. The labels can replace dimension text or ordinary text. The label ("$" followed by a number in the example but not limited to that as syntax) represents a variable that can be manipulated by the design plan.

Figure 16:
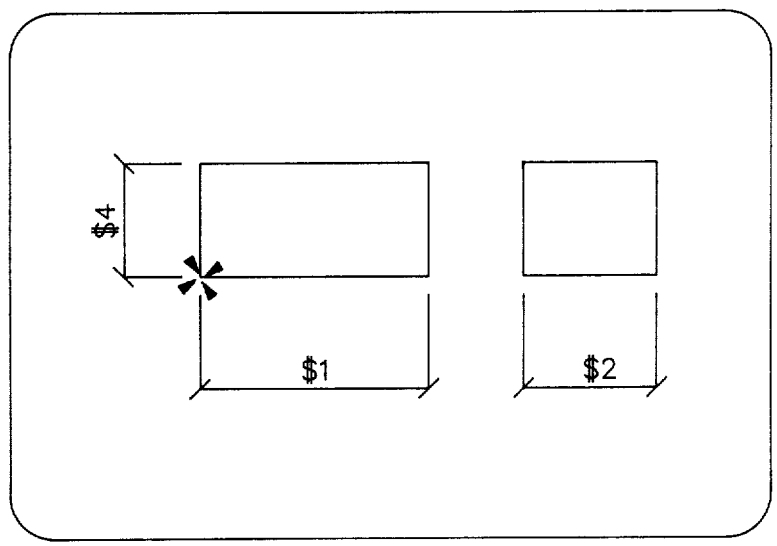
FIG. 16 is a WALL master drawing with variable dimensions.

To create a master drawing—beginning from the SYNTHESIS TM main menu, FIG. 6—the user chooses option 1, "create a new drawing." In this example, he calls the drawing "WINDOW". Here SYNTHESIS TM transfers control to the AUTOCAD ® drawing processor 54. Using the drawing editing capabilities of AUTOCAD ®, the user creates a drawing and dimensions it using labels. The master drawing is shown in FIG. 16. He assigns the drawing a base point (The base point provides a reference to use when positioning several images in a composite picture. This procedure is described later and results in the creation of a composite image.) Finally, the user saves the finished drawing as an AUTOCAD ® file (an AUTOCAD ® "drawing interchange file"), then exits AUTOCAD ®. With this the user is returned to the SYNTHESIS TM main menu.

FIG. 7 is a depiction of the "WINDOW" master drawing, showing the appearance of labels—$1, $2, etc.—that correspond to the labels in the design plan 8. This particular example is of a master drawing made with an AUTOCAD ® drawing processor, although another drawing processor system would work equally well.

Next we will explain how the user creates the design plan. Beginning from the main menu, 2, as seen in FIG. 6, the user chooses option 3, "Edit a Design Plan." An empty design plan appears on the screen. Its format will now be described.

FIG. 9 depicts the on-screen appearance of the WINDOW design plan while it is being edited. It has this appearance only during the design editing process, which is described in detail in FIGS. 55-60. This description is not being used in a limiting sense, but as a means of explanation.

The design plan has 3 regions as seen in FIG. 9. The large upper area, the label region, contains the prompts and formulas used to calculate values for the labels in the master drawing. The master drawing region is the area shown near the bottom which contains the name of the master drawing which will be inserted into the eventual drawing. The formula bar is the bottom row of the design plan. The design plan appears as a matrix of cells. Each cell displays its "current" value. Each cell also contains a formula. The formula of the current cell can be seen in the formula bar at the bottom of the screen.

Certain other features of the design editor are not shown. They include pull-down menues which provide the user with editing commands. For example, the user has the capability to switch to related design plans currently in memory. The user can move from cell to cell, editing a cell's formula. In so doing dependent cells are instantly updated and their new values displayed.

The first type of cell group is referred to here as the drawing variable region. The primary function the of cells in this region is to generate replacement text and measurement values for labels in the master drawing. In this group each row contains four cells; label, variable, measurement and text.

The relationship between the values generated in the cells of the variables region and the master drawing is next described. The label is used to associate the measurement and text computed according to the design plan with similarly labeled text in the master drawing. When the label is in place of dimension text in the master drawing, the related measurement in the design plan provides the distance with which to rectify that dimension. Rectified along with the dimension are its associated parts in the master drawing. Text generated as a result of the design plan replaces its associated label in the master drawing.

The relationship between the cells are now described. The variable name (e.g. height, width) to use in calculations within the design plan refers to the values in either of the related text or measurement cell. Which it refers to depends on the context in which it is used. The measurement contains a formula which results in a number. The text cell contains a formula which results in text.

It is important to note that, the herein presented implementation of our invention makes use of both a label and a variable name. This should not be taken in the limiting sense. The two could be combined. By simply placing the variable directly in the drawing, the label could be eliminated from the process.

The next area is referred to here as the output specification region. The primary function of cells in this region is to generate the five over-all parameters which control the insertion of the image of a master drawing. They are: the name of the master drawing, the x-and-y coordinates of insertion, the angle of insertion, the scale factor, and the angle of rotation. These parameters are used to position components of a composite picture. Their role will be explained more fully in the next example, which unlike the present example, makes use of them to form a composite picture.

The current cell's formula appears at the bottom of the screen in the formula bar. The user can move to any cell and edit its formula.

Further relationships between the cells will be described following the current example To create the WINDOW design plan, FIG. 25, the user proceeds as follows. With the cell marker on the first line, the user types:
PRINT [WINDOW Design],
then presses <ENTER> to accept the formula. On the second and third lines he types:
PRINT [Answer the following questions to]
PRINT [design a WINDOW]
Then on lines six, seven, and eight the user places the formulas:
PRINT [You have the option to provide]
PRINT [the WINDOW with elaborate upper]
PRINT [and lower casements.]
Next the user enters the labels. With the cell marker in the first column of the fourth line, the user types "$1". This is the first label in the drawing. In this example, it represents the width of the WINDOW (see FIG. 9).

When the user presses <ENTER>, the cell marker moves to the second column, the variable field. Here the user gives the label a variable name Similarly, the user provides the other labels, $2, $3, and $4.

The user then places following the variable names in the third column:
WIDTH
HEIGHT
UPPER
LOWER These are placed in rows four, five, nine and ten, respectively.

The user places in the measurement cells the formulas corresponding to the variables UPPER and LOWER. Values computed in the measurement cells govern rectification of similarly-labeled dimensions in the master drawing.
PROMPT [Should the WINDOW have the elaborate upper casement?]
PROMPT [Should the WINDOW have the elaborate lower casement?]

The user places values in the text cells corresponding to the variables WIDTH and HEIGHT.
PROMPT [What is the WINDOW's width?]
PROMPT [What is the WINDOW's height?]

Finally, the user moves to the first cell in the Master Drawing region to provide a formula for choosing the corresponding master drawing.
[WINDOW]
Editing the design is now complete.

In many ways editing a design plan is similar to editing an ordinary spreadsheet, but there are vital differences:
1. Cells have predefined roles in the process, and these are specific to drafting.
2. Many formulas are entered automatically by SYNTHESIS TM.
3. Each variable refers to, and is present on the finished drawing as, two values: measurement and text.

The predefined roles of the cells are these. The cells in the Labels region, at the top of the design plan, define the values that correspond to the labels in the master drawing. They have these roles:
1. The label relates the values computed to the master drawing;
2. The text value is used to replace the corresponding label in the master drawing;
3. The variable is the name by which the formula value is referred to inside the design plan; and
4. The measurement value is used to rectify the part of the drawing which is dimensioned with the corresponding label.

At the bottom of the screen, the Master Drawing region has cells which play the following roles:
1. The Design Plan Name cell names the current design plan when several design plans are in memory at the same time;
2. The Master Drawing cell links the design plan with its corresponding master drawing;
3. The X-insert cell provides the X coordinate with which the base point of the master drawing is to be aligned when its image is inserted into a composite image;
4. Similarly, the next cell defines the Y-insert point;
5. the Scale Factor cell defines the scale factor for inserting the image; and 6. the Rotate cell rotates the image. When it is placed in the master drawing it is rotated according to the angle provided in this cell. For example, in the case of the window, where no rotation was made, the angle of rotation is zero degrees.

It should be noted that each of the variable names in the Label region refers to two cells, a number cell and a text cell. SYNTHESIS TM automatically places a formula in a text cell (of the variables region) whenever the corresponding number cell is edited, and vice-versa. The following formulas were automatically placed in measurement cells corresponding to the variables WIDTH and HEIGHT:

ARCH#($HEIGHT)
ARCH#($WIDTH)

And, these formulas are automatically entered into the text cells corresponding to the variables UPPER and LOWER:

ARCH$(#UPPER)
ARCH$(#LOWER)

In the foregoing formulas the function ARCH# converts from a number's textual representation to its numeric value. The formula can be overwritten if the user wishes to place another formula in the cell. The choice of formula is user-configurable. The user can choose various types of conversion formulas or have none at all.

A default relationship can be established between the text and measurement cells just described. According to this relationship a dimension's measurement value can be automatically represented as text for various units of measure. It works this way; when either one of these cells is first edited a formula is automatically placed in its sister cell. The user can reconfigure the editor during editing to choose whatever mode of text should represent measurement. The user also has the option of overriding the default formula, replacing it with any formula he chooses. The second type of cell group is referred to here as the drawing insertion region. It contains information describing the overall parameters for inserting the master drawing. They are: the master drawing name cell, the X-coordinate cell, the Y-coordinate cell, the scale factor cell, and the angle of rotation cell.

Thus, the hard copy output of the WINDOW design plan would typically appears as follows:

---

<u>Design Plan Formulae</u>

Design Session Name = WINDOW.DEZ
Associated Master Drawing Name = WINDOW
PRINT[          WINDOW Design ]
PRINT[Answer the following questions to]
PRINT [design a WINDOW:]
$1 $WIDTH
Meas. ARCH#($WIDTH)
      =6.000000
Text PROMPT[What is the WINDOW's width? ]
      = 6'-0"
$2 SHEIGHT
Meas. ARCH#($HEIGHT)
      = 6.000000
Text PROMPT[What is the WINDOW's height? ]
      = 6'-0"
PRINT[You have the option to provide]
PRINT[the WINDOW with elaborate upper]
PRINT[and lower casements.]
$3 $UPPER
Meas. PROMPT [Should WINDOW have
                    elaborate upper casement
(1=YES 0=NO) ? ]
      = 0.000000
Text ARCH$(#UPPER)
      = 0"

---

-continued $4 SLOWER
Meas. PROMPT [Should WINDOW have
                    elaborate lower casement
(1=YES 0=NO) ? ]
      = 0.000000
Text ARCH$(#LOWER)
      = 0"
Master [WINDOW]
      = WINDOW
X-Insrt = 0.00
Y-Insrt = 0.00
X-Scale = 1.00
Y-Scale = 1.00
Rotate = 0.00

---

Example of a Computer Program Directing a Group of Modules

The second example of executing a parametric design supposes that the user has a program which designs a HOUSE but that the program has no graphic representation of that structure. The present invention would supply the drawings through the appropriate component design modules. The drawing HOUSE-A, FIG. 24, is the desired completed drawing for this example.

Figure 13:
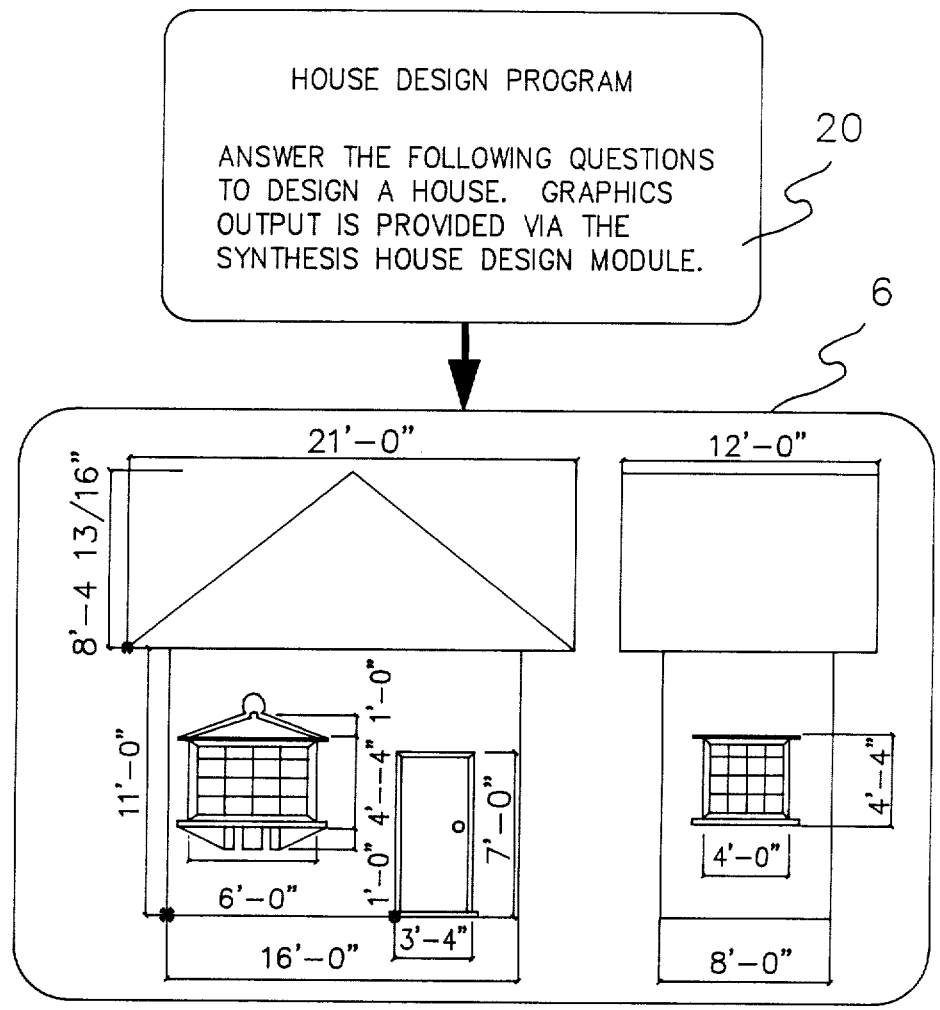
FIG. 13 show the screens evident to the user in executing a HOUSE design and the final HOUSE drawing.

The user is presented with the main menu screen of his HOUSE design plan, FIG. 13. Although the form of the prompts may vary, the user will usually be asked a series of questions by a commercial design program relating to the specifications of the HOUSE. After the user responds to design questions, he is presented with a completed drawing of his HOUSE 36.

Figure 14:
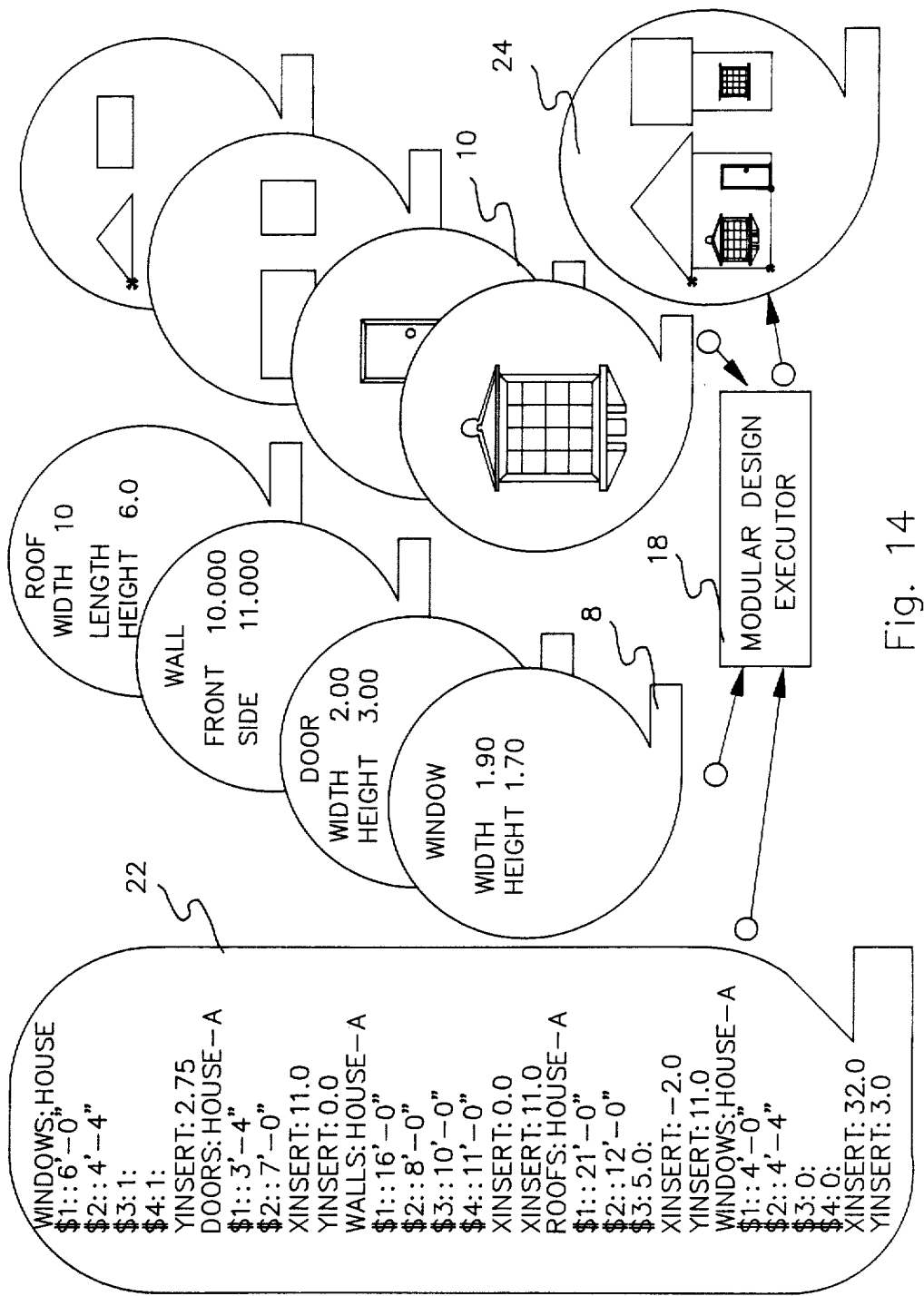
FIG. 14 represents the data flow among the elements of a modular design executor, those elements being the multi-design file produced by the user's HOUSE design program; the design plans (WINDOW, DOOR, WALL, and ROOF); the master drawings (WINDOW, DOOR, WALL, and ROOF); the electronically-stored image of the HOUSE, and the modular design executor.

Refer now to FIG. 14 which illustrates the capabilities of the invention during the execution of a multi-design process. In the example of this mode, the program supplants the user and interacts with each module, completely or in part. In the example of the HOUSE design, the design modules 10 being dealt with are the WINDOW module, the DOOR module, the WALL module, and the ROOF module. Here again, the term "module" refers to the specific master drawing, the design plan and the capability of the two to interact with the computer program and each other (the user is not aware of the modules). The above-enumerated exemplary design modules, here being used in conjunction with a design program, can also be used as stand-alone modules as in the first example of parametric design. When the design program passes values corresponding to the variables defined in the design plan, those values are accepted in place of the values normally computed by its formula.

The computer program places the values it calculates into the multi-design file. These values are used to drive the modules, composed of design plans 10 and master drawings 8, in creation of the house image 24.

An explanation now will be given of the syntax used within the multi-spec file formulas 22, where:
  [ ] signifies an optional formula,
  . . . signifies that the formula can be repeated as desired, and
  < > signifies a variable such as width, height, etc.
The information for the first design plan—the WINDOW design plan—in the multi-spec file reads:
WINDOW:HOUSE-A
$1::6'-0"
$2::4'-4"
$3:1:
$4:1:

XINSERT:7.0
YINSERT:2.75
The corresponding syntax is the following:
<design plan name>:<output drawing name>
[<variable>:<measurement>:<text>]
...
[XINSERT:<value>]
[YINSERT:<value>

The multi-design file contains five such blocks of information. We will examine the first of these in detail and explain how the values are passed and how the usual mode of execution is overriden by information provided in the file. The first block makes use of the design plan WINDOW to add an image to the drawing file HOUSE-A. The is described in the first line of the file, "WINDOW:HOUSE-A." The next six lines provide values for six variables in the design plax: text is provided corresponding to $1 and $2; and numbers for $3, $4, XINSERT, and YINSERT. These values supplant those that would normally be calculated for these six variables. This is true regardless of how their calculation is specified in the design plan. Variables that aren't passed are calculated according to their formulas in the design plan. Note that multi-design files can pass values corresponding to a variable's text or measurement or both.

This is a very powerful capability since it transforms variables which might otherwise depend, for example, on user input or upon values of other variables into constants.

This description is not intended in a limiting sense but as an example of the type of information passed between design plans in a multi-spec file.

Figure 15:
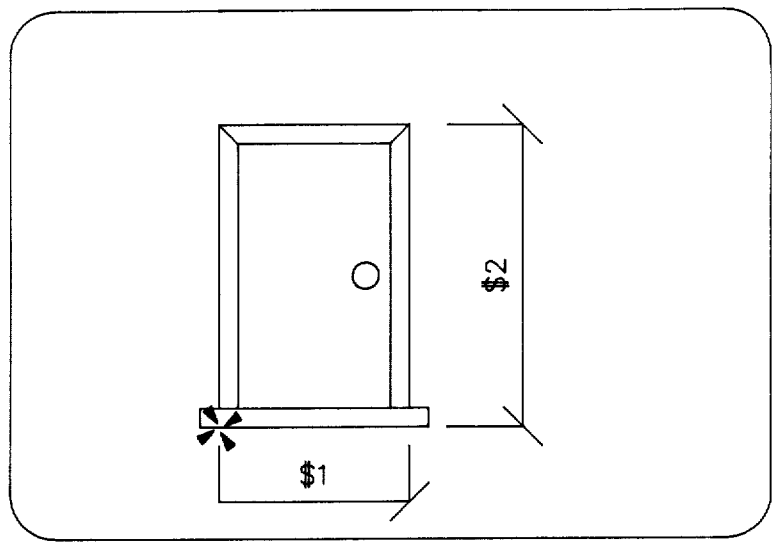
FIG. 15 is a DOOR master drawing with variable dimensions.
Figure 17:
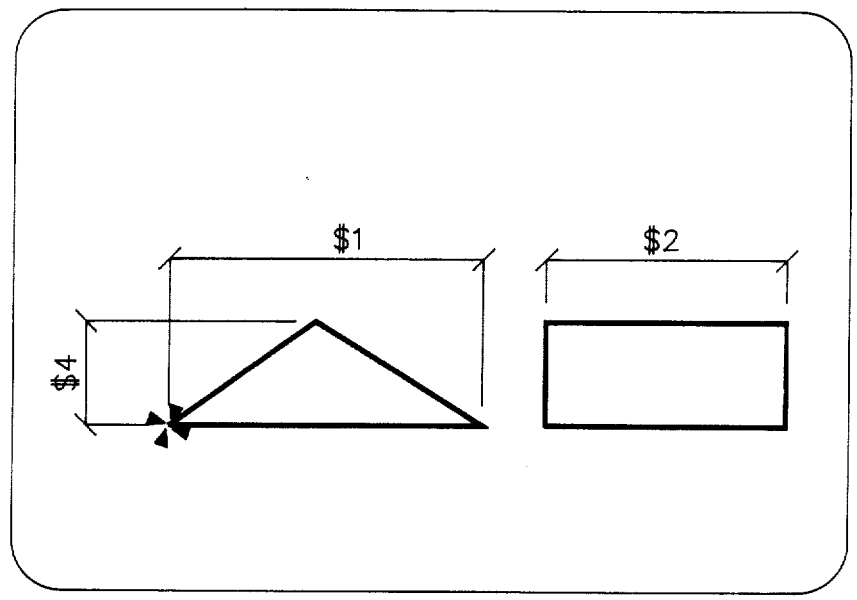
FIG. 17 is a ROOF master drawing with variable dimensions.

Refer now to FIGS. 15, 16, and 17 which illustrates the DOOR master drawing, the WALL master drawing and the ROOF master drawing, respectively. These master drawings are used to form the composite drawing of the house. These form the basis for individualized design components and, again, are not seen by the user during the design process.

FIGS. 21, 22, and 23 illustrate the design screens produced by the design editor according to the DOOR design plan, the WALL design plan, and the ROOF design plan, respectively.

FIG. 24 is the composite drawing of the house. It is an enlargement of the house already seen in the house file 24 in FIG. 14.

SYNTHESIS ™ utilizes the information contained in the cells to position together the images of the four master drawings (WINDOW, DOOR, WALL, and ROOF) in the composite picture. A base point is placed in each master drawing at the time it is created. (They are marked with crosses in FIGS. 15, 16, 17 and 10). The base point serves as a reference. The image is placed so that the base point aligns itself with the point of insertion specified by the design plan (For illustration purposes the base points are visible in the composite image FIG. 24.) The rotation angle, zero in this example, causes the image to be rotated about its base point by an amount equal to the specified angle.

Hierarchy of Modules Interaction to Execute a House Design

In the following example, a hierarchy of design modules interact to design a HOUSE. First we describe the commands which allow a specsheet to interact and control subordinate design generation.

EXPORT(<design plan's name>, <variable name>, <value>)
exports a value to a subordinate design module. When a value is passed, the subordinate module is prevented from calculating the value. In doing so it suppresses the normal mode by which the subordinate module would calculate the value.

As used in this description, the term "export" means to pass information, such as width, from a controlling design plan to a subordinate design plan without performing calculations on that information.

IMPORT(<subordinate design module name>, <variable name>)
imports a value from a subordinate module. "Import" means to pass information up the hierarchy of design plans without performing calculations.

CALCULATE(<subordinate design module's name>)
causes a design module to calculate the values corresponding to its formulas but not output a drawing based on calculations. It is prevented from calculating values for cells to which a value was exported by a supervising module.

CLEAR(<subordinate design plans name>)
clears the protection that exported-to cells have from calculating values. This command enables all cells in the design module to calculate.

OUTPUT(<subordinate design module's name>)
causes subordinate module to output a drawing.

Figure 30:
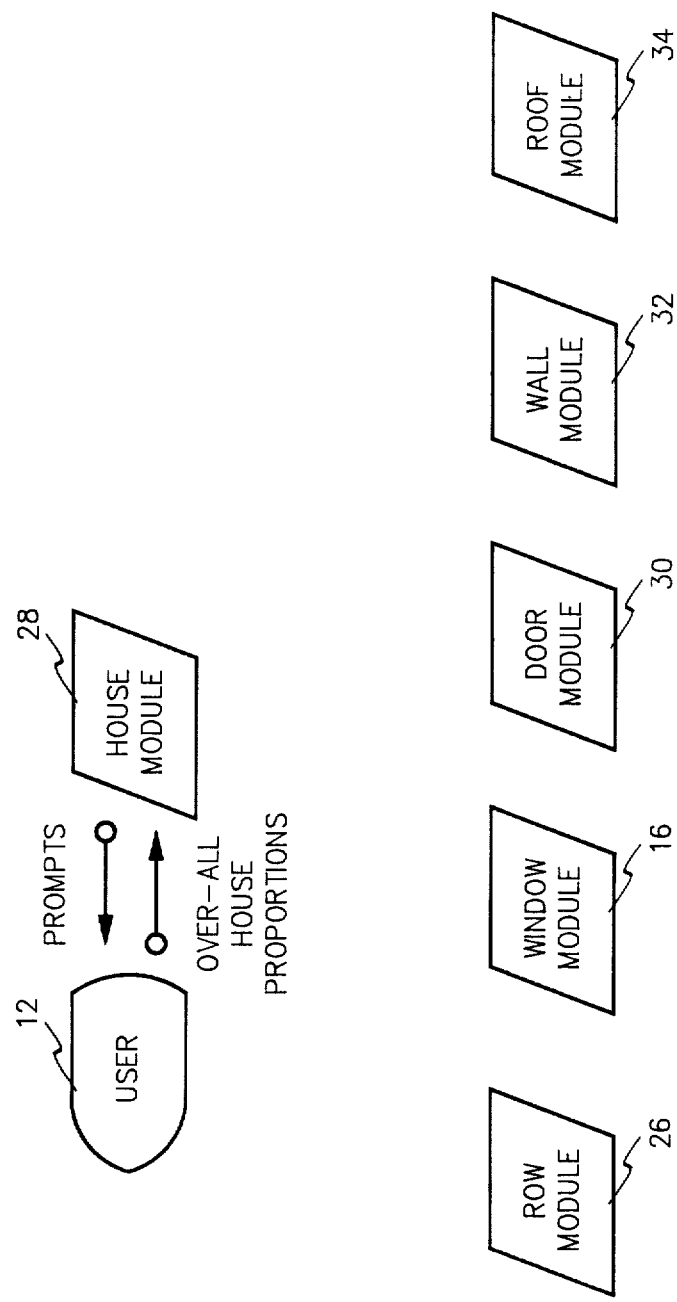
FIG. 30 illustrates the first step taken by a computer in executing the HOUSE design module in which the user is asked for the overall HOUSE proportions. Also shown are the modules with which the HOUSE module will interact.

FIG. 30 portrays the user's experience in executing the HOUSE design plan. First, the user sees a screen of information and prompts 29 for which he provides answers, one-at-a-time; then he sees screen showing a view of the completed house 6.

Figure 26:
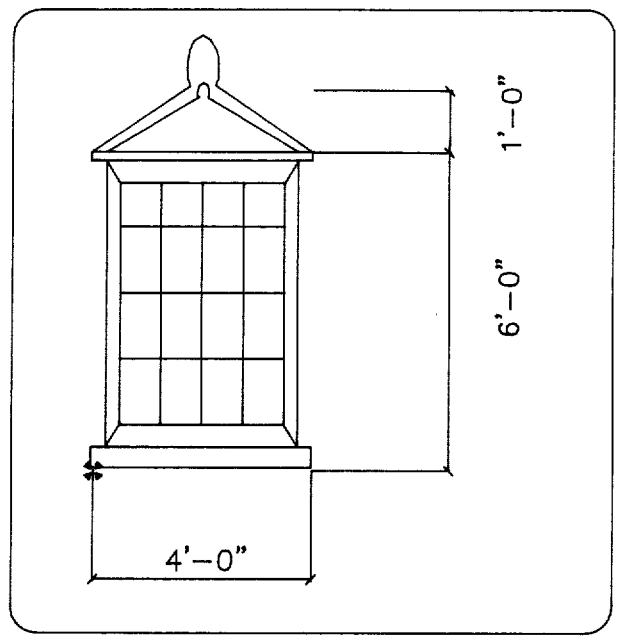
FIG. 26 is a detail drawing of the front WINDOW of the HOUSE illustrated in FIG. 24.
Figure 27:
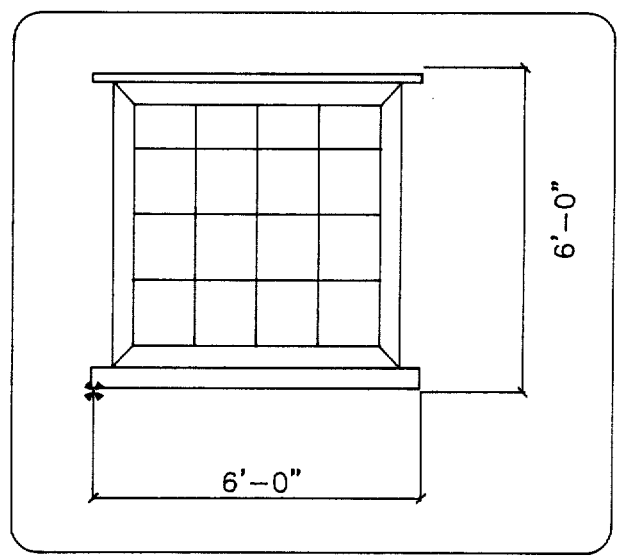
FIG. 27 is a detail drawing of the side WINDOW of the HOUSE illustrated in FIG. 24.

FIGS. 26 and 27 illustrate detail drawings which are also produced as a result of executing the HOUSE design plan. They describe the typical front and side windows, respectively.

Now we will describe how to establish the house design module beginning with the execution of the subordinate modules. No modification is required to the already described subordinate modules (WINDOW, DOOR, WALL, and ROOF).

Design Plan Formulae
Design Session Name = DOOR.DEZ
Associated Master Drawing Name = DOOR
PRINT[            DOOR Design ]
PRINT [Answer the following questions to design]
PRINT[a DOOR:]
$1  $WIDTH
Meas.  ARCH#($WIDTH)
       = 3.000000
Text PROMPT[What is the DOOR's width? ]
       = 3'-0"
$2  $HEIGHT
Meas.  ARCH#($HEIGHT)
       = 7.500000
Text PROMPT[What is the DOOR's height? ]
       = 7'-6"
Master  [DOOR]
       = DOOR
X-Insrt = 0.00
Y-Insrt = 0.00
X-Scale = 1.00
Y-Scale = 1.00
Rotate  = 0.00

Design Plan Formulae
Design Session Name = ROOF.DEZ
Associated Master Drawing Name = ROOF
PRINT[            ROOF Design ]
PRINT [Answer the following questions to design]

```
PRINT [a ROOF: ]
$1   $WIDTH of the ROOF
Meas.  ARCH#($WIDTH)
     = 10.00000
Text PROMPT [What is the width of the ROOF?]
     = 10'-0"
$4   $HEIGHT
Meas.  .4*#WIDTH
     = 4.000000
Text ARCH$ (#HEIGHT)
     = 4'-0"
$3   $BETWEEN — distance between views of the ROOF
Meas.  .2*#WIDTH
     = 2.000000
Text ARCH$ (#BETWEEN)
     = 2'-0"
$2   $LENGTH — length of the ROOF
Meas.  ARCH# ($LENGTH)
     = 6.000000
Text PROMPT [What is the ROOF's length?]
     = 6'-0"
Master   [ROOF]
     = ROOF
X-Insrt = 0.00
Y-Insrt = 0.00
X-Scale = 1.00
Y-Scale = 1.00
Rotate = 0.00
Design Plan Formulae
Design Session Name = WALL.DEZ
Associated Master Drawing Name = WALL
PRINT [           WALL Design ]
PRINT [Answer the following questions to design ]
PRINT [the front and side views of a WALL:]
$1   $FRONT length of the WALL
Meas.  ARCH# ($FRONT)
     = 10.000000
Text PROMPT [What is the length of the front of the WALL? ]
     = 10'-0"
$2   $SIDE length of the WALL
Meas.  ARCH# ($SIDE)
     = 10.000000
Text PROMPT [What is the length of the side of the WALL? ]
     = 10'-0"
$3   $BETWEEN views of WALL distance
Meas.  ARCH#($BETWEEN)
     = 10.000000
Text PROMPT [What is the distance between WALLs? ]
     = 10'-0"
$4   $HEIGHT
Meas.  ARCH# ($HEIGHT)
     = 10.000000
Text PROMPT [What is the height of the WALL? ]
     = 10'-0"
Master [WALL]
     = WALL
X-Insrt = 0.00
Y-Insrt = 0.00
X-Scale = 1.00
Y-Scale = 1.00
Rotate = 0.00
```

An additional module called ROWS is also required. It generates rows of elements. It is included to illustrate that a module can both be blind to what it supervises as well as to whatever it is being supervised by. For example, it can create rows of kitchen cabinets; columns; or, in this case, windows. The ROWS module has no master drawing. The appearence of its design plan is shown in FIG. 29. The formulas for the ROWS design plan are as follows.

```
Design Plan Formulae
Design Session Name = row.dez
Associated Master Drawing Name = new.dwg
#   DRAWING
Value  1
     =           2.00
Text (null)
     = (null)
#   OBJNAME
Value  (null)
     =           1.00
Text IF(DRAWING# =1, "WINDOW dez", "column dez")
     = WINDOW.dez
#   CALCOBJ
Value  (null)
     = (null)
Text CALCSPC$(OBJNAME$)
     = column.dez
#   TOTLENGTH
Value   GETNUM("What is the length of the row? ",10)
     =           24.00
Text (null)
     = (null)
#   ENDSPACE
Value  PROMPTR("How much space would you like on the
ends of the row? ",0,TOLENGTH# /2, 0)
     =           0.00
Text (null)
     = (null)
#   OBJWIDTH
Value  IMPORT(OBJNAME$, "WIDTH#")
     =           4.00
Text (null)
     = (null)
#   MAXOBJ
Value  TRUNC((TOTLENGTH# - (ENDSPACE# * 2)) / OBJWIDTH#)
     =           6.00
Text (null)
     = (null)
#   NUM_OBJ
Value  PROMPTR("How many objects would you like in the row?
",0,MAXOBJ#,MAXOBJ#)
```

```
            =         12.00
Text (null)
    = (null)
# SPACE_BETWEEN
Value (TOTLENGTH# - (2 * ENDSPACE#) - (OBJWIDTH# * NUM_OBJ#))
/ (NUM_OBJ# -1)
    =         -2.18
Text (null)
    = (null)
# START_XINS
Value GETNUM("What is the starting Xinsert of the row? ",0)
    =         28.00
Text (null)
    = (null)
# START_YINS
Value GETNUM("What is the starting Y-insert of the row? ",0)
    =         1.00
Text (null)
    = (null)
# XINS_1
Value START_XINS# + ENDSPACE#
    =         28.00
Text (null)
    = (null)
# XINS_2
Value XINS_1# + OBJWIDTH# +SPACE_BETWEEN#
    =         29.82
Text (null)
    = (null)
# XINS_3
Value XINS_2# + OBJWIDTH# + SPACE_BETWEEN#
    =         31.64
Text (null)
    = (null)
# XINS_4
Value XINS_3# + OBJWIDTH# + SPACE_BETWEEN#
    =         33.45
Text (null)
    = (null)
# XINS_5
Value XINS_4# + OBJWIDTH# + SPACE_BETWEEN#
    =         35.27
Text (null)
    = (null)
# EX_XINS_1
Value IF(NUM_OBJ# > 0, EXPORT(OBJNAMES
,"XINSERT#",XINS_1#),0)
    =         1.00
Text (null)
    = (null)
# EX_YINS_1
Value IF(NUM_OBJ# > 0, EXPORT(OBJNAMES , "YINSERT#",
START_YINS#),0)
    =         1.00
Text (null)
    = (null)
# MAKE_1
Value (null)
    = (null)
Text IF(NUM_OBJ# > 0, OUTPUTSPC$(OBJNAMES), "not done")
    = column.dez
# EX_XINS_2
Value IF(NUM_OBJ# >1, EXPORT(OBJNAMES , "XINSERT#",
XINS_2#),0)
    =         1.00
Text (null)
    = (null)
# MAKE_2
Value (null)
    = (null)
Text IF( NUM_OBJ# > 1, OUTPUTSPC$(OBJNAMES), "not done")
    = column.dez
# EX_XINS_3
Value IF(NUM_OBJ# > 2, EXPORT(OBJNAMES , "XINSERT#",
XINS_3#),0)
    =         1.00
Text (null)
    = (null)
# MAKE_3
Value (null)
    = (null)
Text IF( NUM_OBJ# > 2, OUTPUTSPC$(OBJNAMES), "not done")
```

```
       = column.dez
# EX_XINS_4
Value IF(NUM_OBJ# > 3, EXPORT(OBJNAME$ , "XINSERT#",
XINS_4#),0)
       =          1.00
Text (null)
       = (null)
# MAKE_4
Value (null)
       = (null)
Text IF(NUM_OBJ# > 3, OUTPUTSPC$(OBJNAME$), "not done")
       = column.dez
# EX_XINS_5
Value IF(NUM_OBJ# > 4, EXPORT(OBJNAME$ , "XINSERT#",
XINS_5#),0)
       =          1.00
Text (null)
       = (null)
# MAKE_5
Value (null)
       = (null)
Text IF(NUM_OBJ# > 4, OUTPUTSPC$(OBJNAME$), "not done")
       = column.dez
# SHEETNAME
Value (null)
       = (null)
Text "row.dez"
       = row.dez
# MASTERNAME
Value (null)
       = (null)
Text "new.dwg"
       = new.dwg
# XINSERT
Value 0.0

=          0.00
Text ARCH$(XINSERT#)
       = 0"
# YINSERT
Value 0.0
       =          0.00
Text ARCH$(YINSERT#)
       = 0"
# SCALE
Value 1.0
       =          1.00
Text ARCH$(SCALE#)
       = 1'-0"
# ROTATION
Value 0.0
       =          0.00
Text ARCH$(ROTATION#)
       = 0"
```

Next, the user establishes the HOUSE design plan. That design plan supervises all of the other modules and in so doing produces all the aspects of the house. FIG. 28 shows how the HOUSE design plan appears in the design editor. Next we provide formulas for the HOUSE design plan.

```
Design Plan Formulae
Design Session Name = HOUSE.DEZ
Associated Master Drawing Name = new
     W ###############
Value (null)
       = (null)
Text PRINT$("WELCOME TO THE HOUSE DESIGNER.")
       = WELCOME TO THE HOUSE DESIGNER.
Answer ###############
Value (null)
       = (null)
Text PRINT$("Answer the following questions to design a HOUSE.")
       = Answer the following questions to design a HOUSE.
# EAVE_LENGTH
Value PROMPTR("How long should the eaves be on ROOF? ",0,5,2)
       =          2.00
Text (null)
       = (null)
# ROOF_HEIGHT
Value 5
```

```
             =         5.00
Text (null)
     = (null)
#  HOUSE_WIDTH
Value  PROMPTR("How wide should the HOUSE be? ",5,80,20)
     =        20.00
Text (null)
     = (null)
#  HOUSE_HEIGHT
Value  20
     =        20.00
Text (null)
     = (null)
#  HOUSE_LENGTH
Value  PROMPTR("How long should the HOUSE be? ",5,50,20)
     =        20.00
Text (null)
     = (null)
#  WALL_HEIGHT
Value  HOUSE_HEIGHT# - ROOF_HEIGHT#
     =        14.00
Text ARCH$(WALL_HEIGHT#)
     = 14'-0"
#  ROOF_LENGTH
Value  HOUSE LENGTH# + (EAVE_LENGTH# * 2)
     =        24.00
Text (null)
     = (null)
ROOF_WIDTH
Value  HOUSE_WIDTH# + (EAVE_LENGTH# * 2)
     =        24.00
Text (null)
     = (null)
#  SPACE
Value  4
     =        4.00
Text (null)
     = (null)
#  EX_ROOF_SPACE
Value  EXPORT("ROOF.dez","BETWEEN#",SPACE#)
     =        1.00
Text (null)
     = (null)
#  EX_ROOF_HEIGHT
Value  EXPORT("ROOF.dez","HEIGHT#",ROOF_HEIGHT#)
     =        1.00
Text (null)
     = (null)
#  EX_ROOF_LENGTH
Value  EXPORT("ROOF.dez","LENGTH#",ROOF_LENGTH#)
     =        1.00
Text (null)
     = (null)
#  EX_ROOF_WIDTH
Value  EXPORT("ROOF.dez","WIDTH#",ROOF_WIDTH#)
     =        1.00
Text (null)
     = (null)
#  EX_ROOF_YINS
Value  EXPORT("ROOF.dez","YINSERT#",WALL_HEIGHT#)
     =        1.00
Text ARCH$(EX_ROOF_YINS#)
     = (null)
#  WALL_SPACE
Value  SPACE# + (EAVE_LENGTH# *2)
     =        8.00
Text (null)
     = (null)
#  EX_WALL_SPACE
Value  EXPORT("WALL.dez","BETWEEN#",WALL_SPACE#)
     =        1.00
Text (null)
     = (null)
#  EX_WALL_XINS
Value  EXPORT("WALL.dez","XINSERT#",EAVE_LENGTH#)
     =        1.00
Text (null)
     = (null)
#  EX_WALL_HEIGHT
Value  EXPORT("WALL.dez","HEIGHT#",WALL_HEIGHT#)
     =        1.00
Text (null)
```

```
        = (null)
# EX_WALL_LENGTH
Value  EXPORT("WALL.dez","SIDE#",HOUSE_LENGTH#)
       =          1.00
Text = (null)
       = (null)
# EX_WALL_WIDTH
Value  EXPORT("WALL.dez","FRONT#",HOUSE_WIDTH#)
       =          1.00
Text (null)
       = (null)
# EX_WALL_YINS
Value  EXPORT("WALL.dez", "YINSERT#", 0)
       =          1.00
Text ARCHS(EX_WALL_YINS#)
       = (null)
# DO_ROOF
Value  (null)
       = (null)
Text OUTPUTSPC$(CALCSPC$("ROOF.dez"))
       = ROOF.dez
# DO_WALLS
Value  (null)
       = (null)
Text OUTPUTSPC$(CALCSPC$("WALL.dez"))
       = WALL.dez
#Do doo  ##############
Value  (null)
       = (null)
Text (null)
       = (null)
# CALC_DOOR
Value  (null)
       = (null)
Text CALCSPC$("door.dez")
       = door.dez
# DOOR_WIDTH
Value  INPORT("door.dez", "WIDTH#")
       =          3.00
Text (null)
       = (null)
# DOOR_INSERT
Value  3
       =          3.00
Text (null)
       = (null)
# EX_DOOR_XINS
Value  EXPORT("door.dez","XINSERT$", HOUSE_WIDTH#
DOOR_INSERT#- DOOR_WIDTH# + EAVE_LENGTH#)
       =          1.00
Text (null)
       = (null)
# EX_DOOR_YINS
Value  EXPORT("door.dez", "YINSERT#", 0)
       =          1.00
Text ARCHS(EX_DOOR_YINS#)
       = (null)
# DO_DOOR
Value  (null)
       = (null)
Text OUTPUTSPC$("door.dez")
       = door.dez
# SET_DRAW_WIN
Value  EXPORT("row.dez", "DRAWING#", 1)
       =          1.00
Text (null)
       = (null)
###############
Value  (null)
       = (null)
Text PRINT$("Next, design the WINDOW for the front of the
HOUSE.")
       = Next, design the WINDOW for the front of the HOUSE.
# EX_WIN_LENGTH
Value  EXPORT("row.dez","TOTLENGTH#,HOUSE_WIDTH#
DOOR_WIDTH# - DOOR_INSERT#)
       =          1.00
Text (null)
       = (null)
# EX_WIN_XINS
Value  EXPORT("row.dez","START_XINS#",EAVE_LENGTH#)
       =          1.00
```

```
                                    -continued
Text (null)
     = (null)
# EX_WIN_YINS
Value  EXPORT("row.dez","START_YINS#", 2)
     =          1.00
Text ARCH$(EX_WIN_YINS#)
     = (null)
# EX_WIN_NAME
Value  EXPORT("row.dez", "OBJNAME#", 1)
     =          1.00
Text (null)
     = (null)
# DO_FRONT_WINS
Value  (null)
     = (null)
Text CALCSPC$("row.dez")
     = row.dez
###############
Value  (null)
     = (null)
Text PRINT$("Next, design the WINDOW for the side of the HOUSE.")
     = Next, design the WINDOW for the side of the HOUSE.
# EX_WIN_WIDTH
Value  EXPORT("row.dez","TOTLENGTH#",HOUSE_LENGTH#)
     =          1.00
Text (null)
     = (null)
# EX_SIDEWIN_XINS
Value  EXPORT("row.dez","START_XINS#", ROOF_WIDTH# + SPACE# +
EAVE_LENGTH#)
     =          1.00
Text (null)
     = (null)
# DO_SIDE_WINS
Value  (null)
     = (null)
Text CALCSPC$("row.dez")
     = row.dez
# SHEETNAME
Value  (null)
     = (null)
Text "HOUSE.dez"
     = HOUSE.dez
# MASTERNAME
Value  (null)
     = (null)
Text "new"
     = new
# XINSERT
Value  0.0
     =          0.00
Text ARCH$(XINSERT#)
     = 0"
# YINSERT
Value  0.0
     =          0.00
Text ARCH$(YINSERT#)
     = 0"
# SCALE
Value  1.0
     =          1.00
Text ARCH$(SCALE#)
     = 1'-0"
# ROTATION
Value  0.0
     =          0.00
Text ARCH$(ROTATION#)
     = 0"
```

FIGS. 30–48 illustrate the role of each module and show the part it plays in creating the HOUSE-A drawing, FIG. 24. The figures illustrate how the various design plans can interact with each other.

FIGS. 30–48 are not necessarily in the order in which they are executed in a multi-design. During this entire process the user only sees the prompts for variables which the invention needs to complete the HOUSE drawing. The user will not see the completed drawing until all questions are answered.

Refer now to FIG. 30 which depicts what happens when the user is prompted for HOUSE proportions by the HOUSE module 28 which is in control. At this point, the HOUSE module 28 is only prompting the user 12 and not interacting with subordinate modules.

Figure 31:
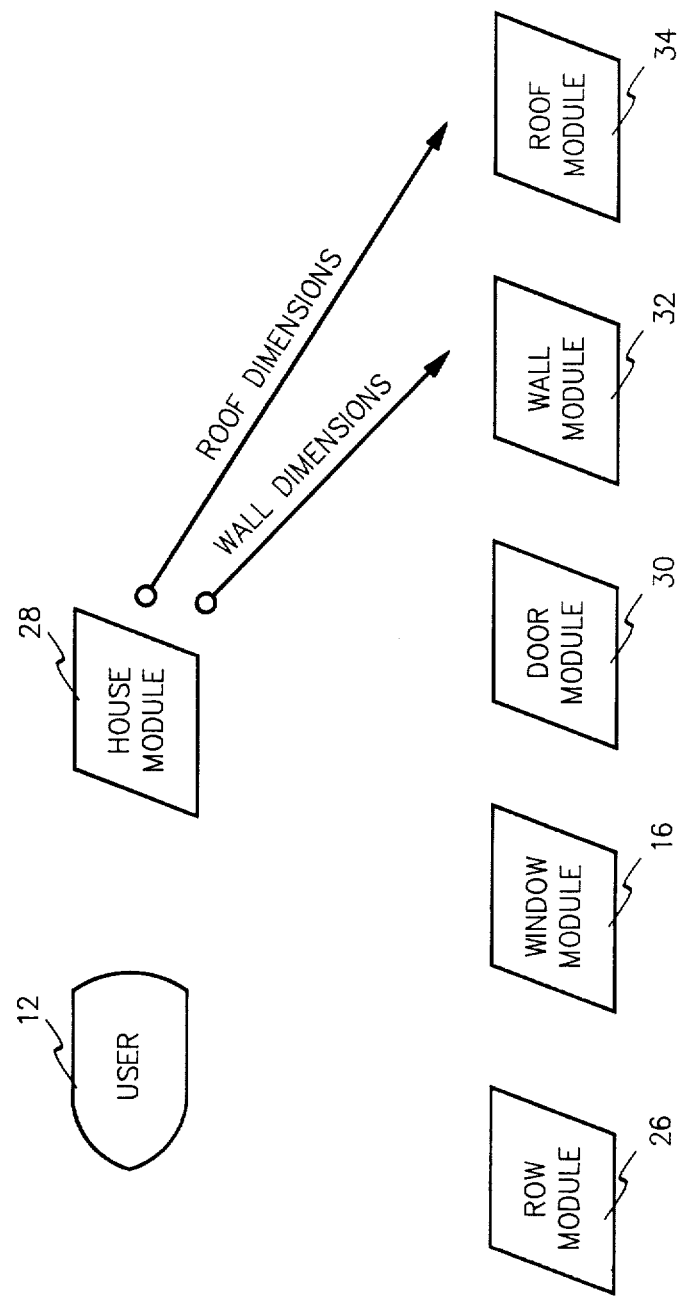
FIG. 31 depicts a step in executing the HOUSE design module in which that module exports dimensions to the WALL design module and the ROOF design module.
Figure 32:
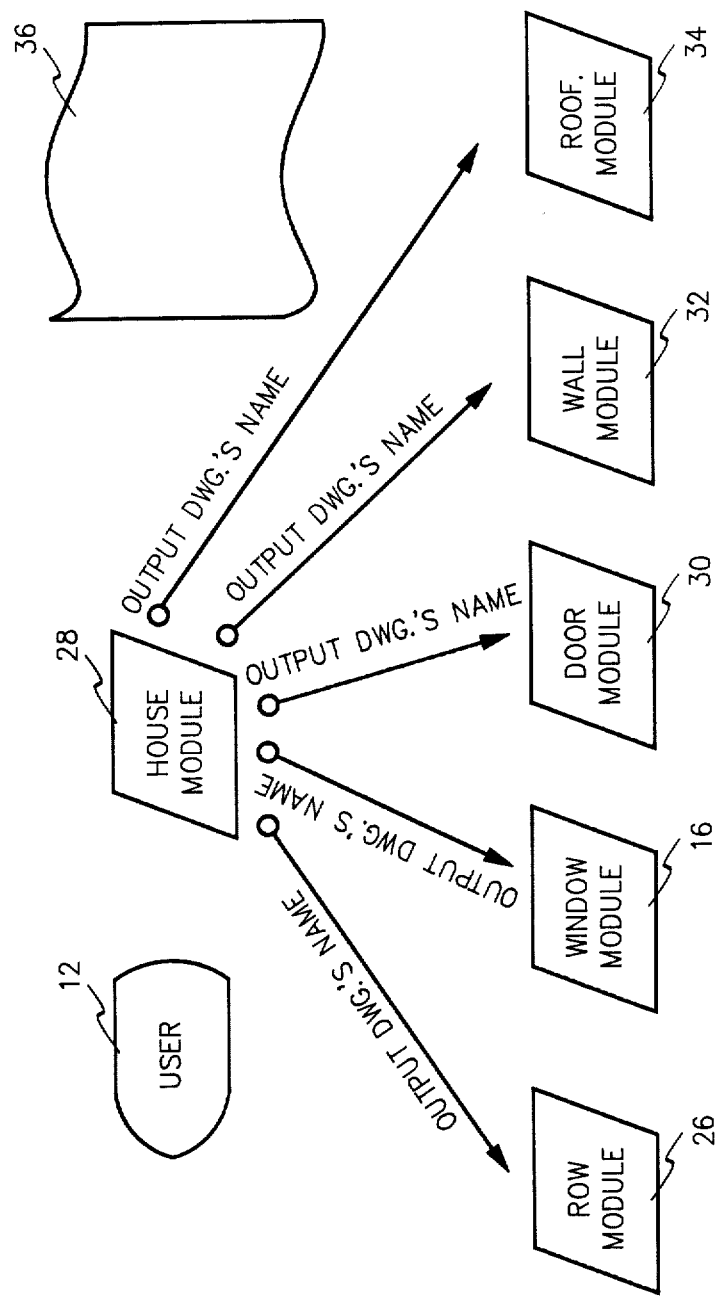
FIG. 32 depicts a step in executing the HOUSE design module in which that module exports the name of the output drawing file that will hold the composite image of the HOUSE to the WINDOW, DOOR, WALL, ROOF, and ROW design modules.

In FIG. 31 the HOUSE module 28 is shown as exporting the HOUSE width, length and height to the WALL module 32 and the ROOF length, width and height to the ROOF module 34.

The output drawing name, HOUSE-A, is exported to the ROWS module 26, DOOR module 30, WALL module 32, and ROOF module 34. As discussed above, the ROWS module 26 is a generic design plan which can be used with any design program. It has the capability of designing similar components, such as rows of windows, based on mathematical formulas, and user-originated information in a single transaction; i.e., without a creation of a new design plan for each of the similar elements.

Figure 33:
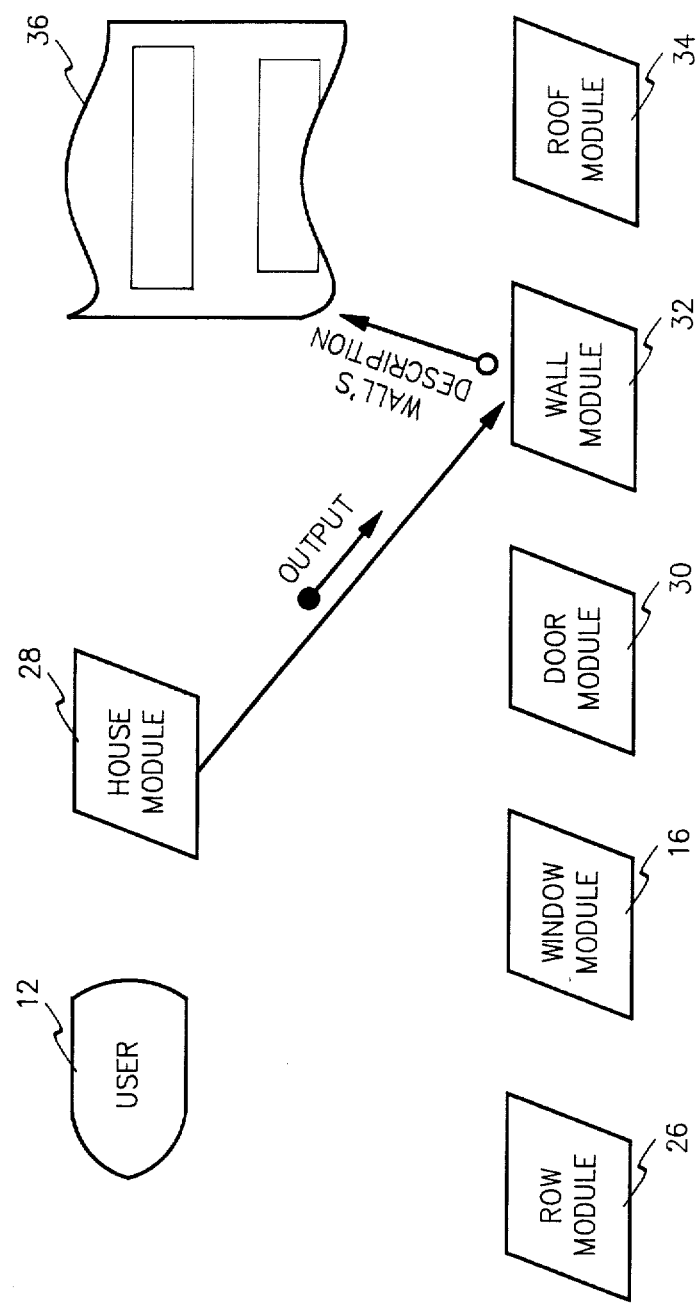
FIG. 33 depicts a step in the design process in which the HOUSE design module compels the WALL design module to output walls to the composite image.

In FIG. 33 the design plan of the WALL module 32 is shown as being compelled by the design plan of the HOUSE module 28 to output a description of the walls to the HOUSE-A drawing.

Figure 34:
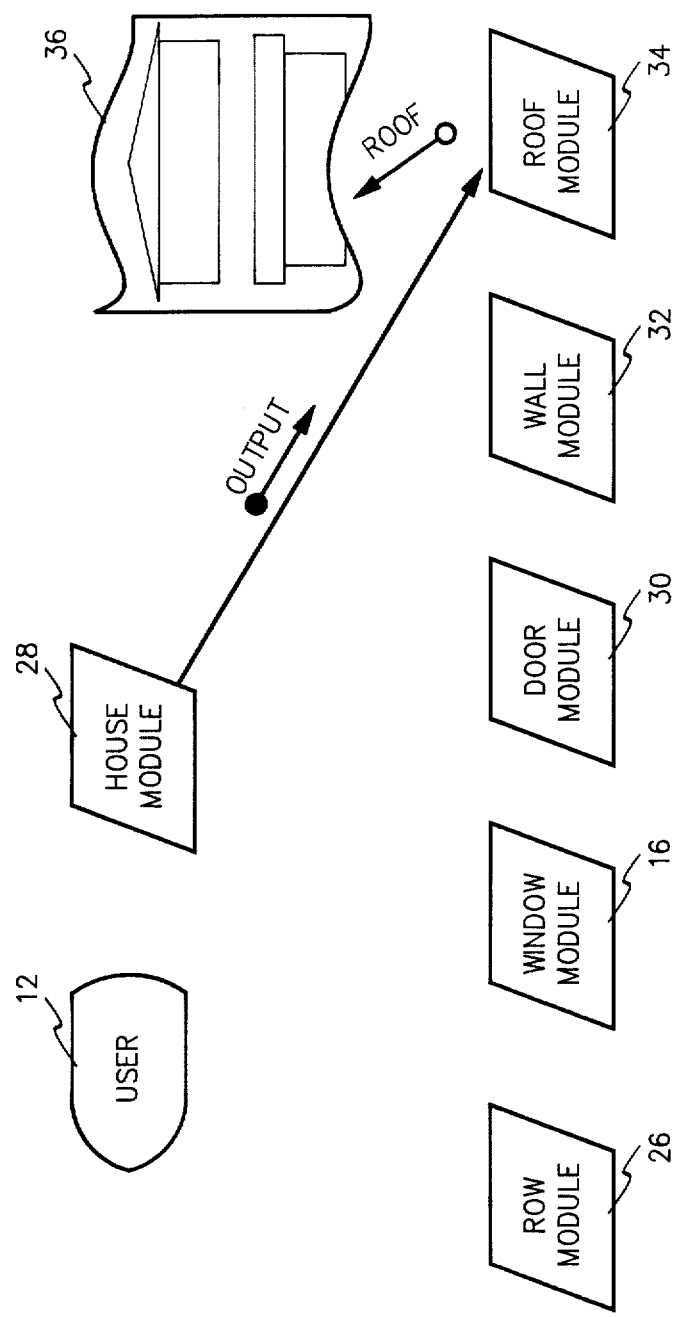
FIG. 34 depicts a step in the design process in which the HOUSE design module compels the ROOF design module to output a ROOF to the composite image.

Similarly, the design plan of the HOUSE module 28 is shown as compelling the design plan of the ROOF module 34 to output the roof description to the HOUSE-A drawing as seen in FIG. 34.

Figure 35:
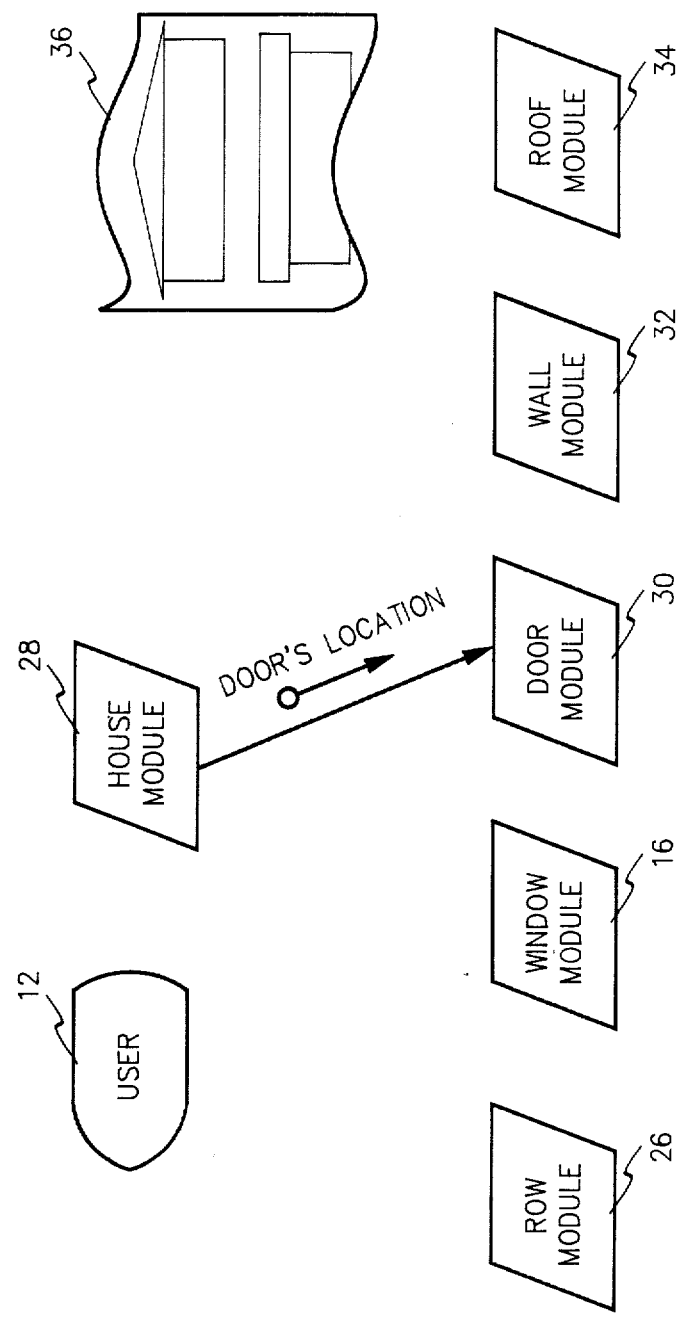
FIG. 35 depicts a step in the design process in which the HOUSE design module exports a door's coordinates to the DOOR design module.

In FIG. 35, the HOUSE module 28 is shown as calculating the locations of the doors and exporting those locations to the DOOR module 30.

Figure 36:
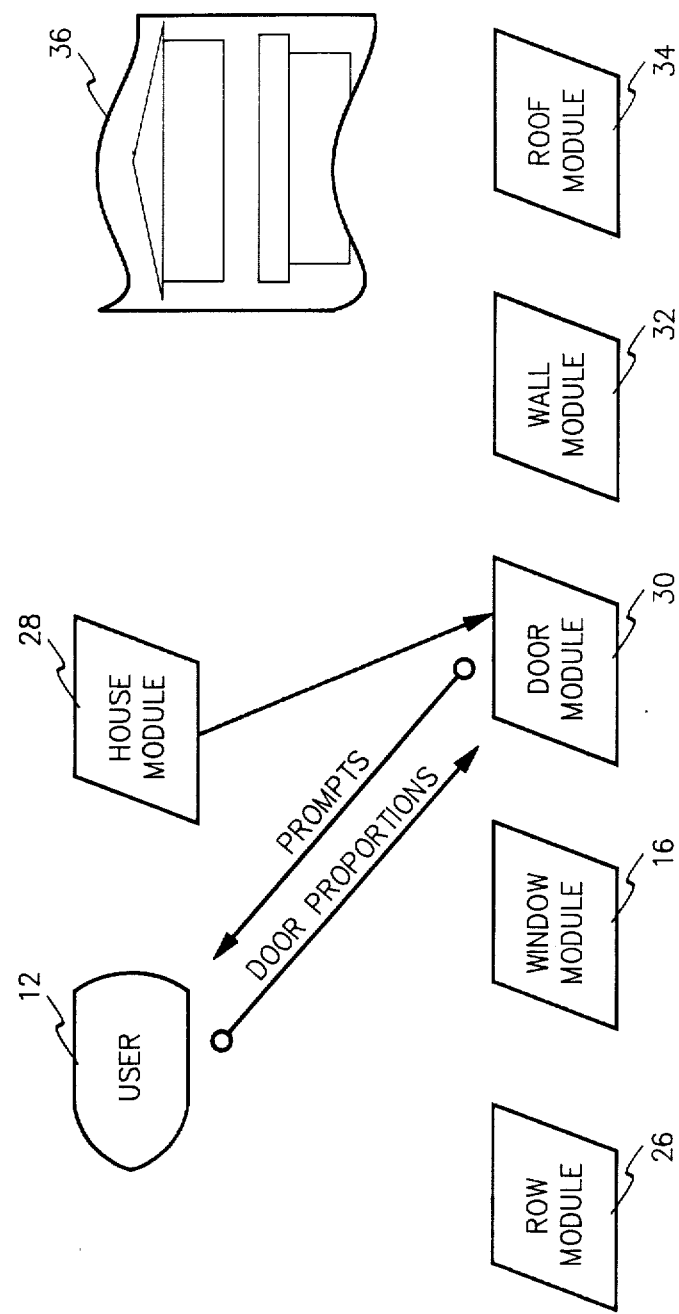
FIG. 36 depicts a step in the design process in which the HOUSE design module executes the DOOR design module which then interacts with the user for needed parametric and other information.

The next step, shown in FIG. 36, is that the HOUSE module 28 passes control to the DOOR module 30 which prompts the user 12 for the width and height of the door, which is then calculated by the HOUSE module 28 and passed to the DOOR module 30.

Figure 37:
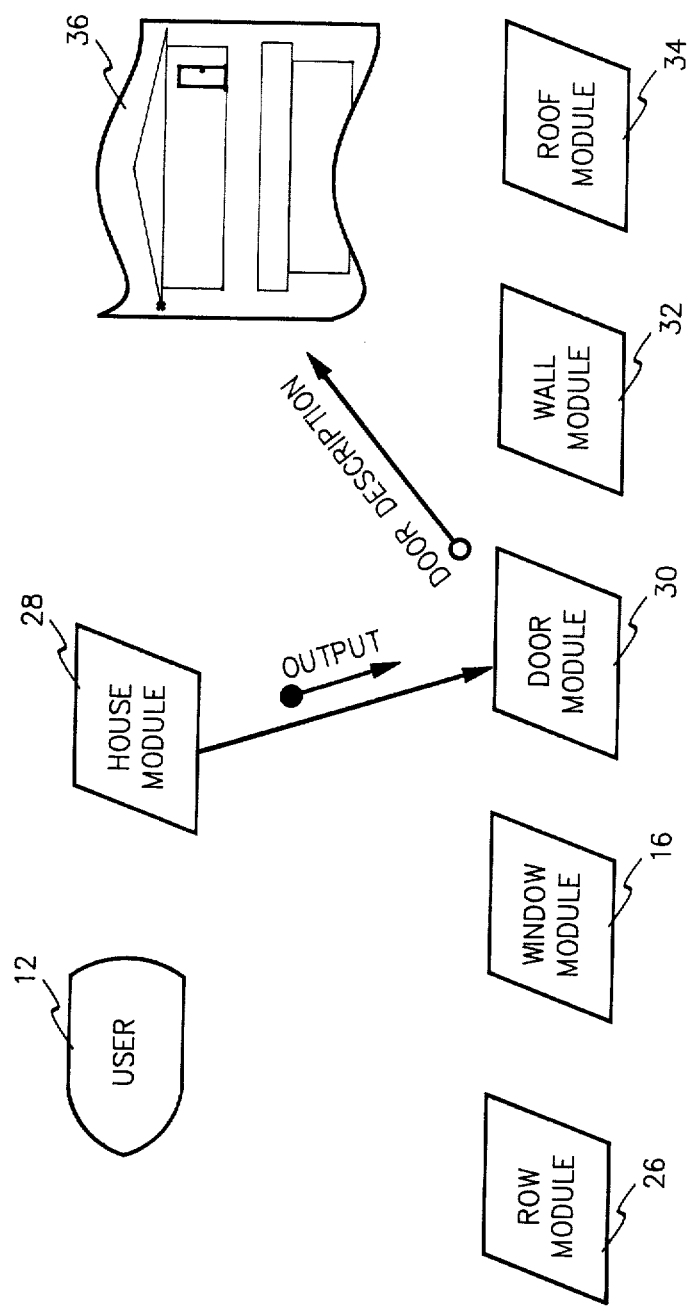
FIG. 37 depicts a step in which the HOUSE design module compels the DOOR design module to output a door to the composite image.

In FIG. 37 the DOOR module 30 is shown as being compelled by the HOUSE module 28 to pass the door description to HOUSE-A drawing.

Figure 38:
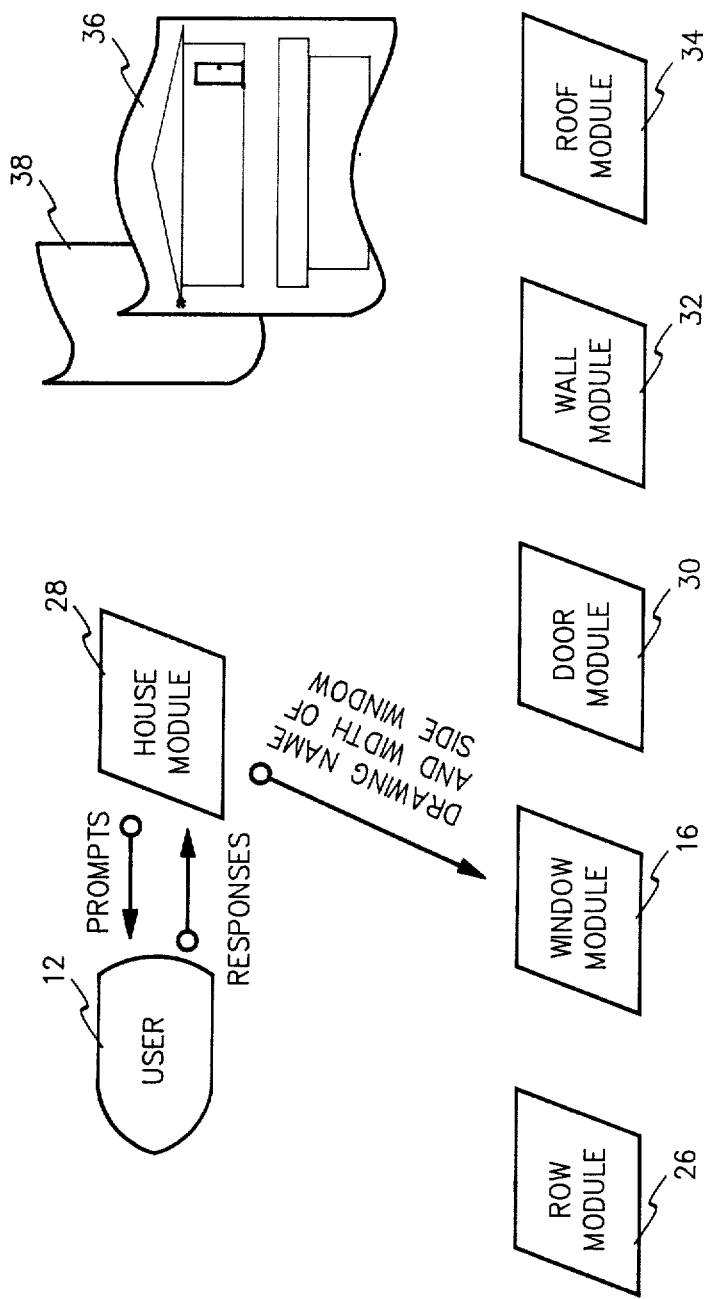
FIG. 38 depicts that part of the design process in which the HOUSE design module interacts with the user to determine the width of the front windows and the name of the detail drawing containing their representation and exports this information to the WINDOW design module.
Figure 39:
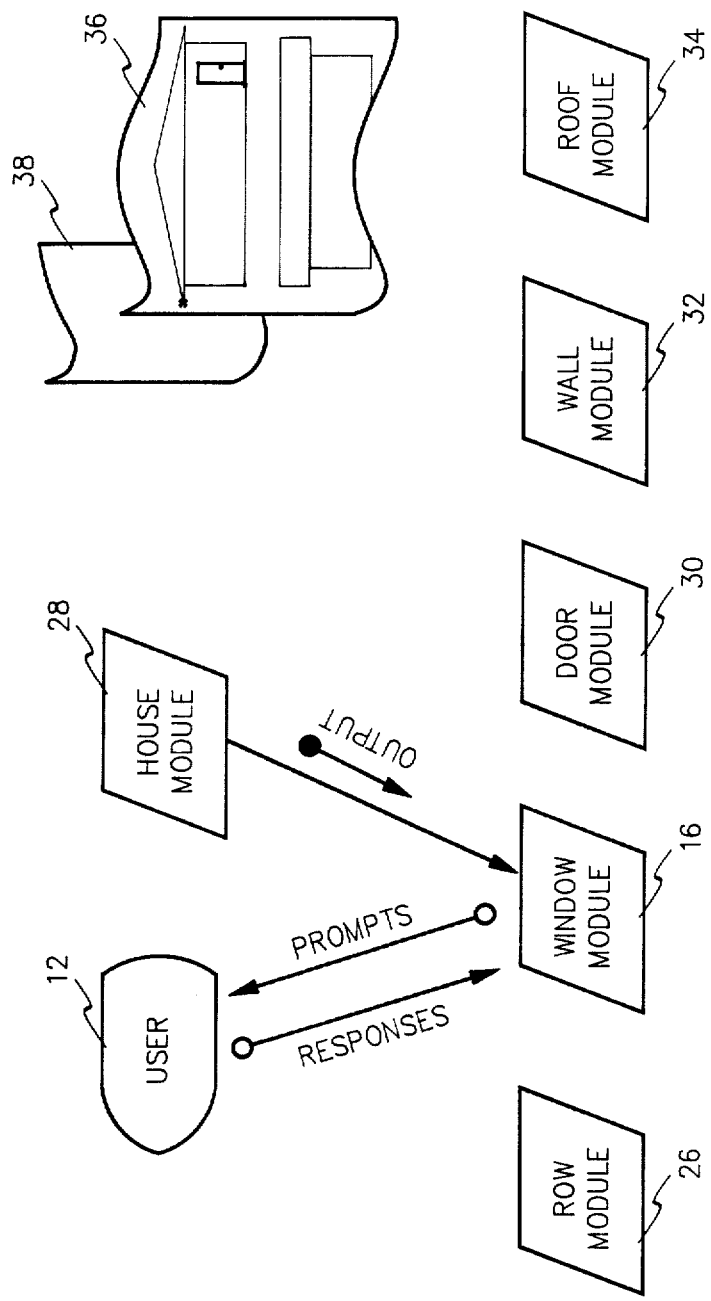
FIG. 39 depicts the step in the design process in which the HOUSE design module compels the WINDOW design module to execute its encoded algorithm; in so doing, the WINDOW design module interacts with the user in order to obtain needed information not previously exported to it by the HOUSE design module.

In FIG. 38, the user 12 is being prompted for the type and number of windows and the detail drawing name for a typical front window. The HOUSE module 28 then calculates the number of windows and exports their width and name to the WINDOW module 16.

The HOUSE module 28 passes control to the WINDOW module 16 (see FIG. 39) so it can calculate the unspecified window design values. The WINDOW module 16 prompts the user for the height and appearance of the window.

Figure 40:
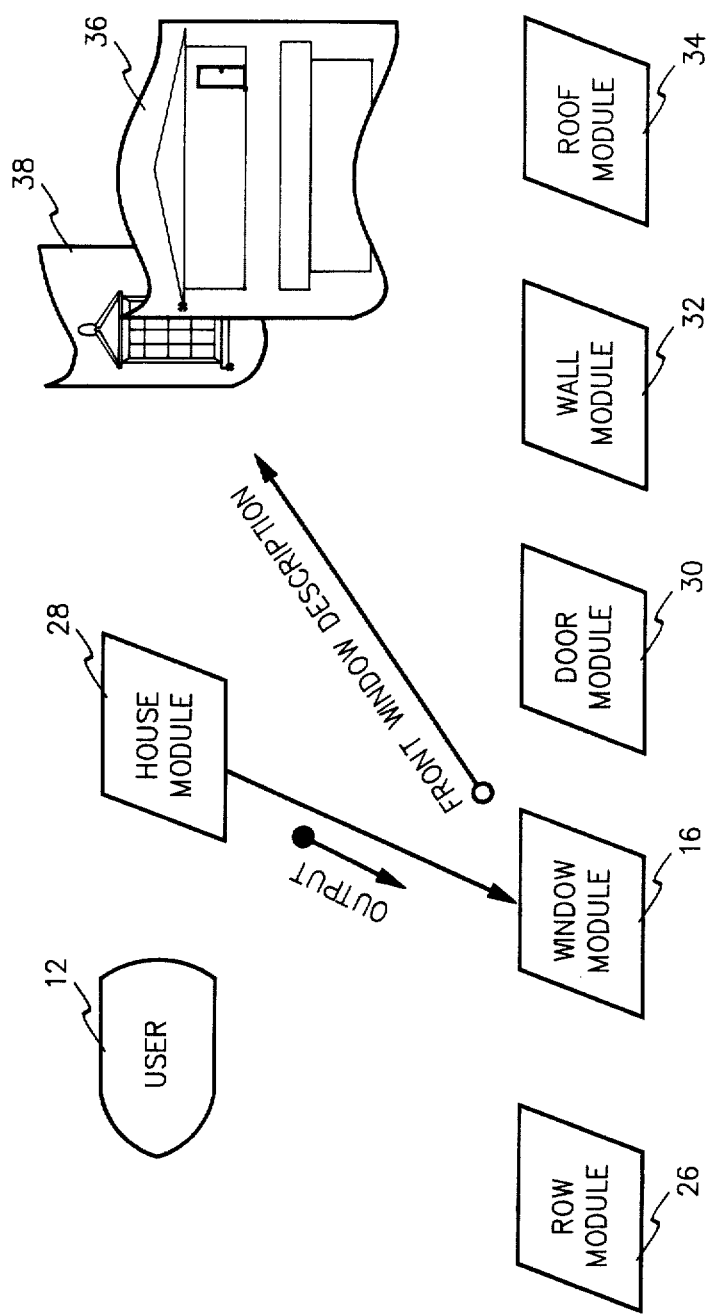
FIG. 40 depicts a step in the design process in which the HOUSE design module compels the WINDOW design module to output a drawing of the front window.
Figure 41:
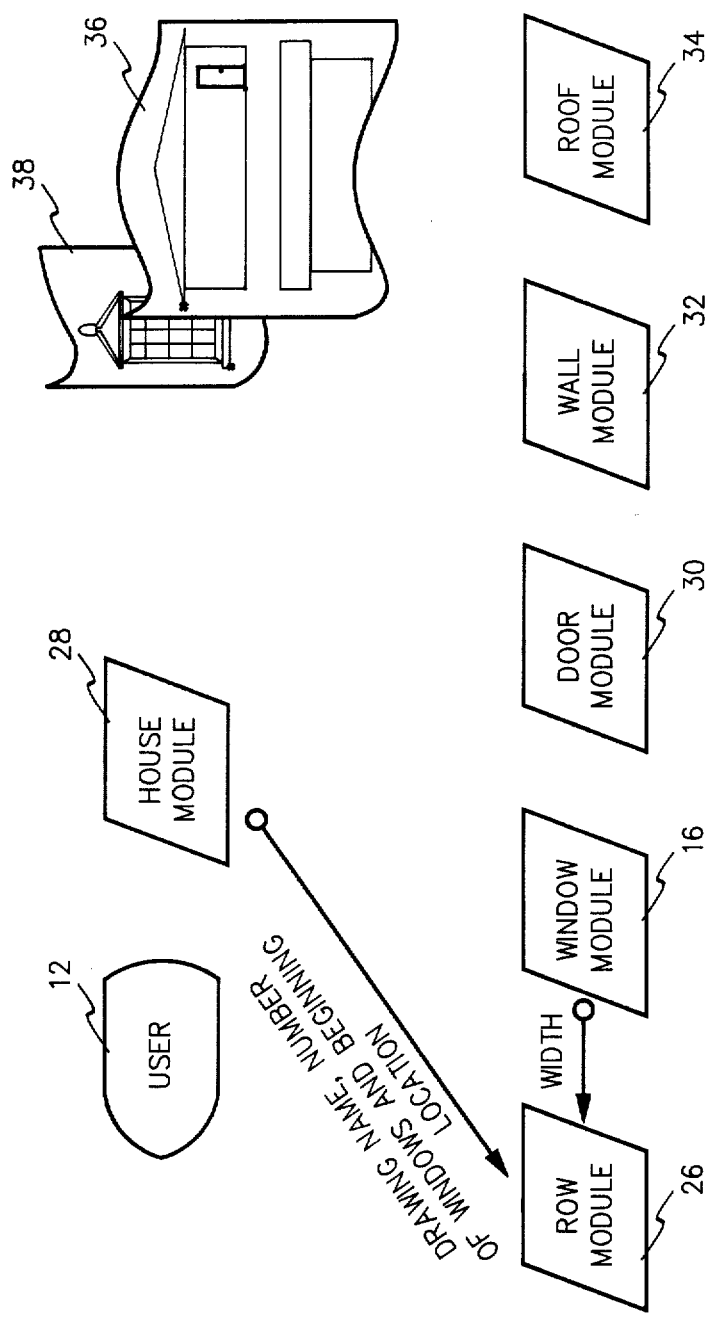
FIG. 41 depicts a step of the process in which the HOUSE design module exports to the ROWS design module the information needed to generate a row of windows such as beginning location, number of elements, and element width.

In FIG. 40 the HOUSE module 28 is shown as passing control to the WINDOW module 16 to output the typical front window description to the HOUSE-A drawing, which then adds a front view of the house to the HOUSE-A drawing.

Figure 42:
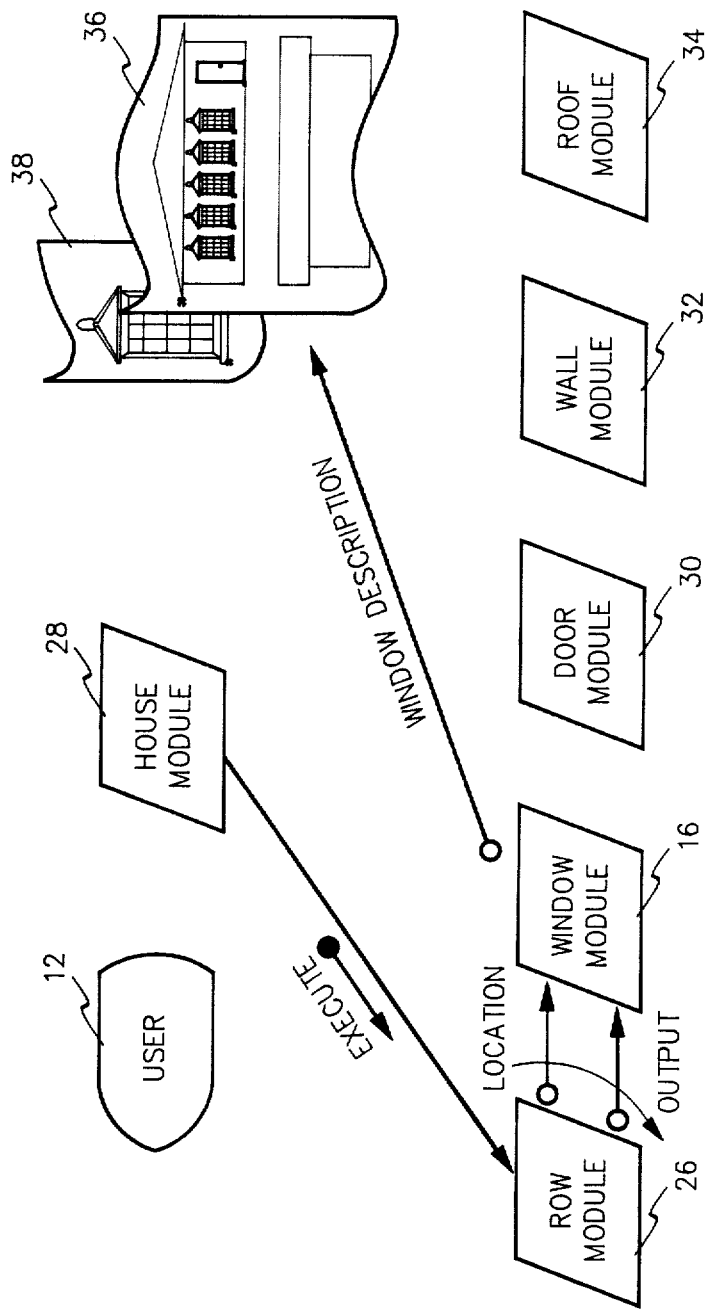
FIG. 42 depicts a step of the process in which the HOUSE design module compels the ROWS design module to repeatedly interact with the WINDOW design module, and, in so doing so, to export to it the window's coordinates and to then compel the WINDOW design module to output an image to the composite drawing.
Figure 43:
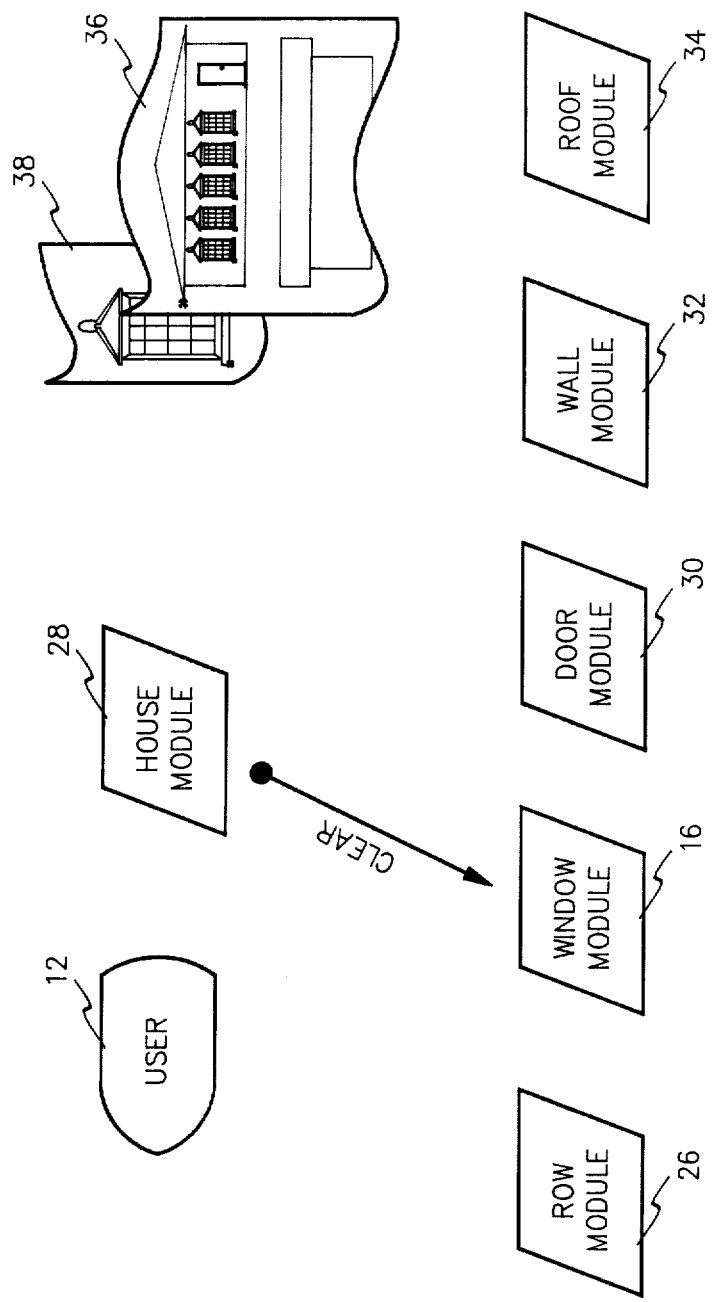
FIG. 43 depicts a step in the parametric design process in which the HOUSE design module clears the WINDOW design module, i.e. enables all of its formulas to recalculate, including the ones in cells which contain exported values.
Figure 44:
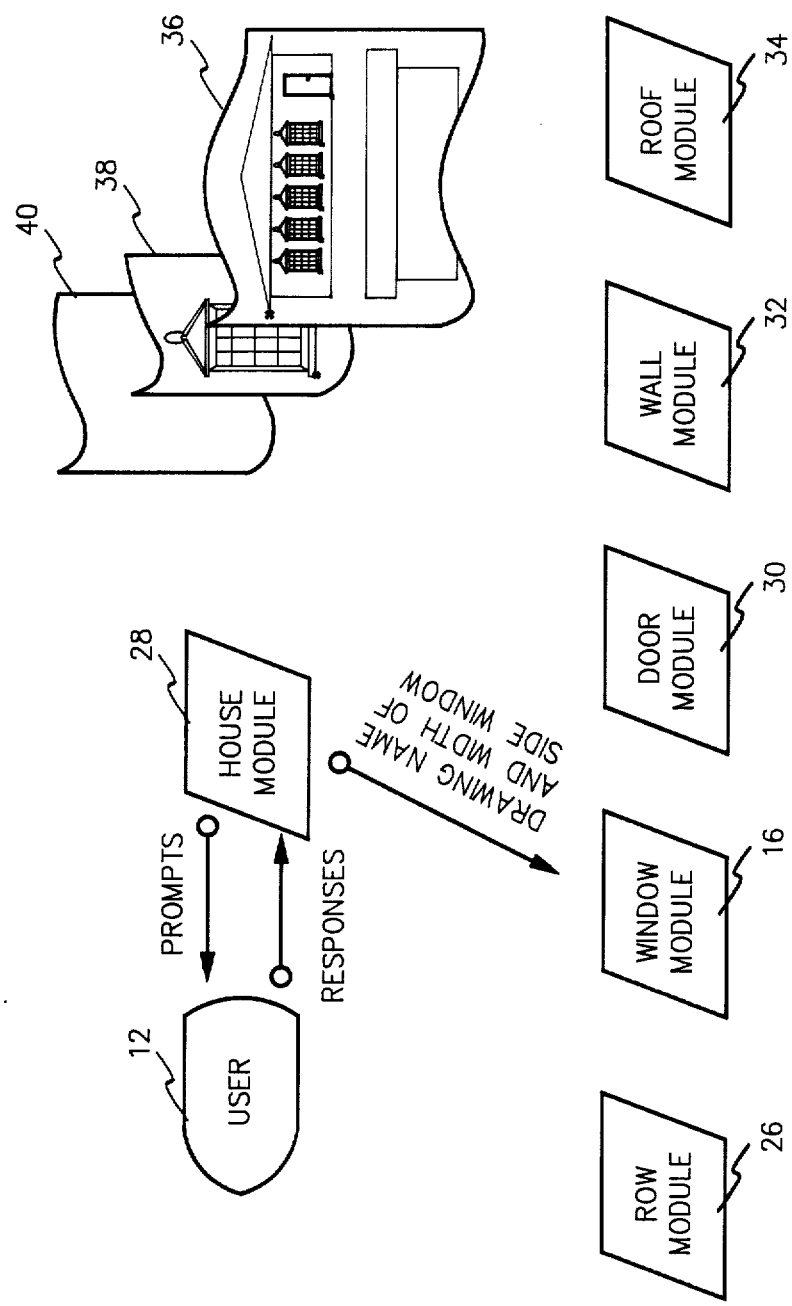
FIG. 44 depicts that part of the design process in which the HOUSE design module interacts with the user to determine the width of the side window and the name of the detail drawing containing the side window representation and exports this information to the WINDOW design module.

The HOUSE module 28 (see FIG. 41) now knows the number of front windows and their beginning location, so it passes that information to the ROWS module 26 which in turn calculates the placement of each window by interacting with the WINDOW module 16 and the HOUSE module 28 as seen in FIG. 42. The window placement is exported to the HOUSE-A drawing along with a command to output the window description.

Now that the window descriptions for the front windows of the house have been exported, the WINDOW module 16 (see FIG. 50) is cleared of all front window descriptions by the HOUSE module 28.

Figure 45:
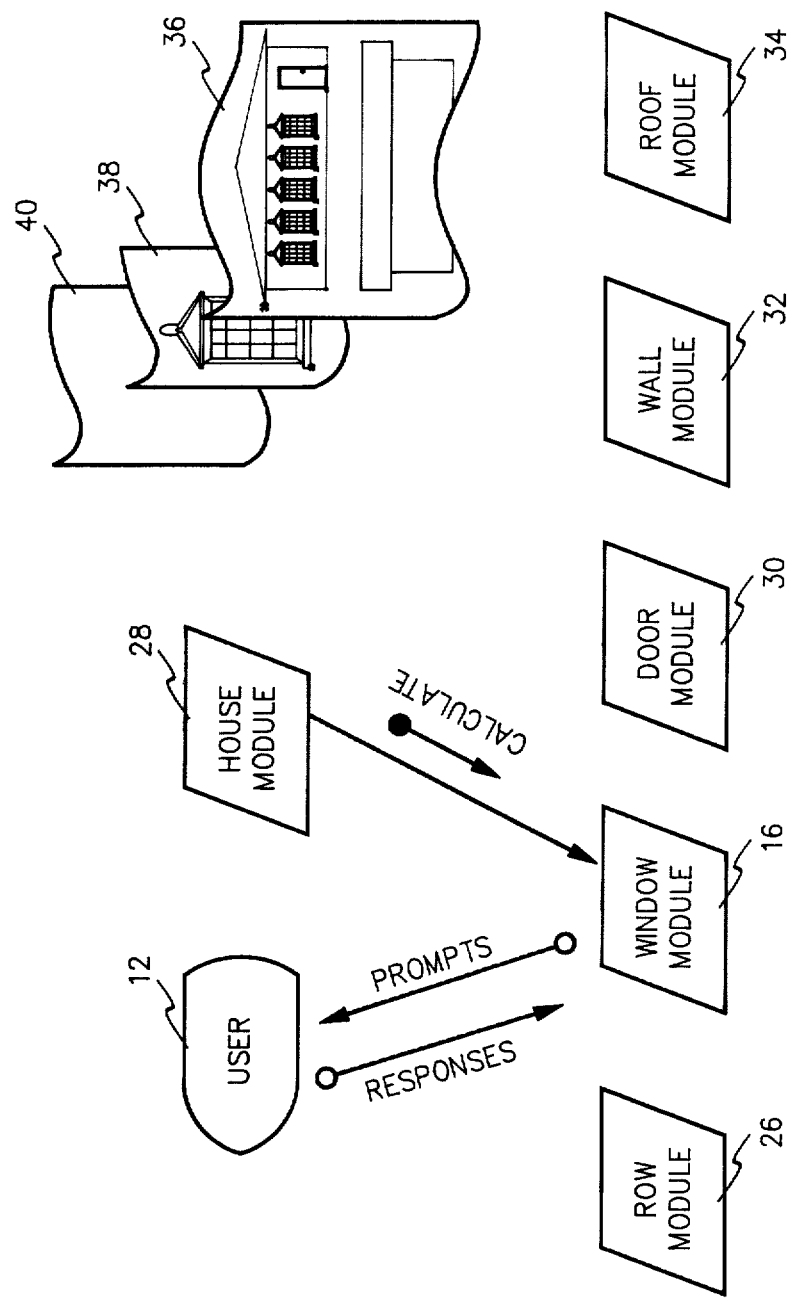
FIG. 45 depicts a step in the design process in which the HOUSE design module compels the WINDOW design module to execute its encoded algorithm; in so doing, the WINDOW design module interacts with the user in order to obtain needed information not previously exported to it by the HOUSE design module.
Figure 46:
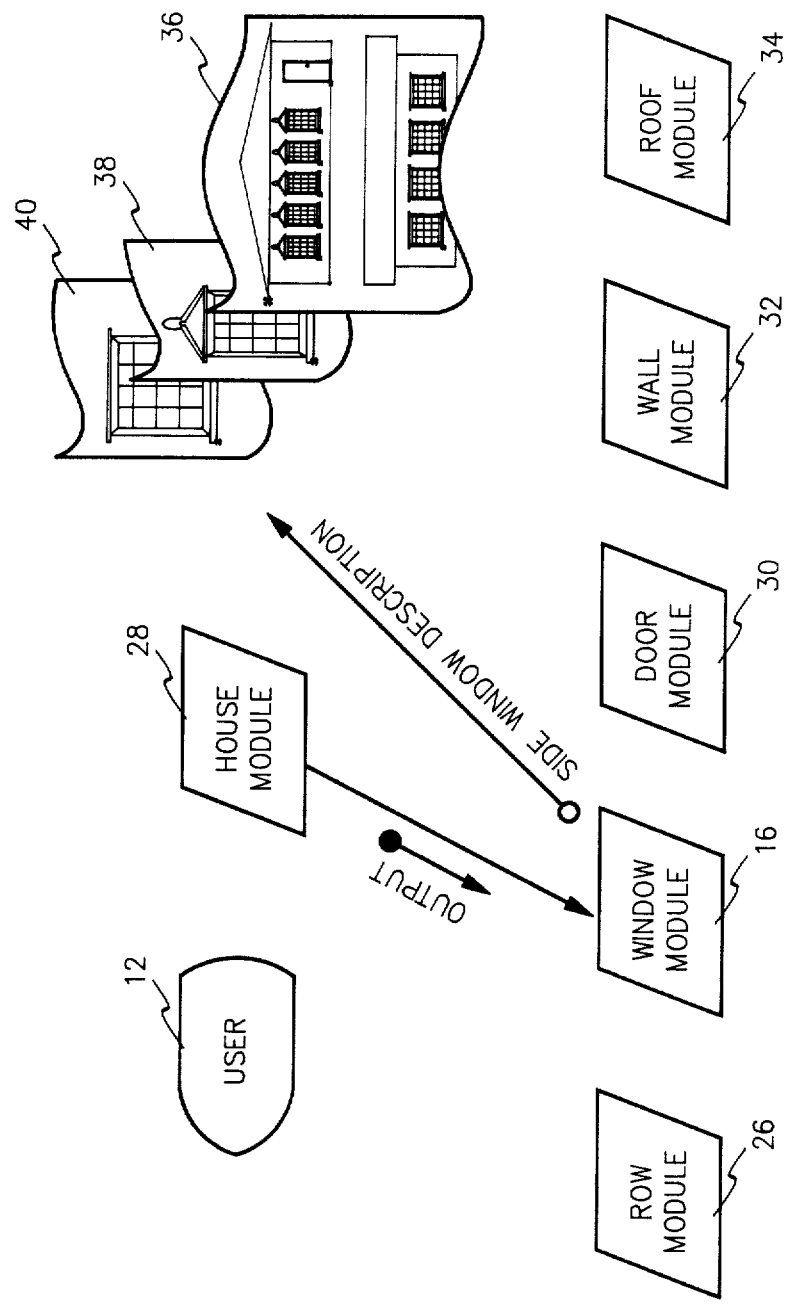
FIG. 46 depicts a step in the design process in which the HOUSE design module compels the WINDOW design module to output a drawing of the side window.

Now the HOUSE module 28 prompts the user for information regarding the side windows of the house (see FIG. 45). The width and name of a typical side window are then exported to the WINDOW module 16.

In FIG. 45, the HOUSE module 28 is shown as passing control to the WINDOW module to calculate the unprovided window design values and create a side drawing to be added to the HOUSE-A drawing. The WINDOW module 16 prompts the user for the height and appearance of each side window and then (see FIG. 46) exports the side window descriptions to the HOUSE-A drawing after it has been passed control by the HOUSE module 28.

Figure 47:
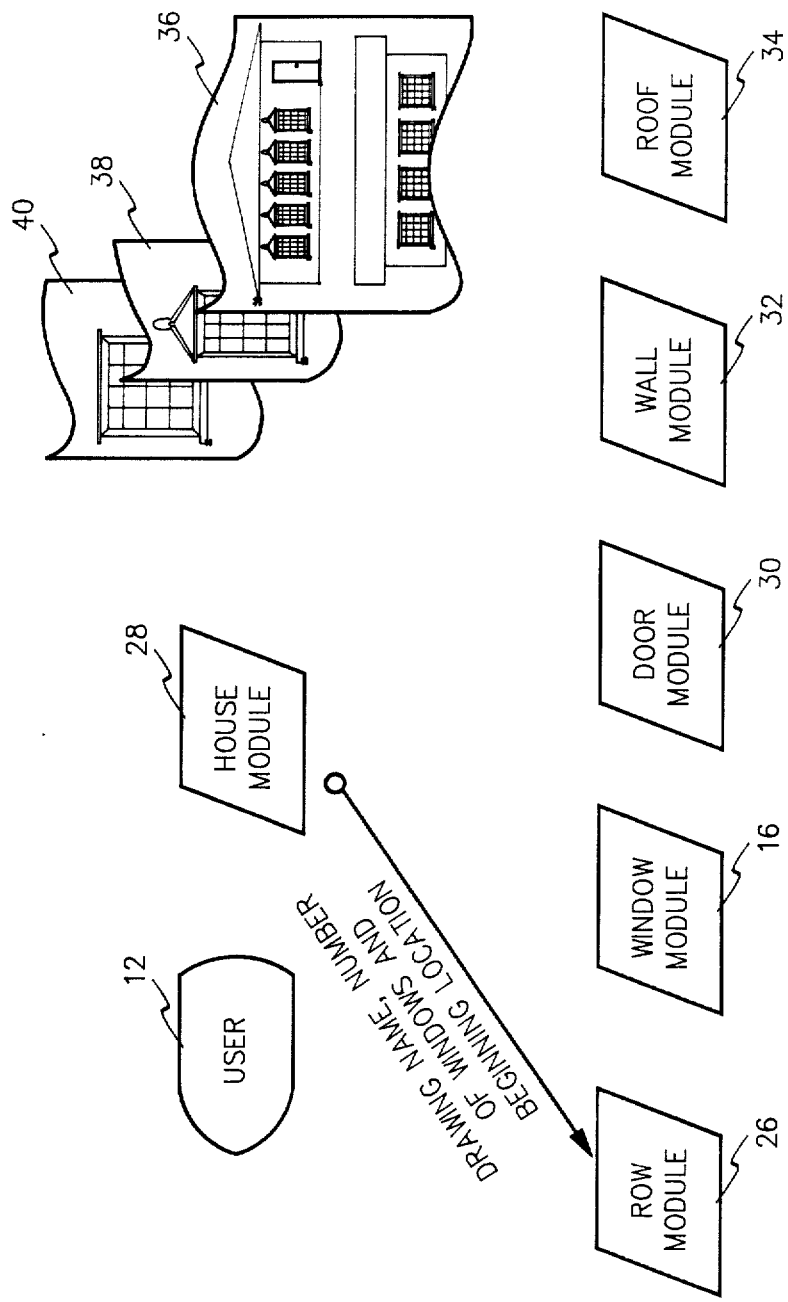
FIG. 47 depicts a step of the process in which the HOUSE design module exports to the ROWS design module the information needed to generate a row of windows such as beginning location, number of elements, and element width.

In FIG. 47, the HOUSE module 28 is shown as passing the number of side windows and their beginning locations to the ROWS module 26.

Figure 48:
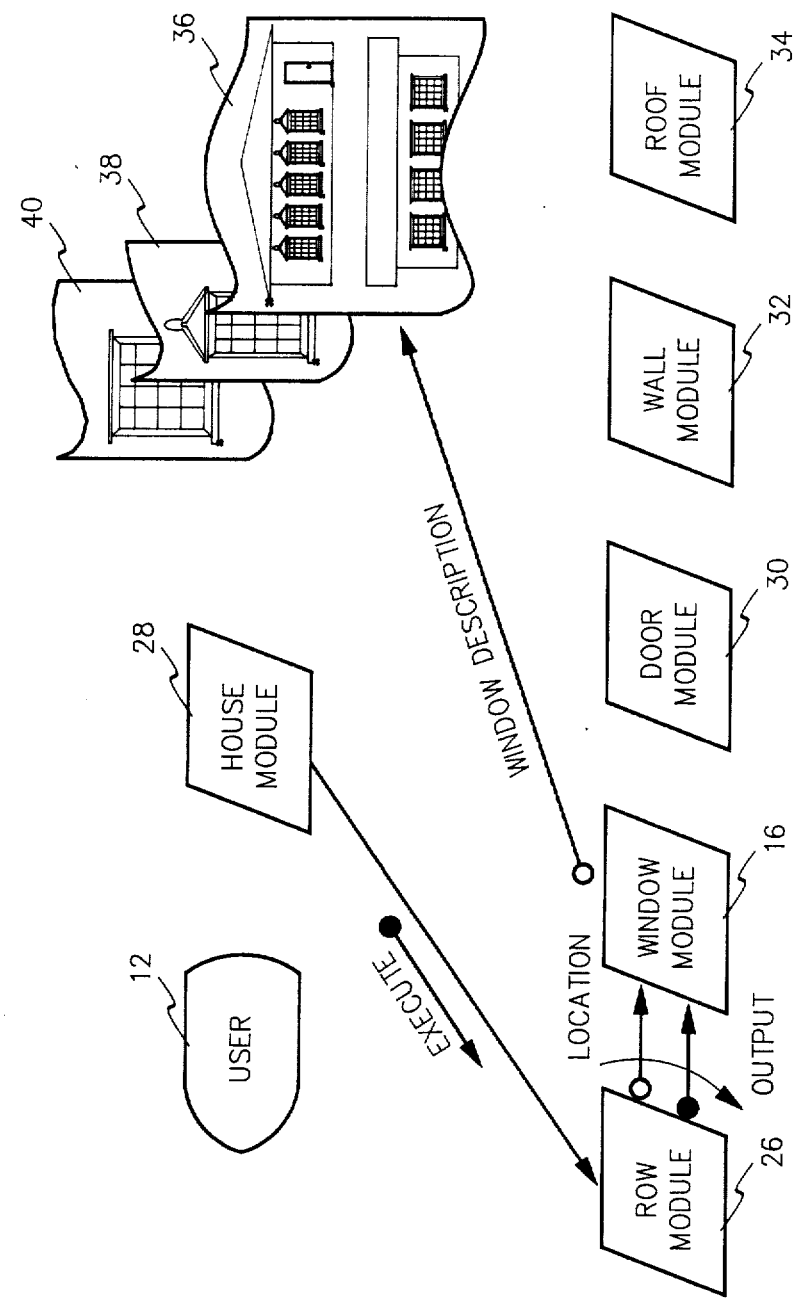
FIG. 48 depicts a step of the process in which the HOUSE design module compels the ROWS design module to repeatedly interact with the WINDOW design module, and in so doing to export to it the window's coordinates and to then compel the WINDOW design module to output an image to the composite drawing.

In FIG. 48, the ROWS module 26 and the WINDOW module 16 are shown as interacting to calculate the placement of each window. This is repeated as many times as necessary, once for each window. Then the WINDOW module 16 exports the placement of the windows to the HOUSE-A drawing, along with the command to output a window description.

In the same manner, other modules can interact with each other and with the user to create portions or all of the drawing.

FIG. 49 is a simple illustration of how a TEMPLE module 42 could replace a HOUSE module 28 and a COLUMN DESIGN module 44 might replace a WINDOW module 16. Once again this demonstration is not intended to be interpreted in a limiting sense.

Summary of the Parametric Design Process

The processes of the invention involves many steps. Those relating to FIG. 50 have already been described above.

Figure 51:
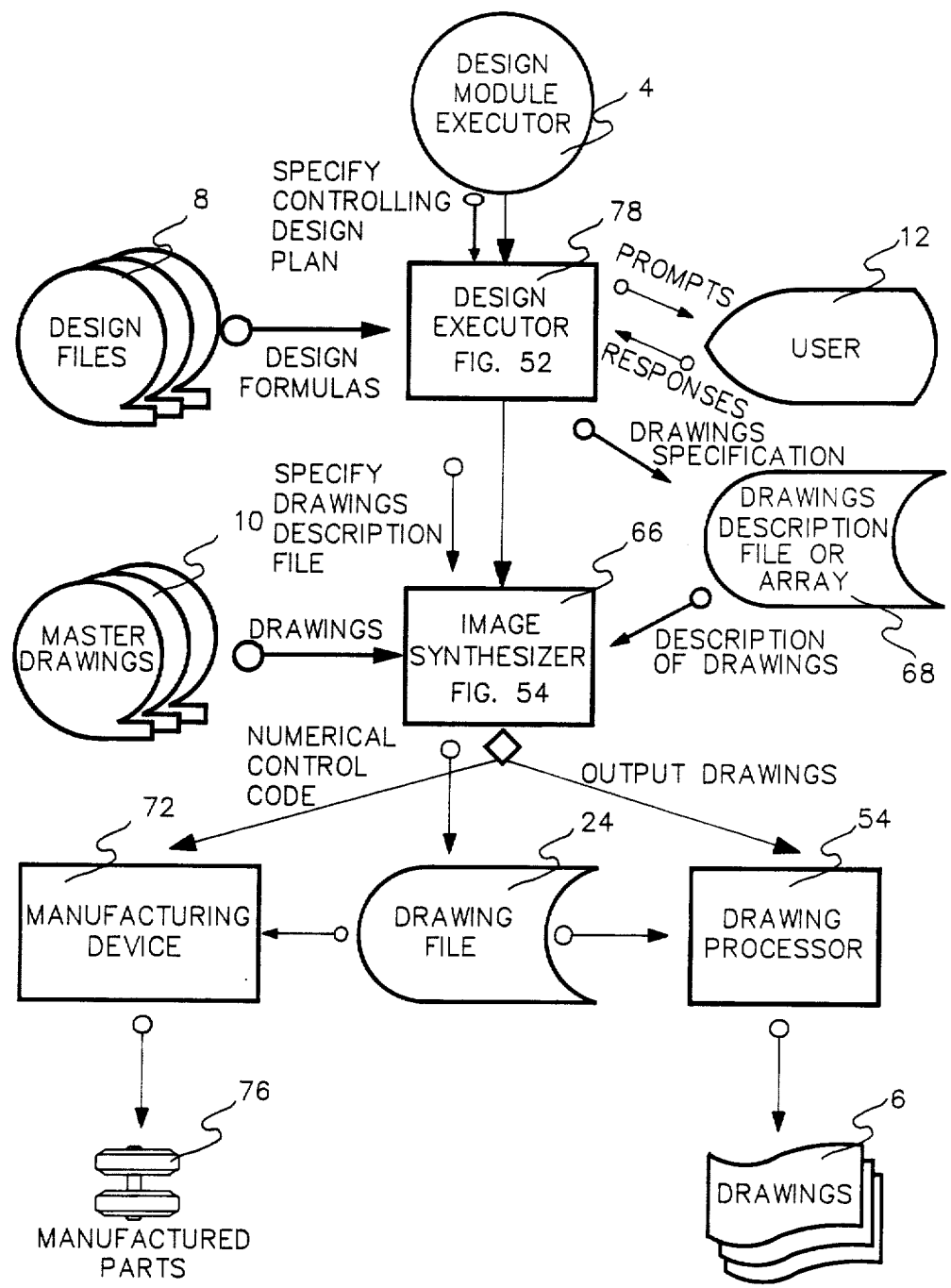
FIG. 51 is a block diagram showing the operations involved in executing a parametric design and synthesizing the image created by executing that design.

Referring next to FIG. 51, to execute a parametric design module 60, the controlling design plan is specified. The appropriate design plans from the design plan files 8 are loaded, and the user 12 is presented with screens of design information and prompts. Based on user response and information computed and gathered, the parametric design module executor 60 specifies:

1. the name of the master drawing, name of output drawing 6, and the scale factor, point of insertion, and angle of rotation; and 2. drawing measurement values and text values to replace variables in the master drawings.

These drawing specifications are then combined with the data from the master drawings stored in the master drawings data file 10 and in the image synthesizer 66 (more fully explained below with reference to FIG. 54) to create an electronic representation of a synthesized drawing 70. Depending on the desire of the user, either a manufacturing device 72 produces a manufactured part 76; or drawings 6 are produced in the drawing processor 74 based on the image 70.

Figure 52:
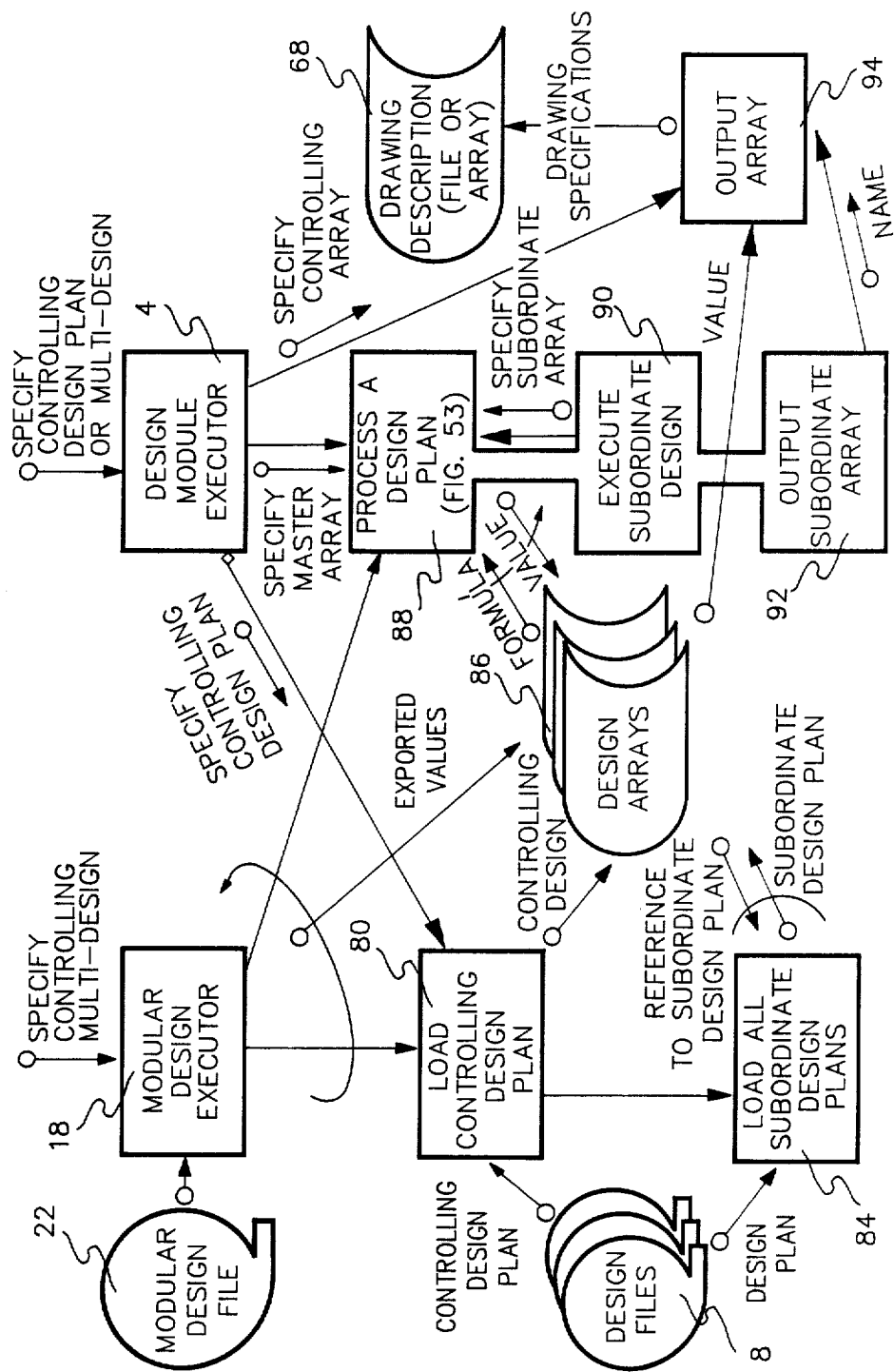
FIG. 52 is a block diagram showing the operations involved in executing a parametric design in greater detail than those operations are shown in FIG. 51; it shows the execution of a design plan.

Refer now to FIG. 52, which is a more detailed diagram of our novel process for executing a parametric design. The user 12 of the design program specifies the controlling design plan 8 necessary to execute a design plan 78. The controlling design plan is loaded as shown at 80 into the design plan array 86. The controlling design plan then calls design plans from the design plan files 8. The required design plan(s) then become the controlling design plan's subordinate(s) and are loaded as indicated by reference character 84 into the design plan array 86. Each of these subordinates plans may have other plans subordinate to itself. These too are loaded until all related plans are in the array. Control is passed to the design plan processor 88 (more fully explained in FIG. 53) which specifies the master array. Formula data is passed from the design plan arrays 86 to design plan processor 88, and values are calculated and traded back from the design plan processor 88 to the design plan arrays 86. This can be repeated as often as necessary. If a formula requires the execution of a subordinate design plan and specifies a subordinate array, it calls design plan processor 88 and returns control to itself. This process is called recursion.

In normal computer operations, a computer calls another function, which is called a subroutine, to perform a specific task. Recursion is a method by which a computer function calls itself, as in the present invention when a design plan operates on its own information. The design plan is located in memory twice and is blind to the fact this it calls itself. Recursion takes place in the present invention only while processing a design plan and evaluating a cell (more fully explained below with reference to FIG. 53).

The execution of a design plan 78 can also output a subordinate array which is loaded into the output array 94 and becomes data within the drawing specifications array 68. After the subordinate array and controlling array have been specified, the output array 94 is passed to the drawings specifications array 68.

Figure 53:
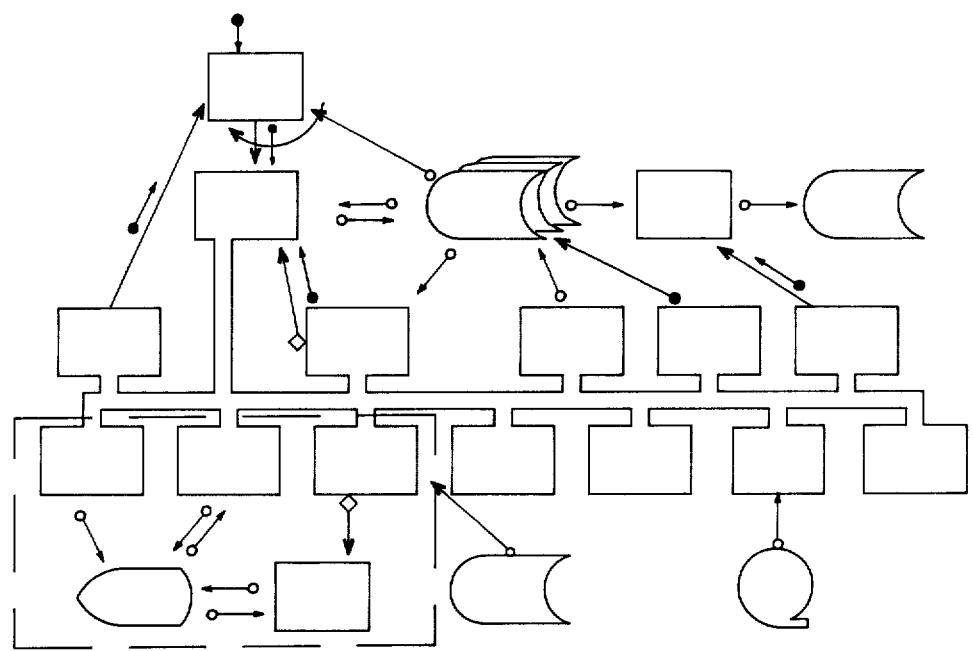
FIG. 53 is a block diagram which shows the configuration of capabilities possessed by our novel process and employed in processing a design plan.

FIG. 53 illustrates the evaluation of a design plan cell while executing a parametric design 60 and the evaluations of a cell during editing as will be further described in FIGS. 57-60. It is an expansion of the process described in FIG. 52. It is subdivided into the twelve most important types of capabilities required in formula execution which are identified by reference characters 98, 100, 102, 104, 106, 108, 110, 112, 114, 116, 118, and 120 and discussed below.

Three of these capabilities require user involvement and are set off in the dashed area 121. The invention also has the capability of providing customized screens of procedural information 108 to the user 12, who is then prompted for appropriate information 110 regarding the variables of the drawing. Through prompts and responses, a specific user's design program—for example a commercial bicycle design program without drawings—can be given individual and new values.

SYNTHESIS TM has the capability of executing and reading the output from the user's design program 122. To do so the design program executor and/or output reader 112 execute the user's design program 122. The program generates a report file 124. Thereafter values are read from the report file 124 by the design program executor and/or output reader 112 and provided to other cells. Values from other cells can be read by the value obtainer 100 which also has the capability of executing the cell if the cell is unexecuted by passing control to the cell evaluator 96 recursively. The cell value obtainer 100 can also import values from subordinate arrays. External data files can be accessed as shown at 118 from a database or text file 126. Design variables can be combined with mathematical and textual manipulation 116. For example, the formula x+3*(Prompt[-Please input Number: ]) could be used to prompt the user for a specific number which in turn becomes part of a mathematical formula.

The design plan also has the capability of determining the order in which formulas in the design plan are executed using the order of operation determiner 120. Formulas which depend on values calculated in other formulas are executed subsequently as shown at 114. Some formulas, groups of formulas, or even whole design plans may execute conditionally or repetitively. Where this is the case, the invention has the capability of knowing whether, as well as when, to execute formulas. A particular design plan can have control passed to it repetitively by a parent design plan, each time outputting drawing specifications. The cell value exporter 102 can export values to subordinate arrays contained in the design array 86. As it does the cell value exporter 102 sets a flag which protects the cell from recalculation by subordinate array executor 98. The subordinate array unprotector 104 clears the flags set by the cell value exported 102. Thus, it frees all cells for recalculation by the subordinate array executor 98. The subordinate array outputter 106 outputs subordinate arrays through the use of the array outputter 94. The array outputter 94 loads the values into the design array 86 and outputs them into the drawing description file or array 68. Subordinate array executor 98 can calculate the values of all cells in the subordinate array by using the design plan processor 88 recursively. When doing so cells to which values were previously exported by the cell value exporter 102 are protected from such recalculation.

Figure 54:
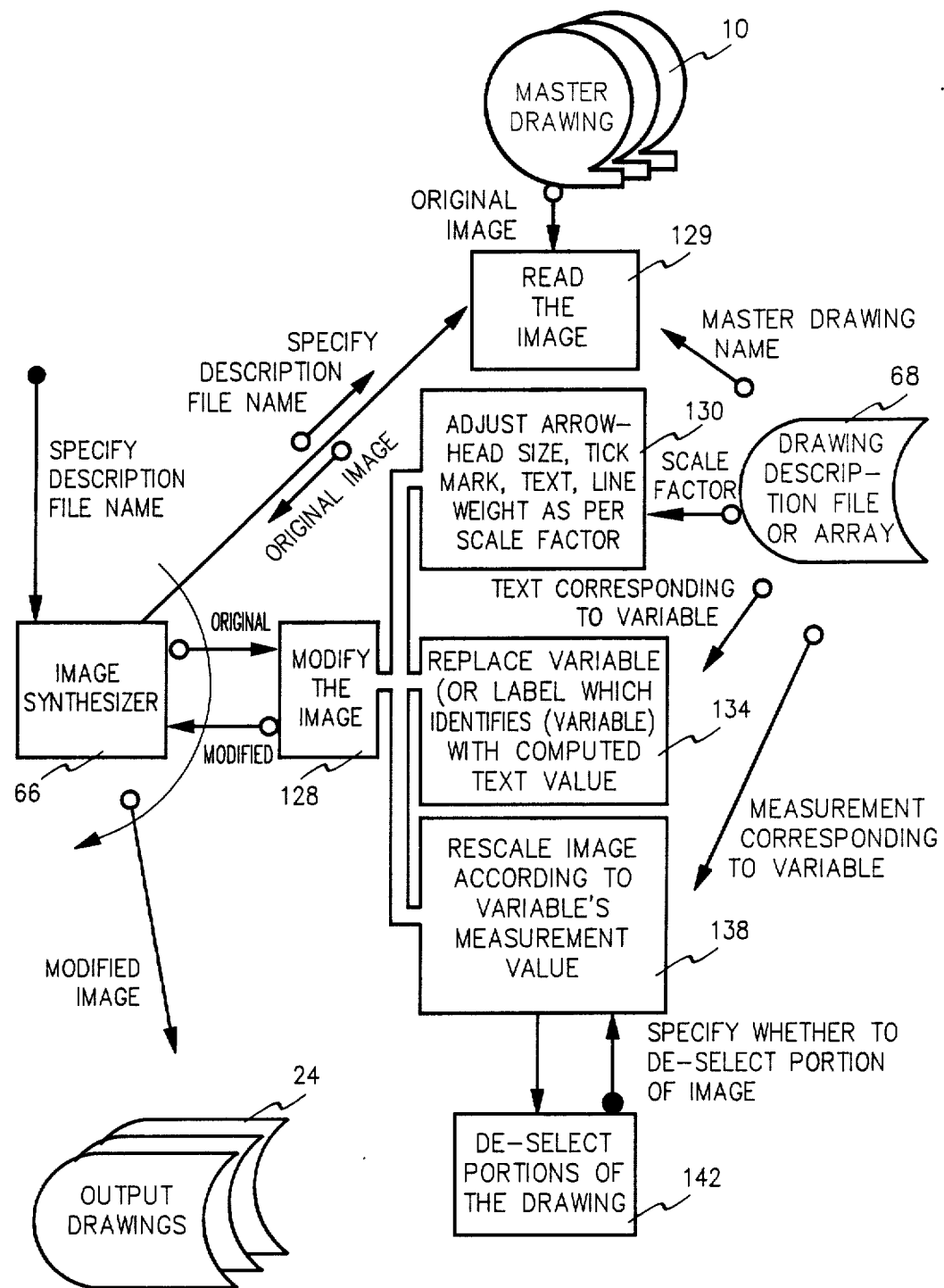
FIG. 54 is a block diagram showing the operations involved in synthesizing an image involving design specifications and a master drawing.

Refer now to FIG. 54 which depicts the process of reading a master drawing 10 to produce a new output drawing 24 within the image synthesizer 66. The name of the description file 68 is specified to the image synthesizer 66 which employs the image reader 129 to read the relevant master drawing from a master drawing file 10. In order to do so the image reader 129 obtains the master drawing file's name from the drawing description file 68. Next the image synthesizer 66 feeds the original image to the image modifier 128. The image modifier 128 returns a modified image to the image synthesizer 66. The image modifier 128 employs three capabilities in modifying the image: the scale factor adjustor 130 is used to adjust the image allowing for the scale factor; the label substituter 134 replaces the label in the master drawing with its associated text as described in the drawing description file; and the rescaler 138 adjusts the image in accordance with the measurement value corresponding to the label as described in drawing description file 68. During the rescaling, if the drawing has a variable whose measurement value is zero, that portion of the drawing is deselected as shown by reference character 142.

Thus, either a single drawing can be synthesized or multiple drawings formed, each containing multiple synthesized images. This depends on how many drawings are described in the drawing description file.

Editing a Design Plan

Figure 55:
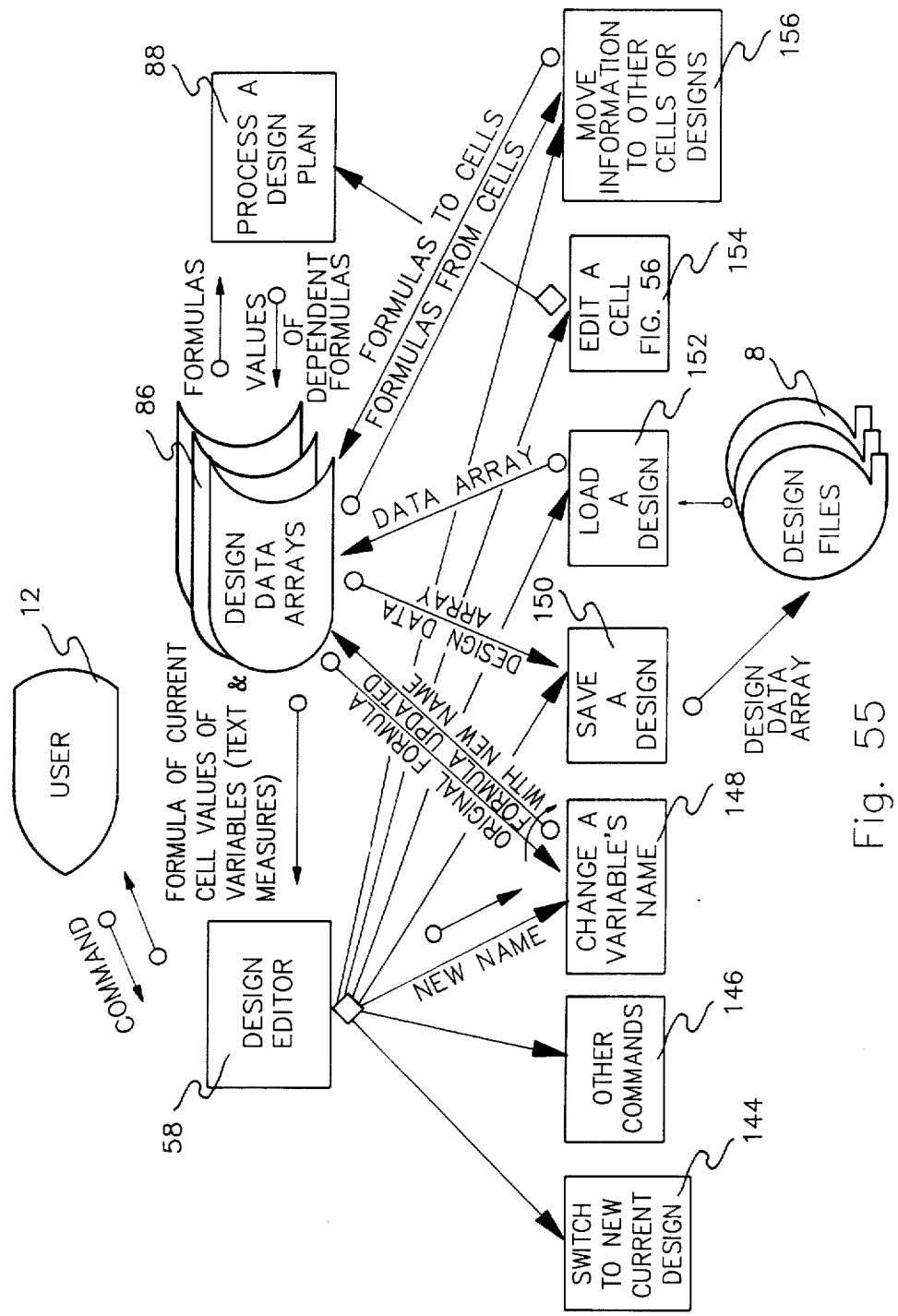
FIG. 55 is a block diagram showing the process of editing a design plan.

Refer now to FIG. 55 which illustrates the process of editing a design plan. The user 12 inputs a command to the design editor 58. This command is executed; and the screen is updated interactively. The user 12 has options including: to switch to a new current design plan 144; to move another cell 146; to change a variable's name 148; to save a design plan 150; to load a design plan 152; to edit a cell 154 which is explained more fully in FIG. 56; or to move information to other cells or design plans 156. Editing a cell results in updating a design plan, while both saving a design plan 150 and loading a design plan 152 would result in transmitting information to the design plan data array 86. Editing a cell 154 would result in processing a design plan 88.

Figure 56:
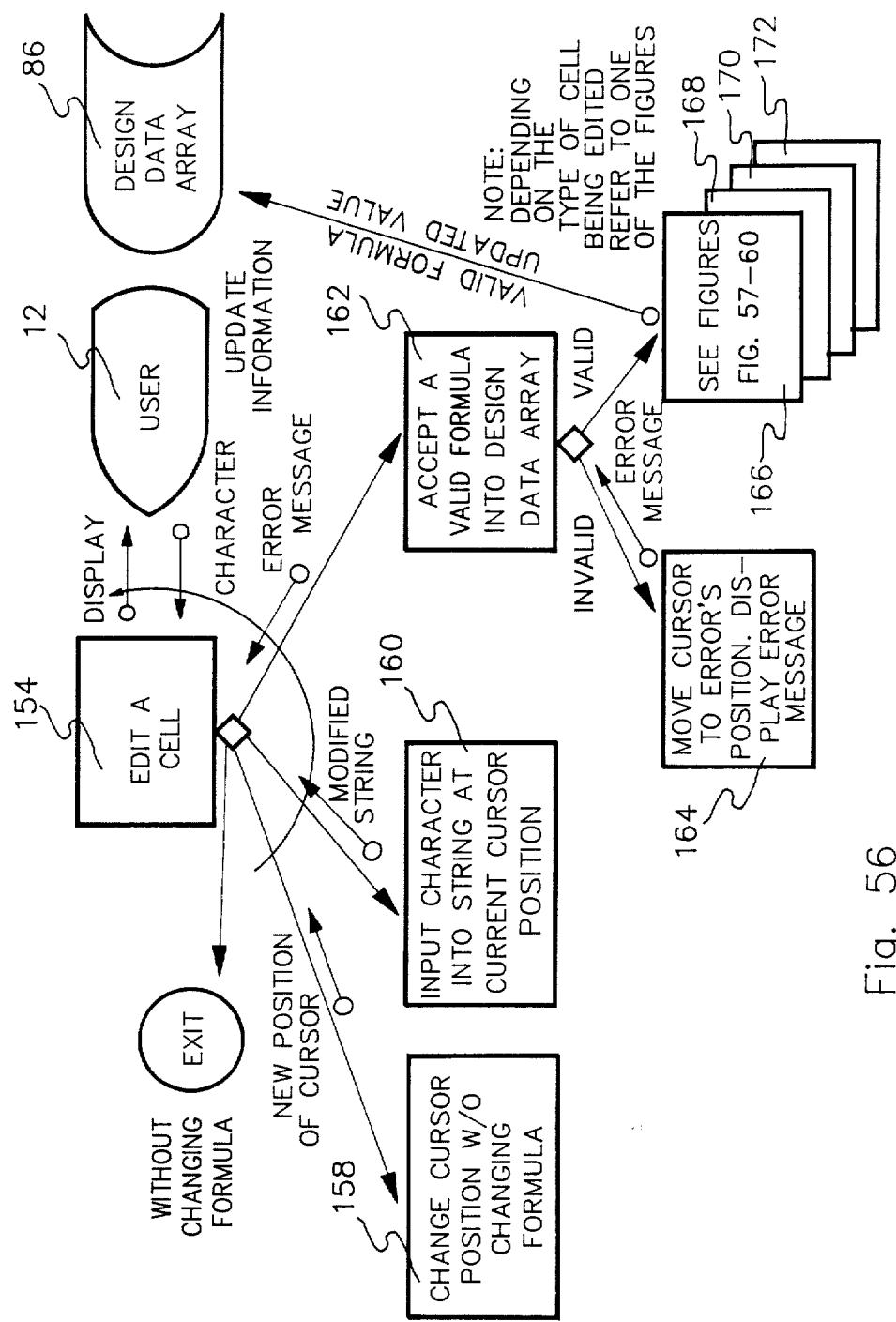
FIG. 56 is a block diagram detailing the process of editing a cell in a design plan.

Refer now to FIG. 56 for the procedure of editing a cell in a design plan. At this point, the user can make the following choices: change the cursor position without changing the formula 158; input a character into the formula string at the current cursor position 160; or accept a valid formula into design plan data array 62. If an invalid formula is inserted, an error message is displayed by the error message displayer 164 which moves the cursor to the error's position. When a valid formula is being entered, the updated information is added to the design plan data array 86. The procedure is more fully explained below with reference to FIGS. 57-60.

Figure 57:
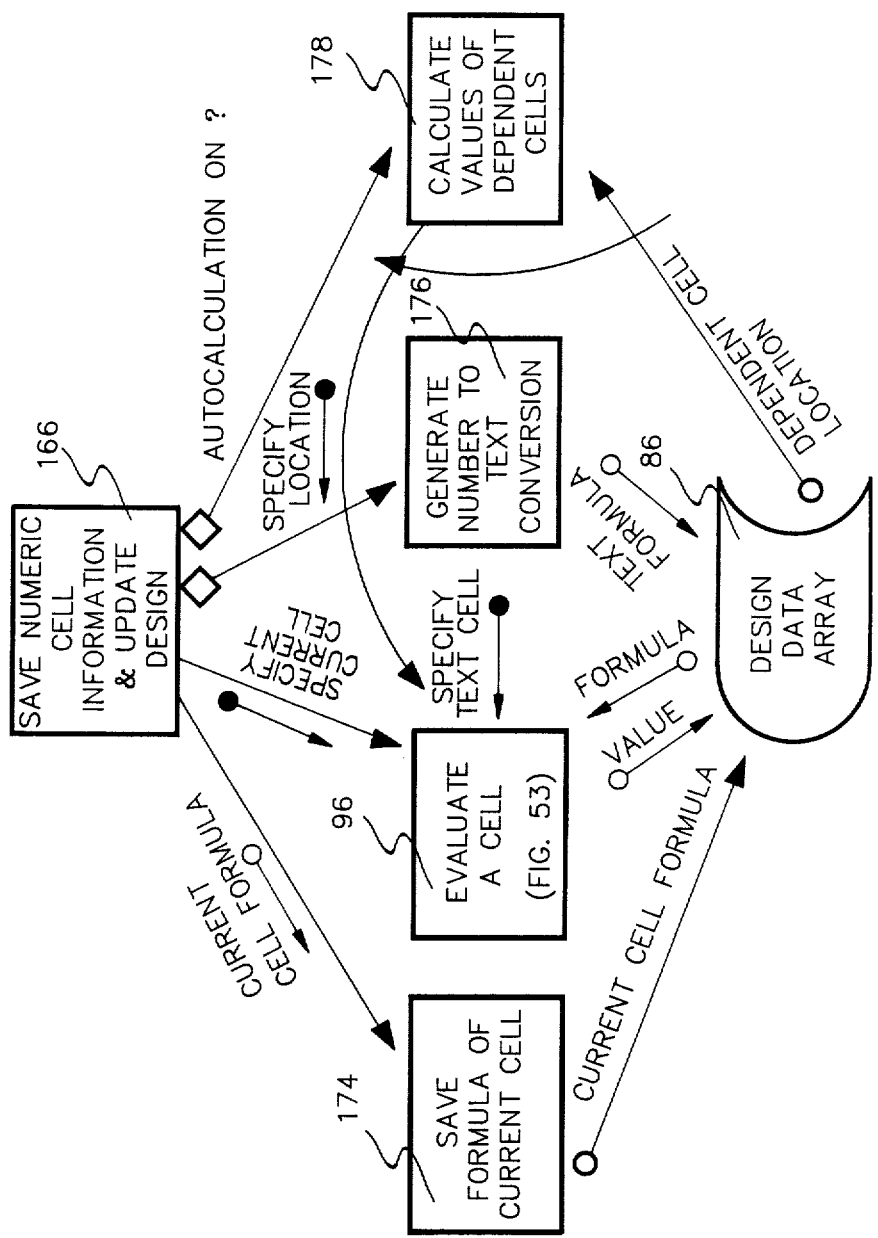
FIG. 57 is a block diagram detailing the editing of a number cell and is an expansion of the diagram in FIG. 56.

Refer now to FIG. 57 which depicts the routine employed in storing valid formula upon completing the editing of a parametric variable's number cell within the design plan. First, the numeric cell information updater 166 calls the current formula saver 174 to add the formula to the data array 86. Next the numeric cell updater 166 passes control to the cell evaluator 96 and in so doing specifies the current cell's location to the cell evaluator 96 which evaluates and the stores the value in the data array 86. If the text cell adjoining that measurement cell has no formula, as of yet, a number-to-text formula default is generated, by the number to text converter 176, and stored in the data array 86. (This cell can be re-edited by the user in a subsequent edit operation). Then, the cell evaluator 96 is used to load and evaluate the text formula; and the value is then added to the design plan data array 86. Next, the numeric cell updater 166 uses the dependent cell calculator 178 to update the dependent cells. This means that all other cells where formulas depend on the current cell are recalculated, and their new current value is displayed.

Figure 58:
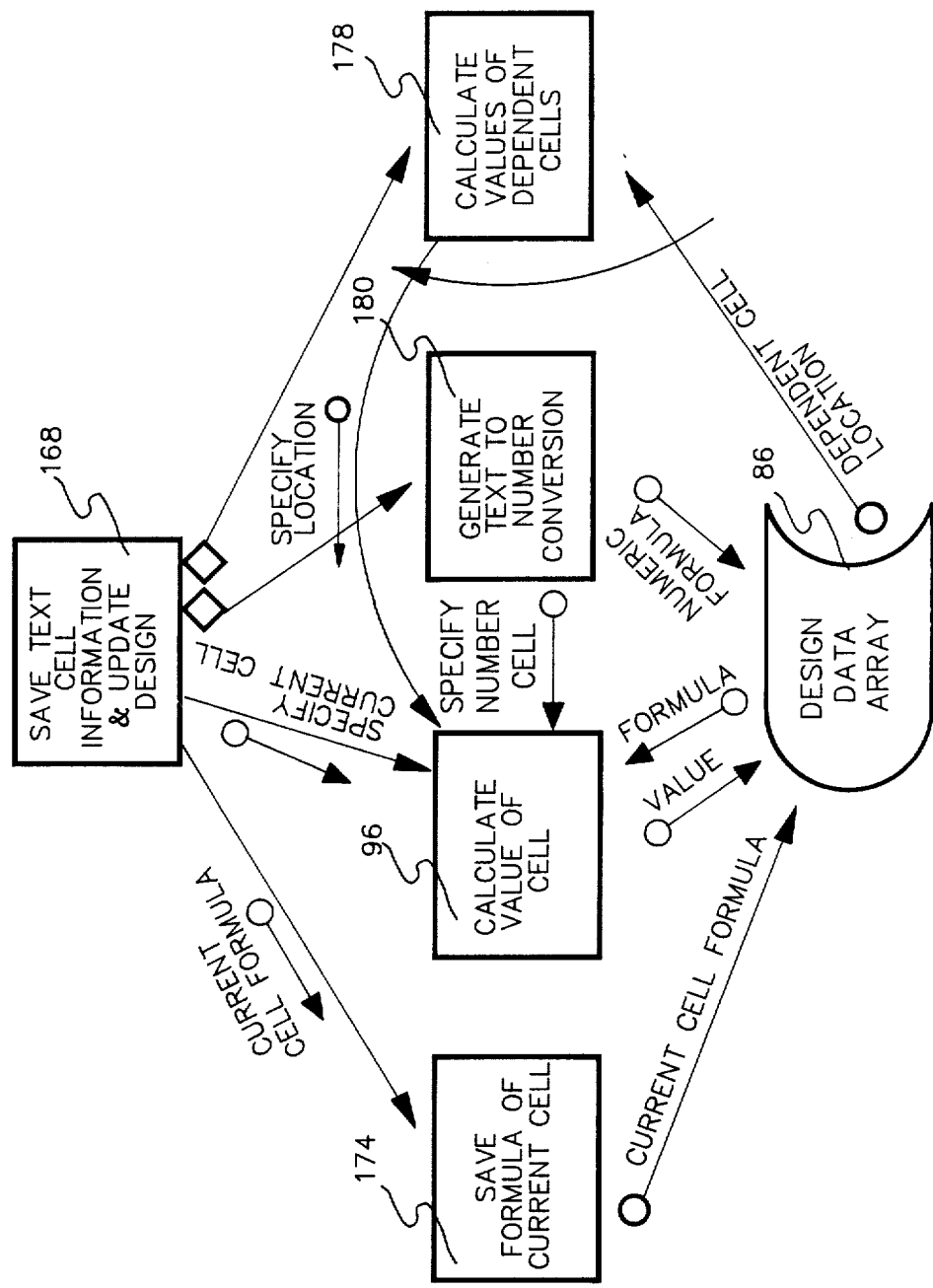
FIG. 58 is a block diagram detailing the editing of a text cell and is an expansion of the diagram in FIG. 56.

Refer now to FIG. 58 which depicts the routine employed in storing a valid formula upon completing the editing of a parametric variable's number cell within the design plan. First, the text cell information updater 168 calls the current formula saver 174 to add the formula to the data array 86. Next the text cell updater 168 calls the cell evaluator 96, specifying the current cell's location to the cell evaluator 96 which evaluates and then stores the value in the data array 86. If the text cell adjoining that measurement cell has no formula, as of yet, a number-to-text formula default is generated by the text to number converter 180 and stored in the data array 86. (This cell can be re-edited by the user in a subsequent edit operation). Then, the cell evaluator 96 is used to load and evaluate the text formula; and the value is then added to the design plan data array 86. Next, the text cell updater 168 uses the dependent cell calculator 178 to update the dependent cells. This means that all other cells where formulas depend on the current cell are recalculated and their new current value is displayed.

Figure 59:
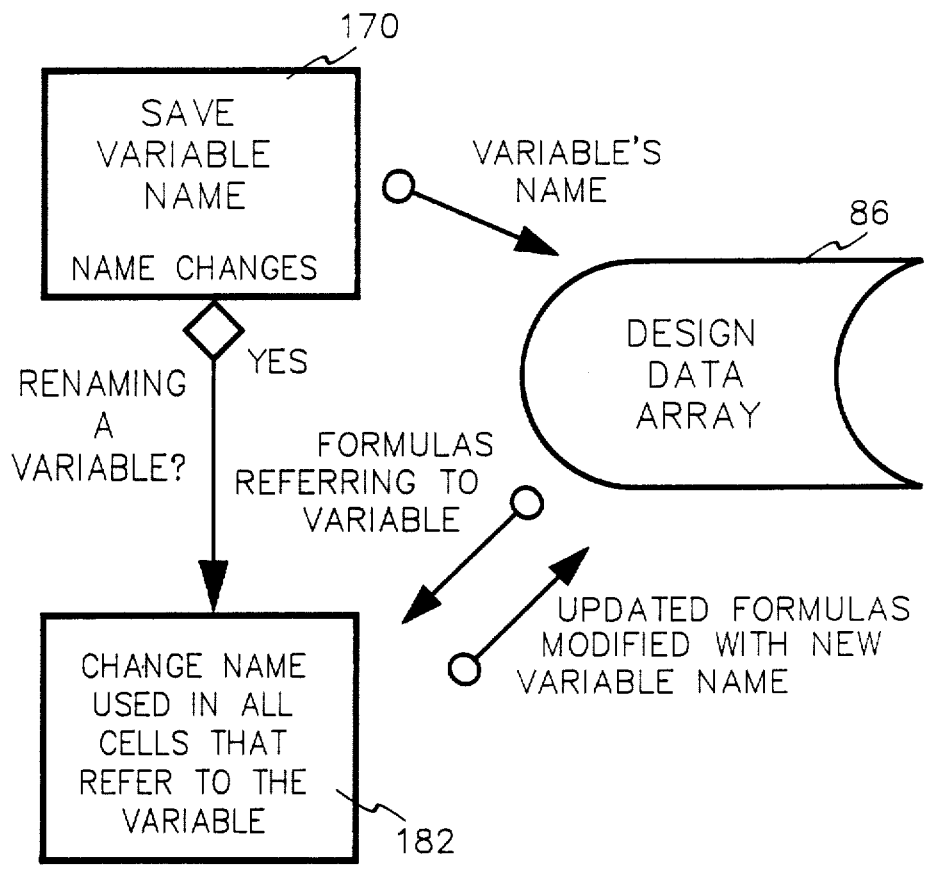
FIG. 59 is a block diagram detailing the editing of a name cell and is an expansion of the editing process illustrated in FIG. 56.

Refer now to FIG. 59 which illustrates the routine for editing a parametric variable's name cell. If a cell is being renamed, the variable name changer 128 loads all formulas referring to the variable from the data array 86 and updates them as new variable names. The variable name editor 170 saves the variable name in the design data array 86.

Figure 60:
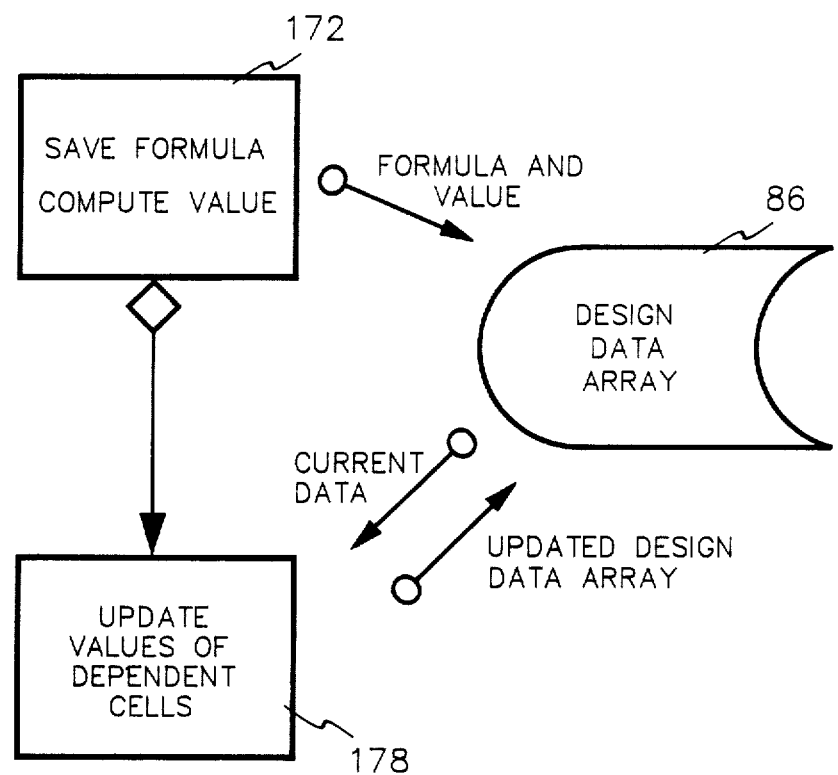
FIG. 60 is a block diagram detailing the editing of the cell which specifies either the master drawing's name, its coordinates of insertion, the scale factor to which its image is to be adjusted, or the angle to which it is to be rotated upon insertion. This is an expansion of the editing process illustrated in FIG. 56.

FIG. 60 illustrates the method of editing formulas in the design data array 86 that correspond to the design plan's output specification region. The insertion formula updater 172 saves the formula in the design data array 86. All dependent formulas are updated using the dependent cell calculator 178. Updated values are stored in the design data array 86.

The invention may be embodied in other specific forms without departing from the spirit or essential characteristics thereof. The present embodiments are therefore to be considered in all respects as illustrative and not restrictive, the scope of invention being indicated by the appended claims rather than by the foregoing description; and all changes which come within the meaning and range of equivalency of the claims are therefore intended to be embraced therein.

What is claimed and desired to be secured by U.S. Letters is:

1. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
   employing said data entry device to establish a master drawing with text and dimensions represented by variables;
   continuously displaying the updated master drawing on said monitor as said master drawing is established, whereby the user can visually monitor the appearance of said master drawing as it is established;
   thereafter displaying on said monitor a design plan with an array of cells;
   employing said data entry device to input to said design plan by inputting to, or modifying in, each of one or more of said cells a statement which defines a numerical or text value, at least one of said statements including a solicitation for information;
   employing said data entry device to input to said computer an instruction which will:
      (i) prevent further editing of said design plan, and
      (ii) result in said monitor displaying those solicitations for information contained in statements in cells of the edited design plan; and thereafter:
   employing said data entry device to input to said computer information solicited pursuant to statements in cells of the edited design plan;
   displaying the information inputted by the user on said monitor so that the user can check the responses inputted to the computer; and
   electronically storing in said computer data representing said accomplished design and generated by employing the computer to:
      (i) resize elements of said master drawing represented by variables as necessary to conform to fixed dimensional values in cells of the edited design plan.

2. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
   employing said data entry device to establish a master drawing with text and dimensions represented by variables;
   continuously displaying the updated master drawing on said monitor as said master drawing is established, whereby the user can visually monitor the appearance of said master drawing as it is established;
   thereafter displaying on said monitor a design plan with an array of cells;
   employing said data entry device to input to said design plan by inputting to, or modifying in, each of one or more of said cells a statement which defines a numerical or text value, at least one of said statements including a solicitation for information;
employing said data entry device to input to said computer an instruction which will:
(i) prevent further editing of said design plan, and
(ii) result in said monitor displaying those solicitations for information contained in statements in cells of the edited design plan; and thereafter:
employing said data entry device to input to said computer information solicited pursuant to statements in cells of the edited design plan;
displaying the information inputted by the user on said monitor so that the user can check the responses inputted to the computer; and
electronically storing in said computer data representing said accomplished design and generated by employing the computer to replace variable text in said master drawing with set text from one or more cells of the edited design plan.

3. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
employing said data entry device to modify a master drawing with text and dimensions represented by variables;
continuously displaying the updated master drawing on said monitor as said master drawing is modified, whereby the user can visually monitor the appearance of said master drawing as it is modified;
thereafter displaying on said monitor a design plan with an array of cells;
employing said data entry device to input to said design plan by inputting to, or modifying in, each of one or more of said cells a statement which defines a numerical or text value, at least one of said statements including a solicitation for information;
employing said data entry device to input to said computer an instruction which will:
(i) prevent further editing of said design plan, and
(ii) result in said monitor displaying those solicitations for information contained in statements in cells of the edited design plan; and thereafter:
employing said data entry device to input to said computer information solicited pursuant to statements in cells of the edited design plan;
displaying the information inputted by the user on said monitor so that the user can check the responses inputted to the computer; and
electronically storing in said computer data representing said accomplished design and generated by employing the computer to resize elements of said master drawing represented by variables as necessary to conform to fixed dimensional values in cells of the edited design plan.

4. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
employing said data entry device to modify a master drawing with text and dimensions represented by variables;
continuously displaying the updated master drawing on said monitor as said master drawing is modified, whereby the user can visually monitor the appearance of said master drawing as it is modified;
thereafter displaying on said monitor a design plan with an array of cells;
employing said data entry device to input to said design plan by inputting to, or modifying in, each of one or more of said cells a statement which defines a numerical or text value, at least one of said statements including a solicitation for information;
employing said data entry device to input to said computer an instruction which will:
(i) prevent further editing of said design plan, and
(ii) result in said monitor displaying those solicitations for information contained in statements in cells of the edited design plan; and thereafter:
employing said data entry device to input to said computer information solicited pursuant to statements in cells of the edited design plan;
displaying the information inputted by the user on said monitor so that the user can check the responses inputted to the computer; and
electronically storing in said computer data representing said accomplished design and generated by employing the computer to replace variable text in said master drawing with set text from one or more cells of the edited design plan.

5. A method as defined in any of the preceding claims 1, 2, 3, or 4 in which said interactive system includes a device for generating a drawing and wherein the electronically stored data portraying the accomplished design is outputted to said device in a manner which will cause that device to generate a drawing embodying said accomplished design.

6. A method as defined in any of the preceding claims 1, 2, 3, or 4 in which said interactive system includes a device for milling, cutting or otherwise transforming stock material into a specified tangible object and wherein the electronically stored data portraying the accomplished design in outputted to said device in a manner which will cause that device to generate a tangible object embodying said accomplished design.

7. A method of creating an accomplished design as defined in any of the preceding claims 1, 2, 3, or 4 which includes the additional steps of:
employing said data entry device to define a reference point in said master drawing;
employing said data entry device to incorporate into at least two cells of said design plan statements defining a coordinate value; and
employing said computer to generate data describing said accomplished design as aforesaid and to so position said accomplished design as to align said reference point with said coordinate value.

8. A method of creating an accomplished design as defined in any of the preceding claims 1, 2, 3, or 4 which includes the additional steps of:
employing said data entry means to incorporate into a cell of said design plan a statement defining an angle value; and
employing said computer to generate data describing said accomplished design as aforesaid and to additionally rotate said design according to said angle value.

9. A method of creating an accomplished design as defined in any of the preceding claims 1, 2, 3, or 4 which includes the additional steps of:
employing said data entry device to incorporate into a cell of said design plan a statement defining a scale factor value; and
employing said computer to generate data describing said accomplished design and to additionally establish the scale factor of the drawing according to said scale factor value.

10. A method of creating an accomplished design as defined in any of the preceding claims 1, 2, 3, or 4 which includes the steps of:
employing said data entry device to establish at least one additional master drawing;
employing said data entry device to incorporate into said design plan a statement that defines a value identifying any one of said master drawings; and
employing said computer to utilize the thus identified master drawing in generating the accomplished design.

11. A method of creating an accomplished design as defined in any of the preceding claims 1, 2, 3, or 4 which includes the steps of:
using said data entry device to edit said design plan by inputting to said computer instructions which will result in there being in at least one of said design plan cells a statement defining a set value, said statement containing as one element thereof a value defined in a related cell of said design plan; and
updating all related cells and displaying the updated contents of said cells on the monitor as the design plan is edited.

12. A method of creating an accomplished design as defined in any of the preceding claims 1, 2, 3, or 4 which includes the steps of:
employing said data entry device to modify at least one additional master drawing;
employing said data entry device to incorporate into said design plan statement that defines a value identifying any one of said master drawings; and
employing said computer to utilize the thus identified master drawing in generating the accomplished design.

13. A method of employing a general purpose interactive system which includes a computer, a monitor coupled to and adapted to display data outputted from said computer, and a data entry device coupled to and adapted to input data to said computer to create an accomplished design by first engineering said design and then outputting data portraying said design in the form of electronically storable data, said method comprising the steps of:
displaying on said monitor a design plan with an array of cells;
using said data entry device to input to said design plan by inputting or modifying in one or more of said cells a statement that defines a numerical or text value;
employing said data entry device to create a governor file containing defined values, where at least one of said values corresponds to one of said cells in said design plan;
using said data entry device to input a command which will cause said computer to replace said statement-provided value from said cell with the governor file value and utilize said value in the remaining steps of the process; and thereafter:
electronically storing in said computer data representing said accomplished design and generated by using said computer to replace any variable text in said master drawing with a set text value corresponding to a cell of the edited design plan.

14. A method of employing a general purpose interactive system which includes a computer, a monitor coupled to and adapted to display data outputted from said computer, and a data entry device coupled to and adapted to input data to said computer to create an accomplished design by first engineering said design and then outputting data portraying said design in the form of electronically storable data, said method comprising the steps of:
displaying on said monitor a design plan with an array of cells;
using said data entry device to input to said design plan by inputting or modifying in one or more of said cells a statement that defines a numerical or text value;
employing said data entry device to create a governor file containing defined values, where at least one of said values corresponds to one of said cells in said design plan;
using said data entry device to input a command which will cause said computer to replace said statement-provided value from said cell with the governor file value and utilize said value in the remaining steps of the process; and thereafter:
electronically storing in said computer data representing said accomplished design and generated by using said computer to:
reconfigure any variable element of a master drawing to conform to a set dimensional value corresponding to the cell of the edited design plan.

15. A method as defined in claim 14 or in claim 13 in which said interactive system includes a device for generating a drawing and wherein the electronically stored data portraying the accomplished design in outputted to said device in a manner which will cause that device to generate a drawing embodying said accomplished design.

16. A method of creating an accomplished design as defined in claim 15 which includes the steps of:
employing said data entry device to establish at least one additional design plan;
employing said data entry device to create a governor file containing a list, at least one item of which identifies said additional design plan; and
employing said computer to utilize the additional design plan in generating the data representing the accomplished design.

17. A method of creating an accomplished design as defined in claim 15 which includes the steps of:
employing said data entry device to establish at least one additional design plan;
employing said data entry device to create a governor file containing an array of defined values, at least one of which identifies said additional design plan; and
employing said computer to utilize the additional design plan in generating the data representing the accomplished design.

18. A method of creating an accomplished design as defined in claim 15 which includes the steps of:

employing said data entry device to modify at least one additional design plan;
employing said data entry device to create a governor file containing an array of defined values, at least one item of which identifies said additional design plan; and
employing said computer to utilize the additional design plan in generating the data representing the accomplished design.

19. A method of creating an accomplished design as defined in claim 15 which includes the steps of:
employing said data entry device to modify at least one additional design plan;
employing said data entry device to create a governor file containing an array of defined values, at least one of which identifies said additional design plan; and
employing said computer to utilize the additional design plan in generating the data representing the accomplished design.

20. A method as defined in claim 14 or in claim 13 in which said interactive system includes a device for milling, cutting or otherwise transforming stock material into a specified tangible object and wherein the electronically stored data portraying the accomplished design is outputted to said device in a manner which will cause that device to generate a tangible object embodying said accomplished design.

21. A method of creating an accomplished design as defined in claim 14 or in claim 13 wherein said method includes the steps of:
employing said data entry device to define a reference point in said master drawing;
employing said data entry device to add at least two values describing coordinate information to said governor file; and
employing said computer to so rectify said drawing as to generate data describing said accomplished design as aforesaid and to additionally so position said accomplished design that said reference point aligns with said coordinate values.

22. A method of creating an accomplished design as defined in claim 14 or in claim 13 which includes the additional steps of:
employing said data entry device to incorporate in said design plan or in said governor file a value describing angular rotation relative to a selected axis; and
employing said computer to so rectify said drawing as to generate data describing said accomplished design as aforesaid and to additionally rotate said design by an amount equal to said rotation value.

23. A method of creating an accomplished design as defined in claim 14 or in claim 13 which includes the steps of:
employing said data entry device to establish at least one additional master drawing;
employing said data entry device to create a governor file containing a list, at least one item of which identifies said additional master drawing; and
employing said computer to utilize said additional master drawing in generating the accomplished design.

24. A method of creating an accomplished design as defined in claim 14 or in claim 13 wherein said method includes the steps of:
employing said data entry device to define a reference point in said master drawing;
employing said data entry device to add at least two values describing coordinate information to design plan; and
employing said computer to so rectify said drawing as to generate data describing said accomplished design as aforesaid and to additionally so position said accomplished design that said reference point aligns with said coordinate values.

25. A method of creating an accomplished design as defined in claim 14 or in claim 13 which includes the steps of:
employing said data entry device to establish at least one additional master drawing;
employing said data entry device to create a governor file containing an array of defined values, at least one item of which identifies said additional master drawing; and
employing said computer to utilize said additional master drawing in generating the accomplished design.

26. A method of creating an accomplished design as defined in claim 14 or in claim 13 which includes the steps of:
employing said data entry device to modify at least one additional master drawing;
employing said data entry device to create a governor file containing an array of defined values, at least one of which identifies said additional master drawing; and
employing said computer to utilize said additional master drawing in generating the accomplished design.

27. A method of creating an accomplished design as defined in claim 14 or in claim 13 which includes the steps of:
employing said data entry device to modify at least one additional master drawing;
employing said data entry device to create a governor file containing an array of defined values, at least one of which identifies said additional master drawing; and
employing said computer to utilize said additional master drawing in generating the accomplished design.

28. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
displaying on said monitor a supervisory design plan with an array of cells;
using said data entry device to edit said supervisory design plan by inputting to said computer instructions which will result in there being in each of one or more of said cells a mathematical or text manipulation statement defining a set value, at least one of said cells containing a statement that refers to a value defined in a cell of a subordinate design plan;
employing said computer to pass said value from said subordinate design plan to said one cell of said supervisory design plan; and
electronically storing in said computer data representing said accomplished design and generated by using said computer to reconfigure any variable element of a master drawing to conform to a fixed dimensional value corresponding to a cell of the edited design plan.

29. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
   employing said data entry device to establish at least two master drawings with text and dimensions represented by variables;
   continuously displaying the updated master drawing on said monitor as each master drawing is established, whereby the user can visually monitor the appearance of said master drawing as it is established;
   displaying on said monitor a design plan for each of said master drawings, each of said design plans having an array of cells;
   employing said data entry device to edit each said design plan by inputting to, or modifying in, one or more of said cells of said design plan a statement that defines a numerical or text value;
   employing said data entry device to incorporate in a supervisory one of said design plans one or more instructions which, upon execution, will cause one or more of said subordinate design plans to output electronically storable data;
   electronically storing in said computer data representing said accomplished design and generated by employing the computer to:
   (i) rectify each master drawing element represented by a variable as necessary to conform to fixed dimensional values in cells of the design plan corresponding to that master drawing, and
   (ii) output data representing the associated master drawing from the supervisory design plan and execute said instruction(s) to output the electronic data representing the associated and rectified master drawing from the subordinate design plan(s), thereby making available data which can be:
       (1) merged and electronically stored in a form representing a composite image containing elements of at least two rectified master drawings, or
       (2) so stored as to represent an accomplished design with multiple images corresponding to at least two rectified images.

30. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
   employing said data entry device to establish at least two master drawings with text and dimensions represented by variables;
   continuously displaying the updated master drawing on said monitor as each master drawing is established, whereby the user can visually monitor the appearance of said master drawing as it is established;
   displaying on said monitor a design plan for each of said master drawings, each of said design plans having an array of cells;
   employing said data entry device to edit each said design plan by inputting to, or modifying in, one or more of said cells of said design plan a statement that defines a numerical or text value;
   employing said data entry device to incorporate in a supervisory one of said design plans one or more instructions which, upon execution, will cause one or more of said subordinate design plans to output electronically storable data;
   electronically storing in said computer data representing said accomplished design and generated by employing the computer to:
   (i) rectify each said master drawing by replacing variable text with set text from cells of the corresponding, edited design plan, and
   (ii) output data representing the associated master drawing from the supervisory design plan and execute said instruction(s) to output the electronic data representing the associated and rectified master drawing from the subordinate design plan(s), thereby making available data which can be:
       (1) merged and electronically stored in a form representing a composite image containing elements of at least two rectified master drawings, or
       (2) so stored as to represent an accomplished design with multiple images corresponding to at least two rectified images.

31. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
   employing said data entry device to modify at least two master drawings with text and dimensions represented by variables;
   continuously displaying the updated master drawing on said monitor as each master drawing is modified, whereby the user can visually monitor the appearance of said master drawing as it is modified;
   displaying on said monitor a design plan for each of said master drawings, each of said design plans having an array of cells;
   employing said data entry device to edit each said design plan by inputting to, or modifying in, one or more of said cells of said design plan a statement that defines a numerical or text value;
   employing said data entry device to incorporate in a supervisory one of said design plans one or more instructions which, upon execution, will cause one or more of said subordinate design plans to output electronically storable data;
   electronically storing in said computer data representing said accomplished design and generated by employing the computer to:
   (i) rectify each master drawing element represented by a variable as necessary to conform to fixed dimensional values in cells of the design plan corresponding to that master drawing, and
   (ii) output data representing the associated master drawing from the supervisory design plan and execute said instruction(s) to output the electronic data representing the associated and rectified master drawing from the subordinate design plan(s), thereby make available data which can be:
- (1) merged and electronically stored in a form representing a composite image containing elements of at least two rectified master drawings, or
- (2) so stored as to represent an accomplished design with multiple images corresponding to at least two rectified images.

32. A method of employing a general purpose interactive system which includes a computer, a monitor coupled to and adapted to display data outputted from said computer, and a data entry device coupled to and adapted to input data to said computer to create an accomplished design by first engineering said design and then portraying said design in the form of electronically storable data, said method comprising the steps of:
employing said data entry device to modify at least two master drawings with text and dimensions represented by variables;
continuously displaying the updated master drawing on said monitor as each master drawing is modified, whereby the user can visually monitor the appearance of said master drawings as it is modified;
displaying on said monitor a design plan for each of said master drawings, each of said design plans having an array of cells;
employing said data entry device to edit each said design plan by inputting to, or modifying in, one or more of said cells of said design plan a statement that defines a numerical or text value;
employing said data entry device to incorporate in a supervisory one of said design plans one or more instructions which, upon execution, will cause one or more of said subordinate design plans to output electronically storable data;
electronically storing in said computer data representing said accomplished design and generated by employing the computer to:
- (i) rectify each said master drawing by replacing variable text with set text from cells of the corresponding, edited design plan, and
- (ii) output data representing the associated master drawing from the supervisory design plan and execute said instruction(s) to output the electronic data representing the associated and rectified master drawing from the subordinate design plan(s), thereby making available data which can be:
  - (1) merged and electronically stored in a form representing a composite image containing elements of at least two rectified master drawings, or
  - (2) so stored as to represent an accomplished design with multiple images corresponding to at least two rectified images.

33. A method of creating an accomplished design as defined in any of the preceding claims 29, 30, 31, or 32 wherein said method includes the steps of:
employing said data entry device to define a reference point in said master drawings;
using said data entry device to incorporate in a supervisory design plan:
- (i) at least two statements defining coordinate information, and
- (ii) at least one instruction of which said statements can be components and that refers to a subordinate design plan; and employing said computer to generate data describing said accomplished design and, in so doing, to so carry out said instruction by modifying the portion of the design generated by said subordinate design plan as to position said reference point of said accomplished design in conformity with said coordinate values.

34. A method of creating an accomplished design as defined in any of the preceding claims 29, 30, 31, or 32 which includes the steps of:
using said data entry device to incorporate in a supervisory design plan:
- (i) a statement or value defining angular rotation information; and
- (ii) at least one instruction of which said statement or value can be a component and that refers to a subordinate design plan; and employing said computer to generate data describing said accomplished design and, in so doing, to so carry out said instruction as to modify the portion of the accomplished design generated by said subordinate design plan so as to rotate said portion by an amount equal to said angular rotation values.

35. A method of creating an accomplished design as defined in any of the preceding claims 29, 30, 31, or 32 which includes the steps of:
using said data entry device to incorporate in a supervisory design plan:
- (i) a statement or value defining a drawing scale factor, and
- (ii) at least one instruction of which said statement of value can be a component and that refers to a subordinate design plan; and employing said computer to generate data describing said accomplished design, and in so doing, to so carry out said instruction by modifying the portion of the accomplished design generated by said subordinate design plan as to establish the scale factor of the drawing according to said scale factor value.

36. A method of creating an accomplished design as defined in any of the preceding claims 29, 30, 31, or 32 which includes the steps of:
using said data entry device to edit said design plan by inputting to said computer instructions which will result in there being in at least one of said design plan cells a statement defining a set value, said statement containing as one element thereof a value defined in a related cell of said design plan; and updating all related cells and displaying the updated contents of said cells on the monitor as the design plan is edited.

37. A method of creating an accomplished design as defined in claim 36 which includes the steps of:
using said data entry device to incorporate in a supervisory one of said design plans one or more value exportation instructions which provide or refer to a value and which refer to a selected design plan cell or cells;
causing the computer to utilize said referred-to value to:
- (i) display the value of said referred-to cell(s); and (ii) evaluate statements in other cells that refer to said referred-to cell(s); and causing the computer to generate an accomplished design in conformity with said value.

38. A method of creating an accomplished design as defined in claim 37 which include the steps of:

using said data entry device to incorporate in a supervisory one of said design plans one or more instructions each of which refers to a selected design plan cell; and causing the computer to utilize the value defined according to that cell's textual or mathematical statement rather than a value provided by a value exportation instruction.

39. A method of creating an accomplished design as defined in any of the preceding claims 65, 118, 119, or 120 wherein said method includes the steps of:

employing said data entry device to define a reference point in said master drawing;

using said data entry device to incorporate in a supervisory design plan:
(i) at least two values defining coordinate information, and
(ii) at least one instruction of which said values can be components and that refers to a subordinate design plan; and employing said computer to generate data describing said accomplished design and, in so doing, to so carry out said instruction by modifying the portion of the design generated by said subordinate design plan as to position said reference point of said accomplished design in conformity with said coordinate values.

40. A method of employing a general purpose interactive system which includes a computer, a monitor coupled to and adapted to display data outputted from said computer, and a data entry device coupled to and adapted to input data to said computer to create an accomplished design by first establishing a master drawing with at least one element which does not conform to the set value dimension that element is to have in the accomplished drawing and then rectifying said master drawing to conform its set value dimension, said method including the steps of:

employing the data entry device to establish the master drawing;

continuously displaying the updated master drawing on said monitor so that a user can visually monitor the appearance of said master drawing as it is established;

employing said data entry device to assign to at least one element of the master drawing either a fixed or a proportional relationship between that element and the, or each, dimension that said element is to have in the accomplished drawing; and thereafter:

employing said data entry device to input to said computer an instruction that will cause said computer to so rectify said master drawing as to generate a set of electronically storable data representing an accomplished drawing in which:
(i) the dimensions of the elements of the accomplished design correspond to their values;
(ii) if there is a fixed relationship between an element of said master drawing and a dimension of that element, the reference points locating said element will remain at constant distances from the nearest extension lines of the dimensions on the master drawing, and
(iii) if there is a proportional relationship between an element of said master drawing and a dimension of that element, the distance between the reference points will be expanded or decreased in proportion to the ratio between the dimension wanted in the accomplished drawing and the length to which the element was originally drawn.

41. A method as defined in claim 40 in which said interactive system includes a device for generating a drawing and wherein the electronically stored data portraying the accomplished design is outputted to said device in a manner which will cause that device to generate a drawing embodying said accomplished design.

42. A method as defined in claim 40 in which said interactive system includes a device for milling, cutting or otherwise transforming stock material into a specified tangible object and wherein the electronically stored data portraying the accomplished design is outputted to said device in a manner which will cause that device to generate a tangible object embodying said accomplished design.

43. A method of creating an accomplished design as defined in claim 40 wherein at least one of said elements is a variable in said master drawing and wherein said method includes the step of employing said data entry device to:

create a list of set values corresponding to variables, at least one of which said dimension may have, and thereafter, and prior to rectification of said master drawing, substitute a set value from said list for said variable.

44. A method of creating an accomplished design as defined in claim 40 which includes the additional steps of:

employing said data entry device to provide at least one value describing a drawing scale factor; and employing said computer to so rectify said drawing as to generate data describing said accomplished design and additionally establish the scale factor of the drawing according to said scale factor value.

45. A method of creating an accomplished design as defined in claim 40 which includes the additional steps of:

employing said data entry device to define a reference point in said master drawing;

employing said data entry device to incorporate into at least two cells of a design plan associated with said master drawing statements defining a coordinate value; and employing said computer to generate data describing said accomplished design and to so position said accomplished design as to align said reference point with said coordinate value.

46. A method of creating an accomplished design as defined in claim 40 which includes the additional steps of:

employing said data entry device to incorporate into a cell of said design plan a statement defining an angle value; and employing said computer to generate data describing said accomplished design and to additionally rotate said design according to said angle value.

47. A method of creating an accomplished design as defined in claim 40 which includes the additional steps of:

employing said data entry device to incorporate into a cell of said design plan a statement defining a scale factor value; and employing said computer to generate data describing said accomplished design and to additionally establish the scale factor of the drawing according to said scale factor value.

48. A method of creating an accomplished design as defined in claim 40 wherein at least one dimension of said one element is a variable and wherein said method includes the steps of, prior to rectification of said master drawing:

displaying on said monitor a design plan with one or more cells;

employing said data entry device to edit said design plan by inputting to, or modifying in, one of said cells a statement that defines a numerical or text value; and thereafter and prior to rectification of said master drawing, substituting the value defined by said statement from said design plan for said variable.

49. A method of creating an accomplished design as defined in claim 40 wherein at least one element of text of said master drawing is a variable and wherein said method includes the steps of, prior to rectification of said master drawing:

displaying on said monitor a design plan with one or more cells;

employing said data entry device to edit said design plan by inputting to, or modifying in, one of said cells a statement that defines a text value; and thereafter, and prior to rectification of said master drawing, substituting said value as defined by said statement from said design plan for said variable.

50. A method of creating an accomplished design as defined in claim 40 wherein at least one of said elements is a variable in said master drawing and wherein said method includes the step of employing said data entry device to:

create an array of set values corresponding to variables, at least one of which said dimension may have, and thereafter, and prior to rectification of said master drawing, substitute a set value from said array for said variable.

51. A method of employing a general purpose interactive system which includes a computer, a monitor coupled to and adapted to display data outputted from said computer, and a data entry device coupled to and adapted to input data to said computer to create an accomplished design by first establishing a master drawing with at least one element which does not conform to a set value dimension that element is to have in the accomplished drawing and then rectifying said master drawing to conform to its set value dimension, said method including the steps of:

employing the data entry device to establish a master drawing containing a multiplicity of individual drawing elements including non-dimensional text;

continuously displaying the updated master drawing on said monitor so that a user can visually monitor the appearance of said master drawing as it is established;

assigning to at least one element of the master drawing a direct, fixed relationship with one or more of the lineal dimensions of said element; and employing said data entry device to input to said computer an instruction which will cause said computer to so rectify said master drawing as to generate a set of electronically storable data representing an accomplished drawing in which:
  (i) the dimensions of the elements of the accomplished design correspond to their values, and
  (ii) the distances between the reference points defining said one element and the nearer extension lines of the related lineal dimensions of the master drawing are unchanged.

52. A method of employing a general purpose interactive system which includes a computer, a monitor coupled to and adapted to display data outputted from said computer, and a data entry device coupled to and adapted to input data to said computer to create an accomplished design by first establishing a master drawing with at least one element which does not conform to a set value dimension that element is to have in the accomplished drawing and then rectifying said master drawing to conform to its set value dimension, said method including the steps of:

employing the data entry device to establish a master drawing containing a multiplicity of individual drawing elements including individual lines;

continuously displaying the updated master drawing on said monitor so that a user can visually monitor the appearance of said master drawing as it is established;

assigning to at least one element of the master drawing a direct, fixed relationship with one or more of the lineal dimensions of said element; and employing said data entry device to input to said computer an instruction which will cause said computer to so rectify said master drawing at to generate a set of electronically storable data representing an accomplished drawing in which:
  (i) the dimensions of the elements of the accomplished design correspond to their values, and
  (ii) the distances between the reference points defining said one element and the nearer extension lines of the related lineal dimensions of the master drawings are unchanged.

53. A method as defined in claim 52 or in claim 51 in which said interactive system includes a device for generating a drawing and wherein the electronically stored data portraying the accomplished design is outputted to said device in a manner which will cause that device to generate a drawing embodying said accomplished drawing.

54. A method as defined in claim 52 or in claim 51 in which said interactive system includes a device for milling, cutting or otherwise transforming stock material into a specified tangible object and wherein the electronically stored data portraying the accomplished design is outputted to said device in a manner which will cause that device to generate a tangible object embodying said accomplished design.

55. A method of creating an accomplished design as defined in claim 52 or in claim 51 wherein at least one dimension of said one element is a variable in said master drawing and wherein said method includes the step of employing said data entry device to:

create a list of set values corresponding to variables which said one dimension may have, and thereafter, and prior to rectification of said master drawing, substituting a set value from said list for said variable.

56. A method of creating an accomplished design as defined in claim 52 or in claim 51 wherein said method includes the additional steps of:

employing said data entry device to provide at least one value describing a drawing scale factor; and employing said computer to so rectify said drawing as to generate data describing said accomplished design and to additionally establish the scale factor of the drawing according to said scale factor value.

57. A method of creating an accomplished design as defined in claim 52 or in claim 51 wherein at least one dimension of said one element is a variable and wherein said method includes the steps of, prior to rectification of said master drawing:

displaying on said monitor a design plan with one or more cells;

employing said data entry device to edit said design plan by inputting to, or modifying in, one of said cells a statement that defines a numerical value; and thereafter, and prior to rectification of said master drawing, substituting said value as defined by said statement from said design plan for said variable.

58. A method of creating an accomplished design as defined in claim 52 or in claim 51 wherein at least one element of text of said master drawing is a variable and wherein said method includes the steps of, prior to rectification of said master drawing:

displaying on said monitor a design plan with one or more cells;

employing said data entry device to edit said design plan by inputting to, or modifying in, one of said cells a statement that defines a text value; and thereafter, and prior to rectification of said master drawing, substituting said value as defined by said statement from said design plan for said variables.

59. A method of creating an accomplished design as defined in claim 52 or in claim 51 which includes the additional steps of:

employing said data entry device to define a reference point in said master drawing;

employing said data entry device to incorporate into at least two cells of said design plan statements defining a coordinate value; and employing said computer to generate data describing said accomplished design and to so position said accomplished design as to align said reference point with said coordinate value.

60. A method of creating an accomplished design as defined in claim 52 or in claim 51 which includes the additional steps of:

employing said data entry device to incorporate into a cell of a design plan associated with said master drawing a statement defining an angle of rotation value; and employing said computer to generate data describing said accomplished design and to additionally rotate said design according to said angle of rotation value.

61. A method of creating an accomplished design as defined in claim 52 or in claim 51 which includes the additional steps of:

employing said data entry device to incorporate into a cell of said design plan a statement defining a scale factor value, and employing said computer to generate data describing said accomplished design and to additionally establish the scale factor of the drawing according to said scale factor value.

62. A method of employing a general purpose interactive system which includes a computer, a monitor coupled to and adapted to display data outputted from said computer, and a data entry device coupled to and adapted to input data to said computer to create an accomplished design by first establishing a master drawing with at least one element which does not conform to a set value dimension that element is to have in the accomplished drawing and then rectifying said master drawing to conform to that set value dimension, said method including the steps of:

employing the data entry device to establish the master drawing;

continuously displaying the updated master drawing on said monitor so that a user can visually monitor the appearance of said master drawing as it is established;

assigning to at least one element of the master drawing a direct proportional relationship with one or more lineal dimensions; and thereafter employing said data entry device to input to said computer an instruction will cause said computer to so rectify said master drawing as to generate a set of electronically storable data representing an accomplished drawing in which:

(i) the dimensions of the elements of the accomplished design correspond to their values, and (ii) the distances between the reference points locating said one element as projected in the direction of the dimension defined by said reference points has been expanded or decreased in proportion to the ratio between the dimension wanted in the accomplished drawing and the length to which the element was originally drawn.

63. A method as defined in claim 62 in which said interactive system includes a device for generating a drawing and wherein the electronically stored data portraying the accomplished design is outputted to said device in a manner which will cause that device to generate a drawing embodying said accomplished design.

64. A method as defined in claim 62 in which said interactive system includes a device for milling, cutting or otherwise transforming stock material into a specified tangible object and wherein the electronically stored data portraying the accomplished design is outputted to said device in a manner which will cause that device to generate a tangible object embodying said accomplished design.

65. A method of creating an accomplished design as defined in claim 62 wherein at least one dimension of said one elements is a variable in said master drawing and wherein said method includes the step of employing said data entry device to:

create a list of set values corresponding to variables which said one dimension may have, and thereafter, and prior to rectification of said master drawing, substituting a set value from said list for said variable.

66. A method of creating an accomplished design as defined in claim 65 wherein said method includes the additional steps of:

employing said data entry device to provide at least one value describing a drawing scale factor value; and employing said computer to so rectify said drawing as to generate data describing said accomplished design and additionally establish the scale factor of the drawing according to said scale factor value.

67. A method of creating an accomplished design as defined in claim 62 wherein at least one dimension of said one element is a variable and wherein said method includes the steps of, prior to rectification of said master drawing:
   displaying on said monitor a design plan with one or more cells;
   employing said data entry device to edit said design plan by inputting to, or modifying in, one of said cells a statement that defines a numerical value; and
   thereafter, and prior to rectification of said master drawing, substituting said numerical value as defined by said statement from said design plan for said variable.

68. A method of creating an accomplished design as defined in claim 62 wherein at least one element of text of said master drawing is a variable and wherein said method includes the steps of, prior to rectification of said master drawing:
   displaying on said monitor a design plan with one or more cells;
   employing said data entry device to edit said design plan by inputting to, or modifying in, one of said cells a statement that defines a text value; and
   thereafter, and prior to rectification of said master drawing, substituting said value as defined by said statement from said design plan for said variable.

69. A method of creating an accomplished design as defined in claim 62 which includes the additional steps of:
   employing said data entry device to define a reference point in said master drawing;
   employing said data entry device to incorporate into at least two cells of said design a statement defining a coordinate value; and
   employing said computer to generate data describing said accomplished design and to so position said accomplished design as to align said reference point with said coordinate value.

70. A method of creating an accomplished design as defined in claim 62 which includes the additional steps of:
   employing said data entry device to incorporate into a cell of a design plan statement defining an angle value; and
   employing said computer to generate data describing said accomplished design and to additionally rotate said design according to said angle of rotation value.

71. A method of creating an accomplished design as defined in claim 62 which includes the additional steps of:
   employing said data entry device to incorporate into a cell of said design plan a statement defining a scale factor value; and
   employing said computer to generate data describing said accomplished design and to additionally establish the scale factor of the drawing according to said scale factor value.

72. A method of employing a general purpose interactive system which includes a computer, a monitor coupled to and adapted to display data outputted from said computer, and a data entry device coupled to and adapted to input data to said computer to create an accomplished design by first establishing a master drawing which is more complex than and contains design elements not wanted in said accomplished design and then rectifying said master drawing in a manner which results in the elimination of at least one element of the master drawing to produce the simpler accomplished design, said method including the steps of:
   employing said data entry device to input to said computer data which will result in said computer assigning to at least one element of the master drawing a dimension of zero; and thereafter:
   electronically storing in said computer data representing said accomplished design and generated by employing the computer to rectify said master drawing by eliminating from said master drawing each element which has been assigned a dimension of zero.

73. A method of creating an accomplished design as defined in claim 72 wherein at least one dimension of said one element is a variable in said master drawing and wherein said method includes the steps of employing said data entry device to:
   create data which represents a list of set values corresponding to variables which said dimension may have, at least one of said set values being zero; and
   thereafter, and prior to rectification of said master drawing, substituting said zero value from said list for said variable.

74. A method of creating an accomplished design as defined in claim 72 wherein said dimension is a linear dimension.

75. A method of creating an accomplished design as defined in claim 72 wherein said dimension is a radial dimension.

* * * * *